US008535963B2

(12) United States Patent
Sumi

(10) Patent No.: US 8,535,963 B2
(45) Date of Patent: Sep. 17, 2013

(54) METHOD FOR MANUFACTURING ELECTRONIC DEVICE AND ELECTRONIC DEVICE

(75) Inventor: Naoki Sumi, Kobe (JP)

(73) Assignee: TPO Hong Kong Holding Limited, Shatin (HK)

( * ) Notice: Subject to any disclaimer, the term of this patent is extended or adjusted under 35 U.S.C. 154(b) by 0 days.

(21) Appl. No.: 13/417,981

(22) Filed: Mar. 12, 2012

(65) Prior Publication Data

US 2012/0171621 A1 Jul. 5, 2012

Related U.S. Application Data

(62) Division of application No. 10/540,384, filed as application No. PCT/JP03/16652 on Dec. 24, 2003, now Pat. No. 8,134,162.

(30) Foreign Application Priority Data

Dec. 27, 2002 (JP) ................................ 2002-381362

(51) Int. Cl.
*H01L 21/00* (2006.01)

(52) U.S. Cl.
USPC ................ 438/32; 438/151; 257/83; 257/350

(58) Field of Classification Search
USPC ............................. 438/32, 151; 257/83, 350
See application file for complete search history.

(56) References Cited

U.S. PATENT DOCUMENTS

| | | | | |
|---|---|---|---|---|
| 5,610,741 | A * | 3/1997 | Kimura | 349/113 |
| 5,671,026 | A * | 9/1997 | Shiraki et al. | 349/40 |
| 6,259,119 | B1 * | 7/2001 | Ahn et al. | 257/72 |
| 6,262,783 | B1 * | 7/2001 | Tsuda et al. | 349/39 |
| 6,266,111 | B1 * | 7/2001 | Kataoka et al. | 349/113 |
| 7,029,727 | B1 * | 4/2006 | Kokura et al. | 428/1.1 |
| 2002/0000555 | A1 * | 1/2002 | Fujikawa et al. | 257/59 |
| 2002/0146871 | A1 * | 10/2002 | Watanabe et al. | 438/151 |
| 2002/0196517 | A1 * | 12/2002 | Nimura | 359/245 |
| 2004/0104434 | A1 * | 6/2004 | Lin | 257/347 |

* cited by examiner

*Primary Examiner* — Jarrett Stark
*Assistant Examiner* — John M Parker
(74) *Attorney, Agent, or Firm* — Liu & Liu

(57) ABSTRACT

A method for manufacturing an electronic device comprises a step for forming a coating film (100) on a surface of a conductor portion-containing body (500), a step for forming a photosensitive film (110) on the conductor (500) on which the coating film (100) has been formed, a step for exposing the photosensitive film (110) to a pattern corresponding to a patterned recessed or protruded portion, a step for developing the exposed photosensitive film (110), and a step for baking the developed photosensitive film (110). With this method, an excessive removal of a metal film can be prevented or suppressed.

13 Claims, 100 Drawing Sheets

METHOD FOR MANUFACTURING ELECTRONIC DEVICE AND ELECTRONIC DEVICE

This application is a Divisional of U.S. patent application Ser. No. 10/540,384 filed Jan. 28, 2008, which claims priority of International Patent Application No. PCT/JP03/16652, filed on Dec. 24, 2003, which claims priority of Japan Patent Application No. 2002-381362, filed on Dec. 27, 2002. These earlier applications are fully incorporated by reference herein as if fully set forth herein.

TECHNICAL FIELD

The invention relates to a method of manufacturing an electronic device comprising a plurality of conductive portions electrically connected to each other, and an electronic device to which the method is applied.

BACKGROUND ART

In the case of a liquid crystal display device having reflectors, such as a reflective liquid crystal display device and a transflective liquid crystal display device, an underlying layer having a plurality of projections or recesses is formed before the reflectors are formed in order that the reflectors can have projections or recesses. A photosensitive material is used as the material of the underlying layer. In the step of forming the underlying layer, a photosensitive film is formed by applying the photosensitive material on a supporting substrate and then baking the photosensitive material, and the photosensitive film is patterned by exposing the photosensitive film to light and then developing it.

On the surface of the supporting substrate on which the photosensitive film will be formed, various conductive films for gate buses, gate terminals and others are generally present. Therefore, if the photosensitive film is exposed to light and then is developed, unnecessary portions of the photosensitive film are removed by a developer during the development process, so that the various conductive films covered with the photosensitive film appear and thus the developer contacts the appearing various conductive films. If the developer contacts the various conductive films, the photosensitive film may be reduced more than necessary, and the conductive film making contact with the developer may be damaged.

The above example is described about the situation that occurs when the developer contacts the various conductive films. In a different example, for example, in which an etchant contacts various conductive films in the step of wet-etching a metal film, the metal film may be reduced more than necessary.

DISCLOSURE OF THE INVENTION

An object of the present invention is to provide a method of manufacturing an electronic device, the method preventing or reducing a phenomenon in which the photosensitive film is removed more than necessary, and an electronic device to which such method is applied.

Another object of the present invention is to provide a method of manufacturing an electronic device, the method preventing or reducing a phenomenon in which a conductive film making contact with a developer is damaged, and an electronic device to which such method is applied.

A further object of the present invention is to provide a method of manufacturing an electronic device, the method preventing or reducing a phenomenon in which a metal film is removed more than necessary, and an electronic device to which such method is applied.

A method of manufacturing an electronic device for achieving the object described above comprises the steps of:

forming a first conductive portion possessor comprising a first conductive portion and a second conductive portion, said first conductive portion containing a first metal or metal compound having a first equilibrium electrode potential, said second conductive portion being electrically connected to said first conductive portion and containing a second metal or metal compound having a second equilibrium electrode potential, said first and second conductive portions being exposed from a surface of said first conductive portion possessor;

forming a coating film on said surface of said first conductive portion possessor;

forming a photosensitive film on said first conductive portion possessor on which said coating film has been formed;

exposing said photosensitive film to light in a predetermined exposure pattern; and developing said exposed photosensitive film.

In the first method of manufacturing a conductive portion device, the coating film is formed on the surface of the substrate before the photosensitive film is formed. Therefore, when unnecessary portions of the photosensitive film are removed by developing the photosensitive film, the conductive portions covered with the coating film do not contact the developer. As a result of this, the conductive portions covered with the coating film do not act as an anode or a cathode, and thus a cell reaction will not occur. This can make it possible that the photosensitive film is prevented from being removed more than necessary and that the conductive portions are prevented from being damaged.

The step of forming said first conductive portion possessor may comprise the step of forming said first and second conductive portions on a supporting member in such a way that said second conductive portion lies on the top of said first conductive portion. In this case, the step of forming said first conductive portion possessor may comprise the step of forming an insulating film on said supporting member before said step of forming said first and second conductive portions.

The step of forming said first conductive portion possessor may comprise the step of forming said first and second conductive portions in such a way that said first conductive portion is electrically connected to said second conductive portion via a hole of an insulating film.

In the first method of manufacturing an electronic device, if said step of forming said insulating film is the step of forming an insulating film having silicon nitride or silicon dioxide, said step of forming said coating film is preferably the step of forming a coating film containing chromium molybdenum oxide.

If the coating film covers the insulating film, parts of the insulating film appear by etching the coating film. In this case, if the insulating film also is etched together with the coating film, the insulating film is damaged, this may have a detrimental effect on a performance of the insulating film. Therefore, it is required that a ratio of an etch rate of material of the coating film to an etch rate of material of the insulating film, an etch selectivity, is large sufficiently. In order to achieve this purpose, if e.g. silicon nitride or silicon dioxide is used as the material of the insulating film, chromium molybdenum oxide can be preferably used as the material of the coating film. In this case, although the removal of the chromium molybdenum oxide causes the appearance of the silicon nitride or silicon dioxide, silicon nitride or silicon dioxide is hardly etched since these materials differ in etch rate. Therefore, the performance of the insulating film can be kept good.

A second method of manufacturing an electronic device comprises the steps of:

forming a second conductive portion possessor comprising a first conductive portion and a second conductive portion, said first conductive portion containing a first metal or metal compound having a first equilibrium electrode potential, said second conductive portion being electrically connected to said first conductive portion and containing a second metal or metal compound having a second equilibrium electrode potential, said first and second conductive portions being exposed from a surface of said second conductive portion possessor;

forming a photosensitive film on said surface of said second conductive portion possessor;

exposing said photosensitive film to light in a predetermined exposure pattern; and developing said exposed photosensitive film;

wherein said step of forming said second conductive portion possessor is the step of forming said second conductive portion possessor comprising a sacrificial electrode, said sacrificial electrode being electrically connected to said first and second conductive portions, said sacrificial electrode being exposed from said surface of said second conductive portion possessor.

In the second method of manufacturing a conductive portion device, the first conductive portion being exposed from the surface of the second conductive portion possessor contains the first metal or metal compound having the first equilibrium electrode potential, and the second conductive portion being exposed from the surface of the second conductive portion possessor contains the second metal or metal compound having the second equilibrium electrode potential. Further, the photosensitive film is formed on such conductive portion possessor, the first and second conductive portions being exposed from the surface of the conductive portion possessor. Therefore, when a part of the photosensitive film is removed by developing the photosensitive film and thus the first and second conductive portions contact the developer, the first and second conductive portions act as anode or cathode and thus a cell reaction occurs. The cell reaction is promoted at the conductive portions, the conductive portions themselves may be damaged and the photosensitive film may be removed more than necessary. Therefore, it is required that the cell reaction is not promoted as much as possible. For this reason, in the method of manufacturing the second conductive portion device, the second conductive portion possessor comprises the sacrificial electrode electrically connected to the first and second conductive portions, and the sacrificial electrode is exposed from the surface of the second conductive portion possessor. If the photosensitive film is formed on the second conductive portion possessor and then is developed, not only the first and second conductive portions but also the sacrificial electrode appears since the sacrificial electrode is exposed from the surface of the second conductive portion possessor, so that the sacrificial electrode contacts the developer temporarily. When the first and second conductive portions contact the developer by developing the photosensitive film, the sacrificial electrode also contact the developer, so that not only the first and second conductive portions but also the sacrificial electrode acts as anode or cathode. As a result of this, the cell reaction occurs at the first and second conductive potions and at the sacrificial electrode. Assuming that the sacrificial electrode is not formed in the second method of manufacturing the conductive portion device, an area in which the cell reaction occurs is concentrated on only the first and second conductive portions. However, the sacrificial electrode is in actuality provided and thus the area in which the cell reaction occurs can be distributed over the first and second conductive portions and the sacrificial electrode. As a result, the cell reaction on the first and second conductive portions becomes less liable to be promoted, so that an excessive removal of the photosensitive film and the damage of the conductive portions can be prevented or reduced.

The sacrificial electrode may be directly connected to one of said first and second conductive portions, or the sacrificial electrode and one of said first and second conductive portions may be integrally formed.

The step of forming said second conductive portion possessor may comprise the step of forming said first and second conductive portions in such a way that said second conductive portion lies on the top of said first conductive portion, or may comprise the step of forming said first and second conductive portions in such a way that said first conductive portion is electrically connected to said second conductive portion via a hole of an insulating film.

A third method of manufacturing an electronic device comprises the steps of:

forming a third conductive portion possessor comprising a first conductive portion and a conductive film, said first conductive portion containing a first metal or metal compound having a first equilibrium electrode potential, said conductive film being electrically connected to said first conductive portion and containing a second metal or metal compound having a second equilibrium electrode potential, said conductive film being exposed from a surface of said third conductive portion possessor; and wet-etching said conductive film in such a way that a second conductive portion is formed, said second conductive portion being electrically connected to said first conductive portion and containing said second metal or metal compound;

wherein in said wet-etching step, said conductive film is wet-etched in such a way that not only said second conductive portion but also a sacrificial electrode is formed, said sacrificial electrode being electrically connected to said first conductive portion.

In the third method of manufacturing a conductive portion device, not only the second conductive portion but also the first conductive portion contacts the etchant in the wet-etching step, so that the first and second conductive portions act as anode or cathode and thus the cell reaction may occur. If this cell reaction occurs, the etch rate of the material of the second conductive portion increases, so that it becomes difficult to form the second conductive portion having the desired size. Therefore, in order that the second conductive portion can have the desired size, it is required that the cell reaction is not promoted as much as possible. For this reason, in the third method of manufacturing the conductive portion device, said conductive film is wet-etched in the wet-etching step in such a way that said second conductive portion is formed and that a sacrificial electrode electrically connected to said first conductive portion is formed. If the conductive film is wet-etched, not only the first and second conductive portions but also the sacrificial electrode contacts the etchant temporarily since the sacrificial electrode in addition to the second conductive portion is formed. Therefore, not only the first and second conductive portions but also the sacrificial electrode acts as anode or cathode and thus the cell reaction occurs at the first and second conductive portions and the sacrificial electrode, so that areas in which the cell reaction occurs can be distributed over the first and second conductive portions and the sacrificial electrode. As a result of this, the cell reaction on the second conductive portion become less liable to be promoted, and thus the conductive film can be easily wet-etched in such a way that the second conductive portion having the desired shape is formed.

The third method of manufacturing an electronic device is useful, for example, in a case in which said conductive film is formed so as to cover said first conductive portion, and then, in said wet-etching step, said conductive film is wet-etched in such a way that at least part of said first conductive portion is exposed. After this wet-etching, a part of said first conductive portion may be removed.

A first electronic device comprises a first base comprising a first conductive portion and a second conductive portion, said first conductive portion containing a first metal or metal compound having a first equilibrium electrode potential, said second conductive portion being electrically connected to said first conductive portion and containing a second metal or metal compound having a second equilibrium electrode potential, an underlying layer formed on said first base and a reflective portion formed on a surface of said underlying layer, said reflective portion comprising a plurality of projections or recesses, wherein said underlying layer comprises coating portions provided at positions corresponding to said plurality of projections or recesses and an underlying layer main portion formed using photosensitive material, said underlying layer main portion covering said coating portions.

A second electronic device comprises a first conductive portion containing a first metal or metal compound having a first equilibrium electrode potential, a second conductive portion containing a second metal or metal compound having a second equilibrium electrode potential, said second conductive portion being electrically connected to said first conductive portion, and a sacrificial electrode electrically connected to said first and second conductive portions.

An image display device according to the present invention is provided with the electronic device described below.

DESCRIPTION OF THE PREFERRED EMBODIMENT(S)

The embodiments of the present invention are described below using the examples in which TFT array substrates for liquid crystal display devices are manufactured, but the present invention can be applied to other than the TFT array substrates for liquid crystal display devices.

Embodiment 1

Figure 1:
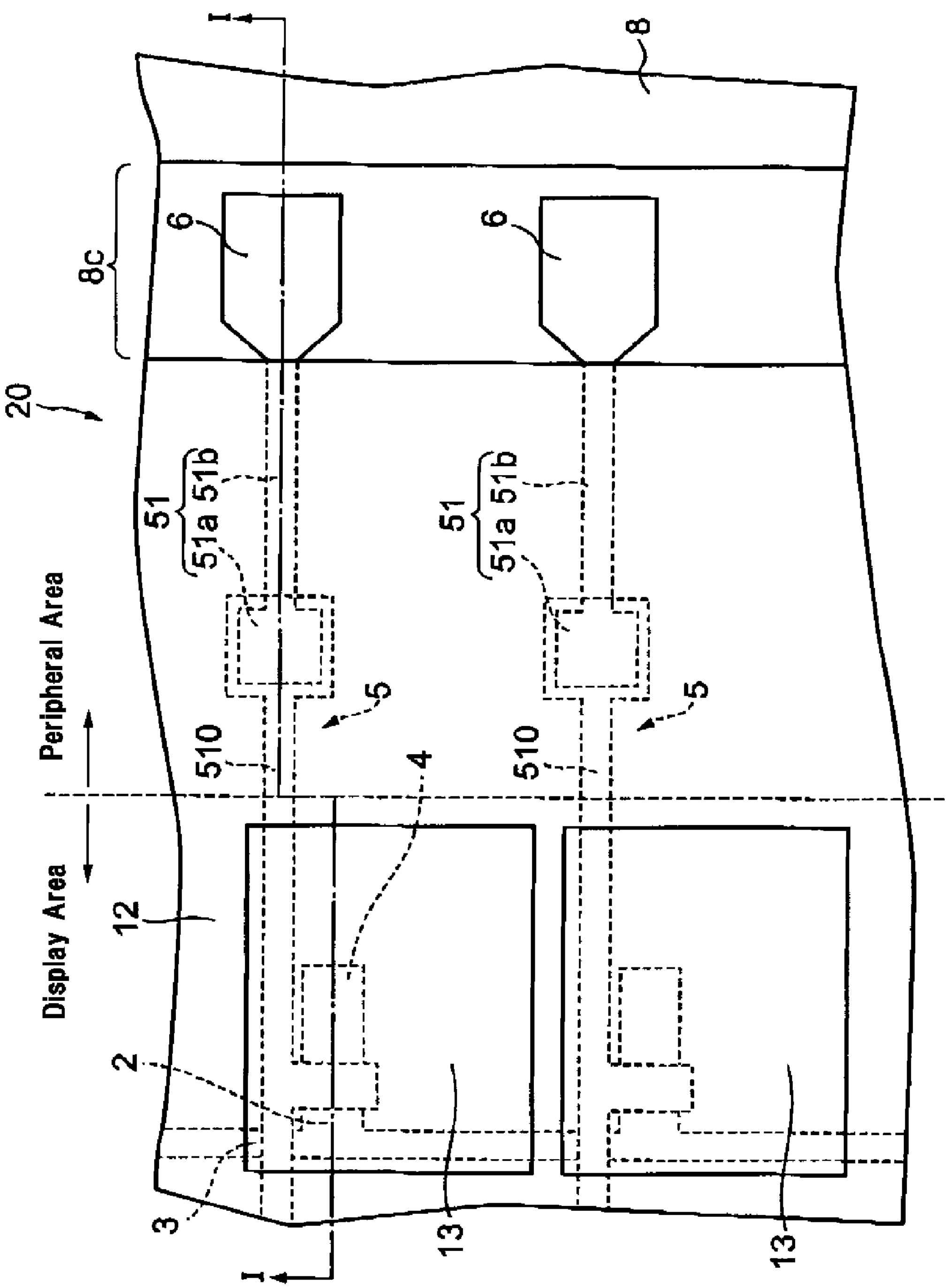
FIG. 1 is a plan view of a part of a TFT array substrate 20 of a first embodiment according to the present invention, the TFT array substrate 20 used in a reflective liquid crystal display device of top gate type.
Figure 2:
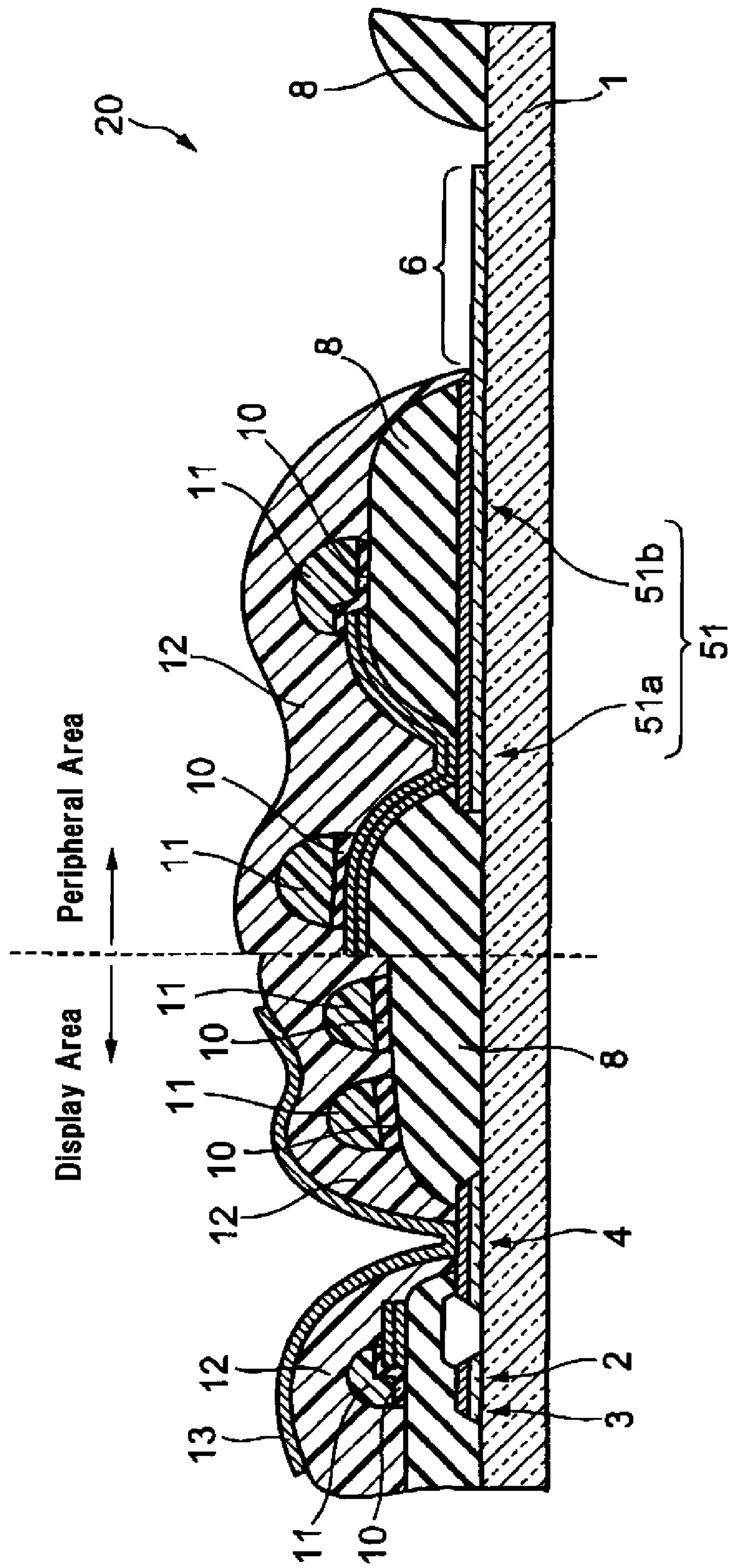
FIG. 2 is a cross-sectional view of the substrate 20, viewed in I-I direction shown in FIG. 1.

FIG. 1 is a plan view of a part of a TFT array substrate 20 of a first embodiment according to the present invention, the TFT array substrate 20 used in a reflective liquid crystal display device of top gate type. FIG. 2 is a cross-sectional view of the substrate 20, viewed in I-I direction shown in FIG. 1. This embodiment is described about the reflective liquid crystal display device, but the present invention can be applied to, for example, a transflective liquid crystal display devices.

The left sides of FIGS. 1 and 2 are display areas in which TFTs, reflective electrodes 13 and others are formed. The right sides of FIGS. 1 and 2 are peripheral areas in which gate terminals 6 are formed. It is noted that, for the sake of convenience, the display areas and the peripheral areas are schematically illustrated.

A method of manufacturing the TFT array substrate 20 shown in FIGS. 1 and 2 is described below.

Figure 3:
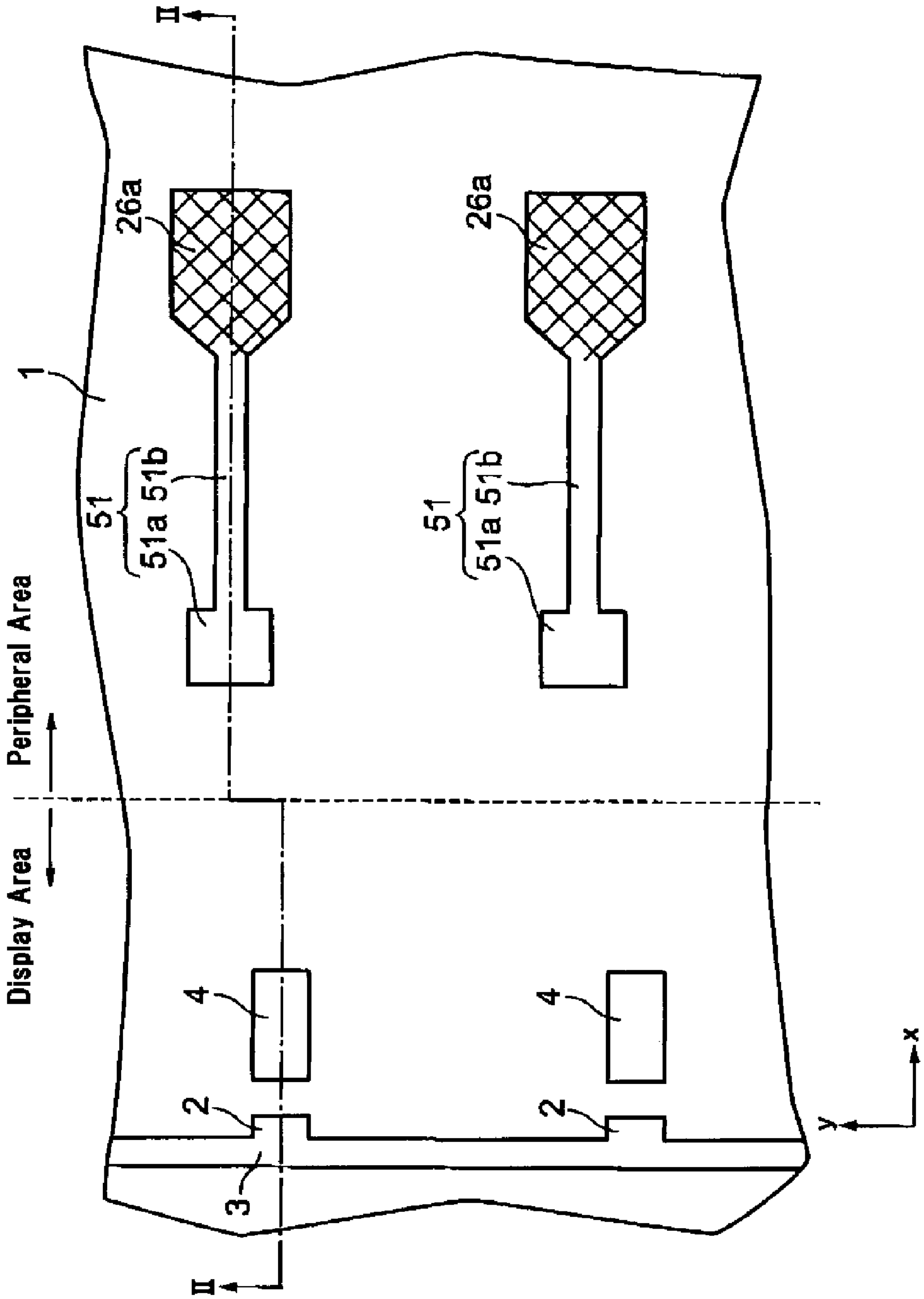
FIG. 3 is a plan view of a part of the substrate on which the source buses 3, the end portions 51 of gate buses and others have been formed.

First, on a glass substrate 1 are formed source electrodes 2, source buses 3, drain electrodes 4, end portions 51 of gate buses and gate terminals 6 (see FIG. 3).

Figure 4:
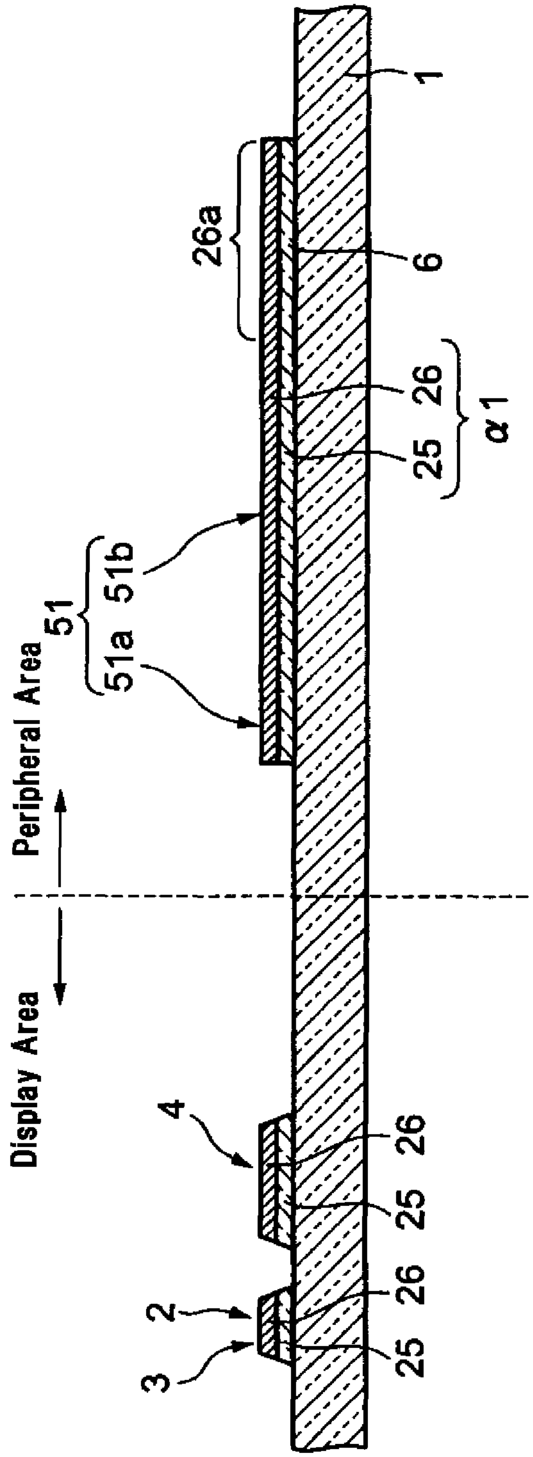
FIG. 4 is a cross-sectional view of the substrate, viewed in II-II direction shown in FIG. 3.

FIG. 3 is a plan view of a part of the substrate on which the source buses 3, the end portions 51 of gate buses and others have been formed. FIG. 4 is a cross-sectional view of the substrate, viewed in II-II direction shown in FIG. 3.

As shown in FIG. 3, formed on the display area are the source electrode 2, the source bus 3, and drain electrode 4. The source bus 3 is formed so as to extend in a y direction. The source electrode 2 is formed so as to be continuous with the source bus 3. Formed on the peripheral area are the gate terminal 6 and the end portion 51 of gate bus. The end portion of gate bus is referred to as "gate bus end portion" below. The gate terminal 6 is formed so as to be continuous with the gate bus end portion 51. The gate bus end portion 51 comprises a connection portion 51*a* and an extending portion 51*b*, the connection portion 51*a* being connected to a main portion 510 of the gate bus 5 described later (see FIG. 10), the extending portion 51*b* extending from the connection portion 51*a* to the gate terminal 6. The source electrode 2, the source bus 3, the drain electrode 4, and the gate bus end portion 51 are double layer structure consisting of an ITO portion 25 and a MoCr portion 26. The ITO portion 25 contains ITO and the MoCr portion 26 contains MoCr. The source electrode 2, the source bus 3, the drain electrode 4, and the gate bus end portion 51 having such double layer structure are formed by forming double layer films of MoCr film/ITO film on the substrate 1 and then patterning the double layer films. In case where the gate bus end portion 51 and others are the double layer structure consisting of the ITO portion 25 and the MoCr portion 26 instead of a single layer structure of the ITO portion 25, the gate bus end portion 51 and others can have lower resistance. The connection portion 51*a* of the gate bus end portion 51 is the double layer structure consisting of the ITO portion 25 and the MoCr portion 26 in this embodiment, but may be a single layer structure of only ITO portion 25. Even if the connection portion 51*a* of the gate bus end portion 51 is the single layer structure of only ITO portion 25, the gate bus end portion 51 itself can have the lower resistance under the condition that the extending portion 51*b* of the gate bus end portion 51 is the double layer structure consisting of the ITO portion 25 and the MoCr portion 26. However, the gate bus end portion 51 and others may be the single layer structure of only ITO portion 25 as long as the gate bus end portion 51 and others can have the sufficient lower resistance.

The gate terminal 6 is formed so as to be continuous with the gate bus end portion 51. It is however noted that the gate terminal 6 is covered with a portion 26*a* of the MoCr portion 26 (see cross-hatched areas in FIG. 3). The portion 26*a* of the MoCr portion 26 is not required for the gate terminal 6 (the portion 26*a* of the MoCr portion 26 is referred below to as "MoCr unnecessary portion 26*a*"), so that the MoCr unnecessary portion 26*a* must be removed. However, if we try to remove the MoCr unnecessary portion 26*a* from a structure shown in FIGS. 3 and 4, special photolithographic steps for removing the MoCr unnecessary portion 26*a* are required, this increases the number of manufacturing steps. In order to manufacture the TFT array substrate without increasing the number of manufacturing steps, an a-Si layer and a gate insulating film are formed without removing the MoCr unnecessary portion 26*a* at once. It is noted that a double layer structure $\alpha$1 (see FIG. 4) consisting of the ITO portion 25 and the MoCr portion 26 forms the gate bus end portion 51, the gate terminal 6, and the MoCr unnecessary portion 26*a*.

Figure 5:
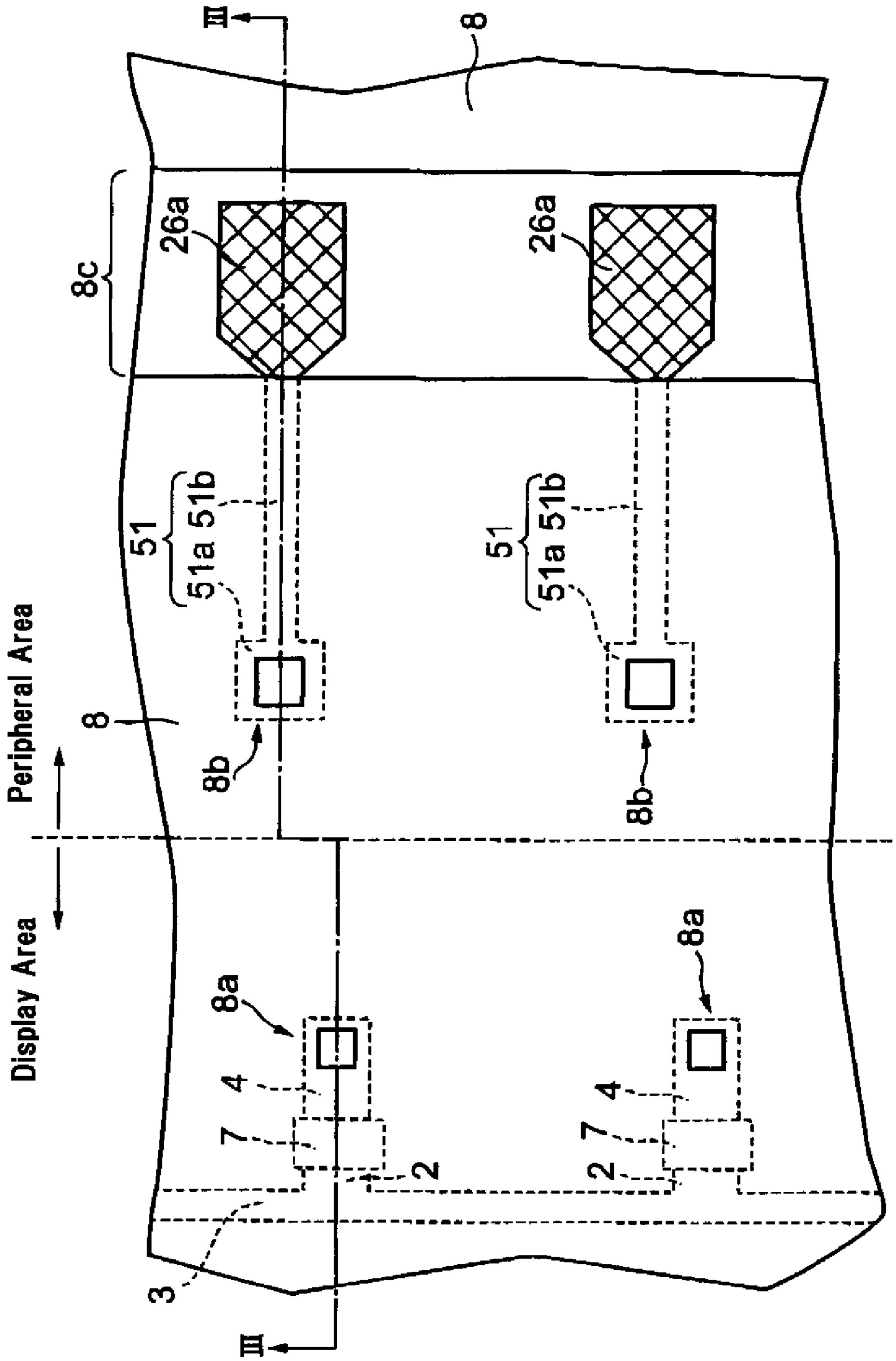
FIG. 5 is a plan view of a part of the substrate on which the a-Si layer and the gate insulating film 8 have been formed.
Figure 6:
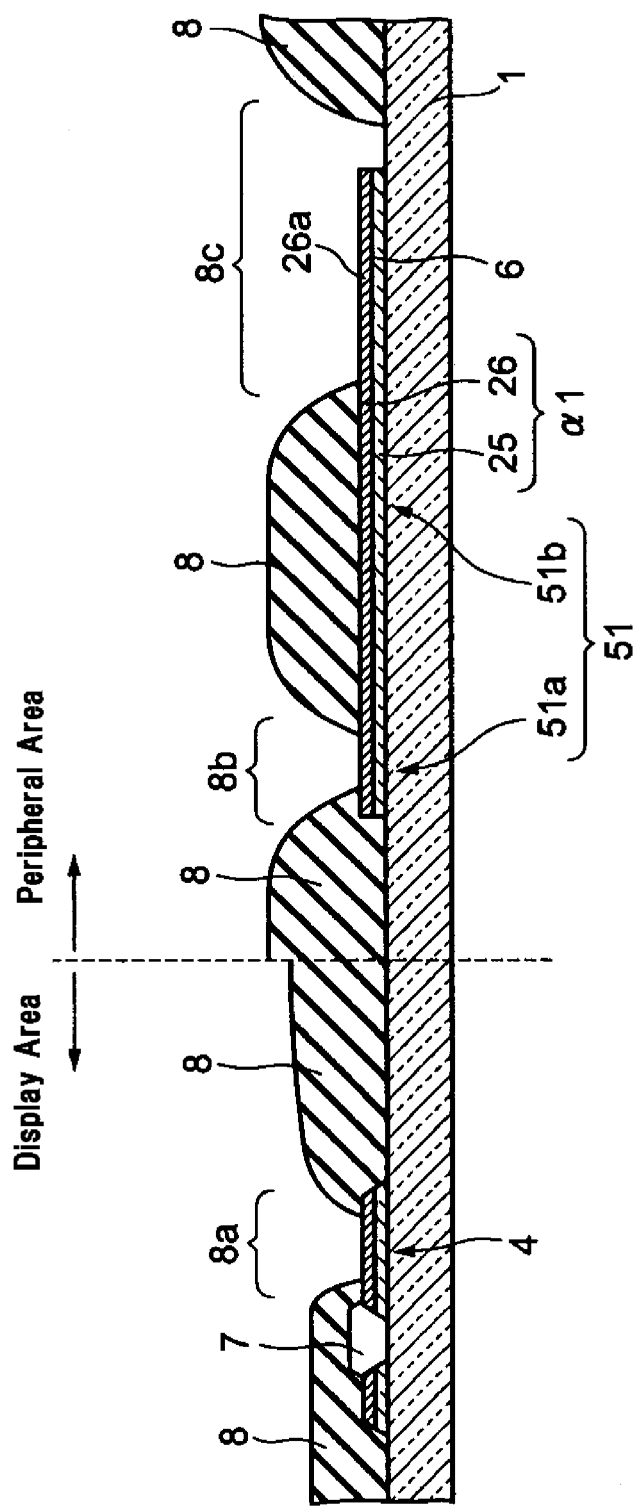
FIG. 6 is a cross-sectional view of the substrate, viewed in III-III direction shown in FIG. 5.

FIG. 5 is a plan view of a part of the substrate on which the a-Si layer and the gate insulating film 8 have been formed. FIG. 6 is a cross-sectional view of the substrate, viewed in III-III direction shown in FIG. 5.

After the a-Si layer 7 is formed, the gate insulating film 8 is formed. The gate insulating film 8 comprises holes 8*a*, 8*b*, and 8*c*. The hole 8*a* is to expose the drain electrode 4 from the surface of the gate insulating film 8. The hole 8*b* is to expose the connection portion 51*a* of the gate bus end portion 51 from the surface of the gate insulating film 8. The hole 8*c* is to expose the MoCr unnecessary portion 26*a* covering the gate terminal 6 from the surface of the gate insulating film 8.

Figure 7:
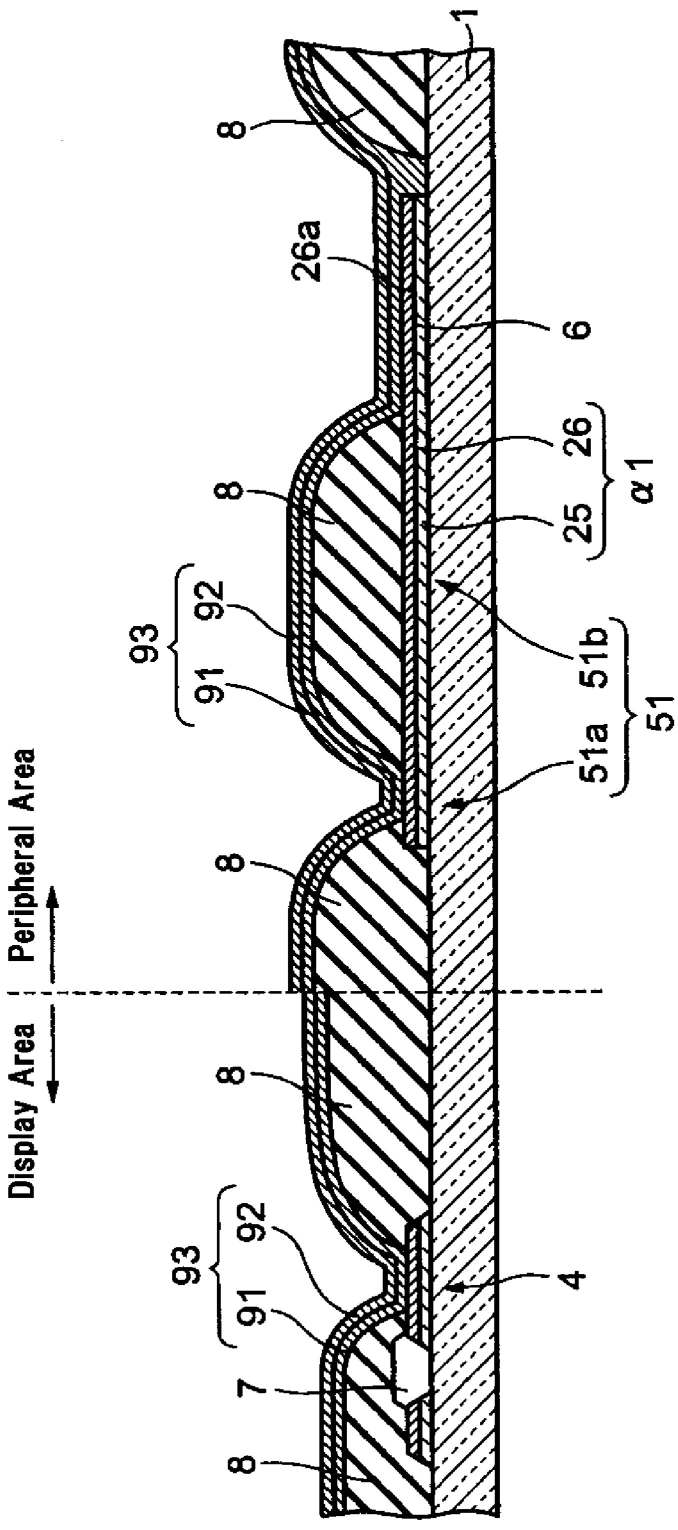
FIG. 7 is a cross-sectional view of the substrate on which the conductive film 93 has been formed.

After the gate insulating film 8 is formed, a conductive film is formed using material of gate electrode and others (see FIG. 7).

FIG. 7 is a cross-sectional view of the substrate on which the conductive film 93 has been formed.

The conductive film 93 consists of a film 91 and a film 92. The film 91 is formed by using material which has mainly Mo and has added Cr (Such film is referred below to as "MoCr film"). The film 92 is formed by using material which has mainly Al and has added Cu (Such film is referred below to as "AlCu film"). After the MoCr film 91 and the AlCu film 92 are formed, the films 91 and 92 are patterned by photolithographic technology (see FIG. 8).

Figure 8:
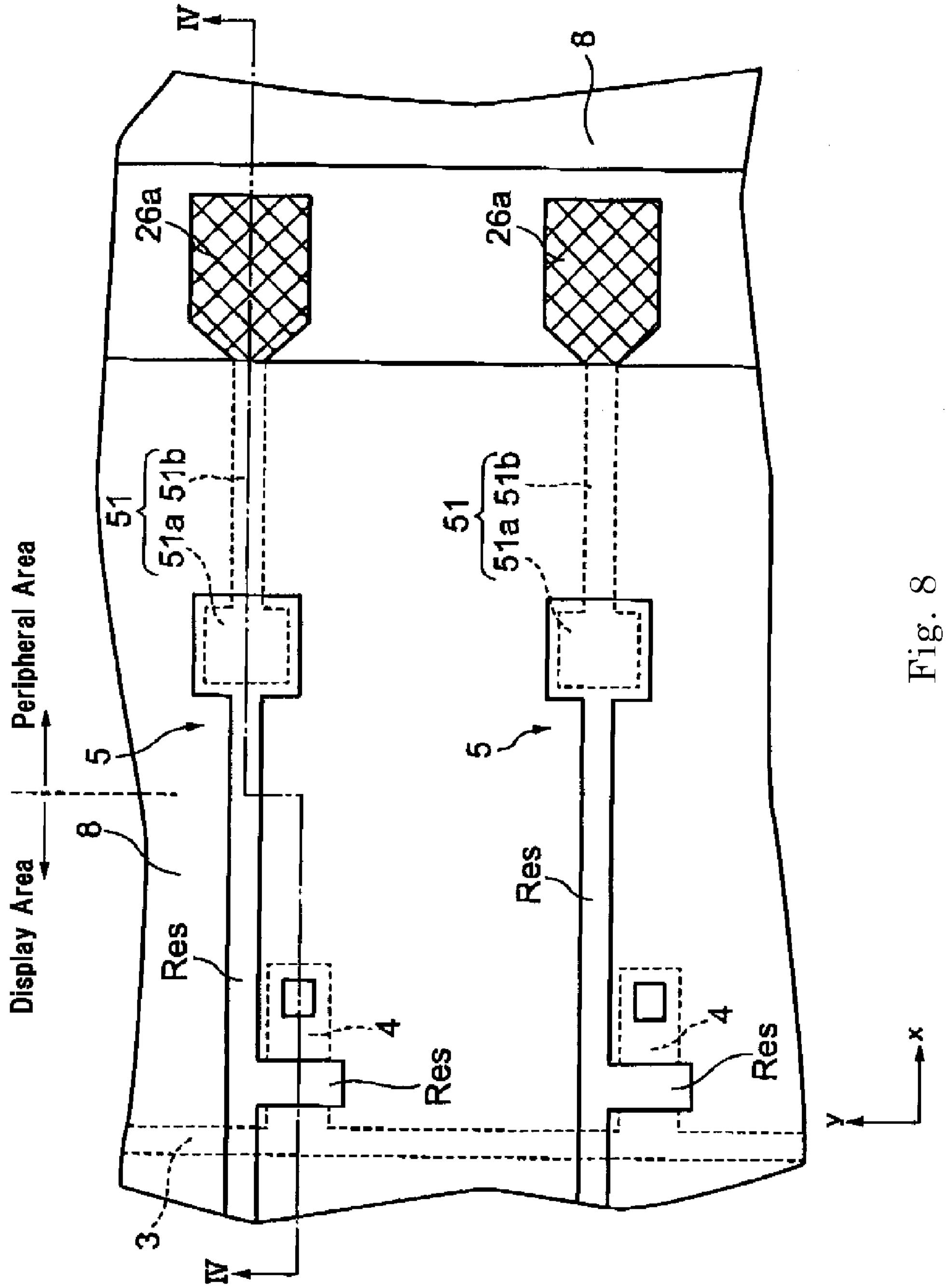
FIG. 8 is a plan view of a part of the substrate immediately after the MoCr film 91 and the AlCu film 92 have been patterned.
Figure 9:
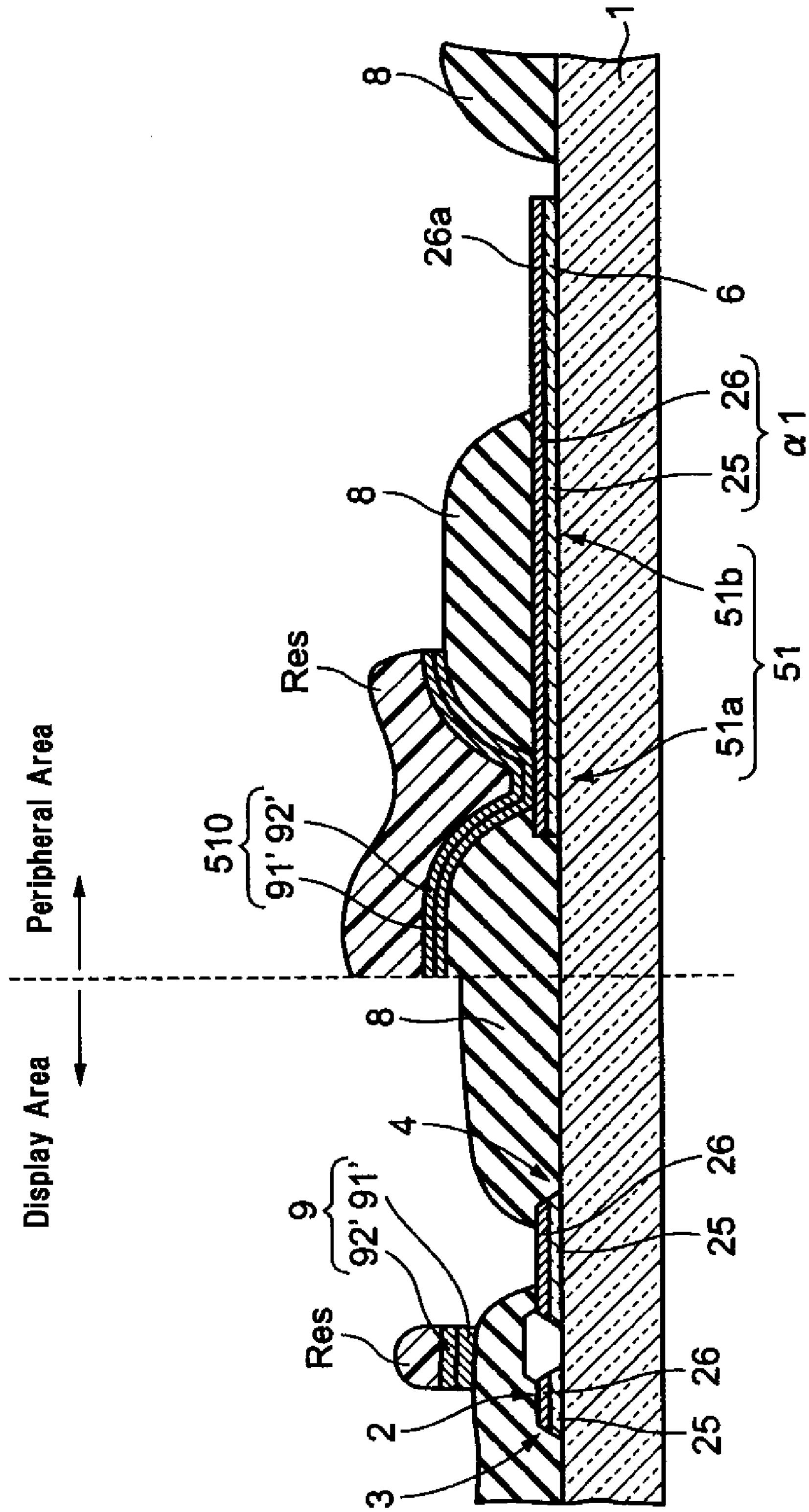
FIG. 9 is a cross-sectional view of the substrate, viewed in IV-IV direction shown in FIG. 8.

FIG. 8 is a plan view of a part of the substrate immediately after the MoCr film 91 and the AlCu film 92 have been patterned. FIG. 9 is a cross-sectional view of the substrate, viewed in IV-IV direction shown in FIG. 8.

In FIGS. 8 and 9, resist films Res for patterning the conductive film 93 (see FIG. 7) are illustrated. After the resist films Res are formed, the conductive film 93 is wet-etched, so that the gate electrode 9 and a main portion of the gate bus (referred below to as "gate bus main portion") 510 are formed under the resist films Res. Since the conductive film 93 (see FIG. 7) is wet-etched, unnecessary portions of the conductive film 93 are removed, so that the MoCr unnecessary portion 26*a* of the MoCr portion 26 appears. Since the MoCr unnecessary portion 26*a* is not required for the gate terminal 6 as described above, the MoCr unnecessary portion 26*a* also is wet-etched (see FIG. 10) after the MoCr unnecessary portion 26*a* appears and before the resist films Res is removed.

Figure 10:
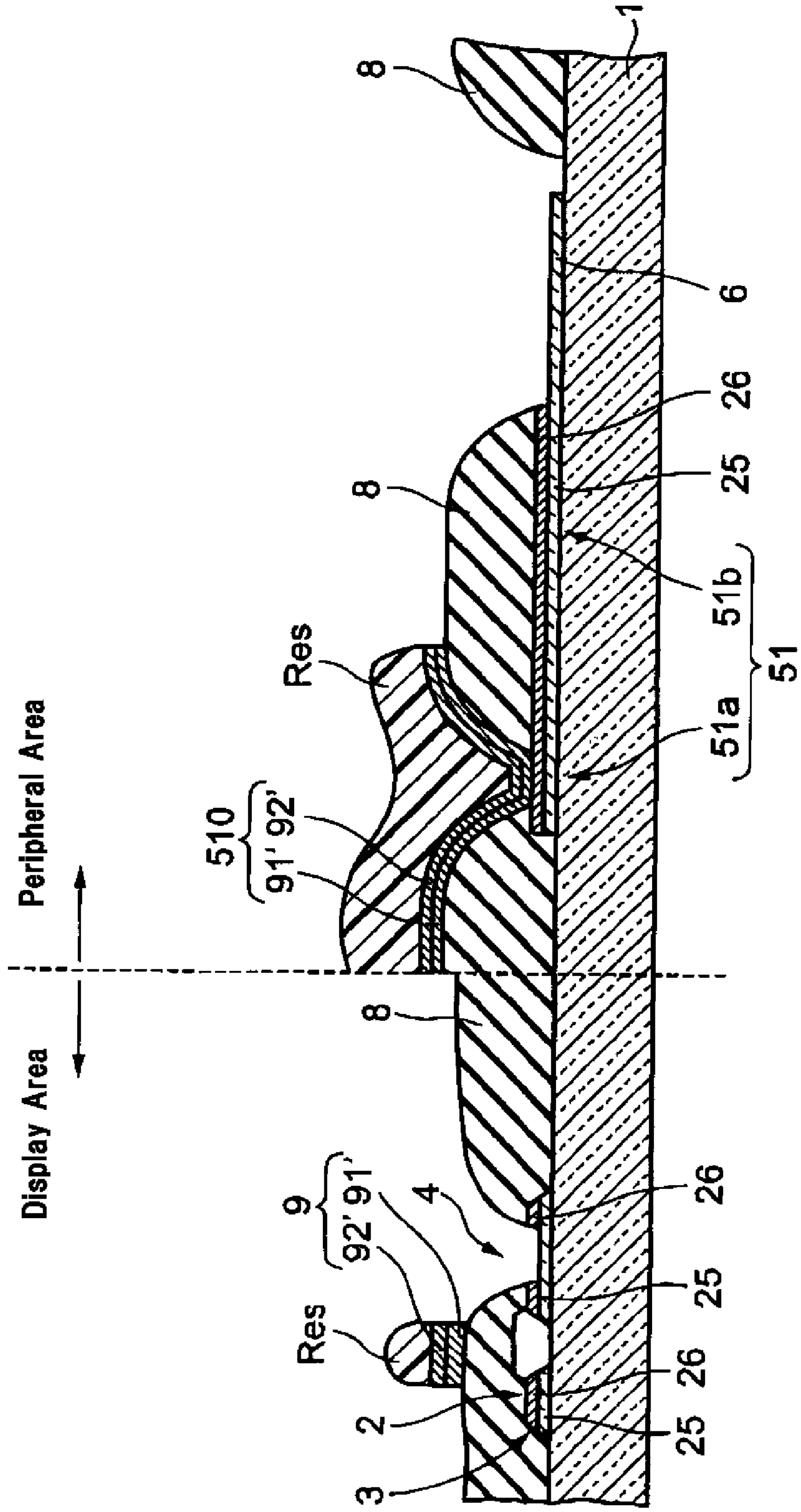
FIG. 10 is a cross-sectional view of the substrate after the MoCr unnecessary portion **26*a*** has been wet-etched.

FIG. 10 is a cross-sectional view of the substrate after the MoCr unnecessary portion 26*a* has been wet-etched.

By wet-etching the MoCr unnecessary portion 26*a*, the gate terminal 6 can appear. Further, by wet-etching the MoCr unnecessary portion 26*a*, the MoCr portion 26 of the gate electrode 4 having the same material as the MoCr unnecessary portion 26*a* is partially wet-etched. After wet-etching, the resist films Res are removed. As a result, a conductive portion possessor A shown in FIG. 11 is manufactured.

In this embodiment, in order that the gate terminals 6 can appear, the gate insulating film 8 is formed before the MoCr unnecessary portion 26*a* is removed (see FIGS. 5 and 6), and the MoCr unnecessary portion 26*a* is wet-etched in the step of wet-etching the conductive film 93. It is noted that the gate terminal 6 may appear by removing the MoCr unnecessary portion 26*a* of the double layer structure $\alpha$1 shown in FIG. 4 before the gate insulating film 8 is formed. However, if the gate terminal 6 is caused to appear e before the gate insulating film 8 is formed, this increases the number of manufacturing steps. For this reason, the MoCr unnecessary portion 26*a* is preferably wet-etched in the step of wet-etching the conductive film 93 as described with reference to FIGS. 3 to 10.

Figure 11:
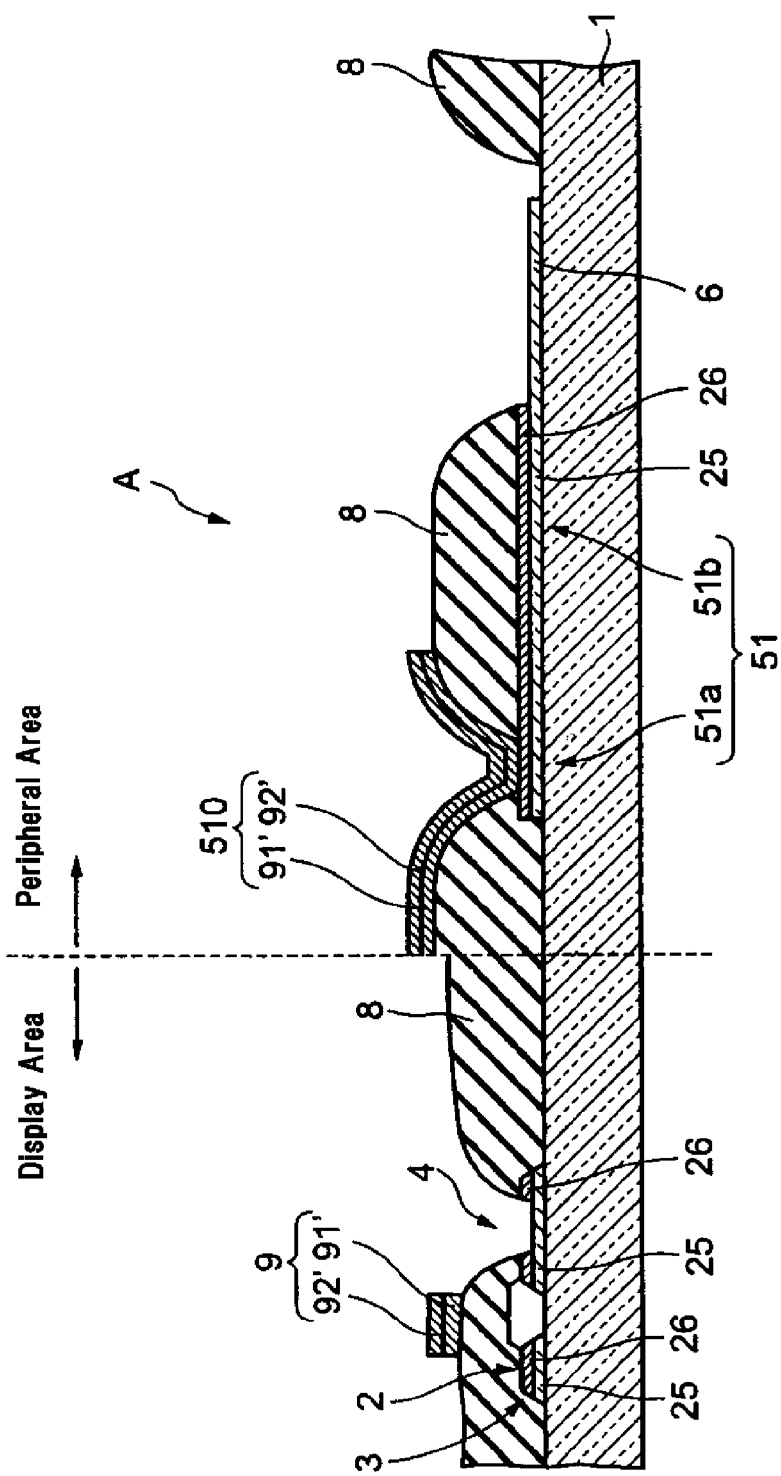
FIG. 11 is a cross-sectional view of the conductive portion possessor A.

After the resist films Res are removed as shown in FIG. 11 and before the reflective electrodes are formed, the underlying layer used for providing the reflective electrodes with the desired reflective electrode characteristics is formed. However, if the underlying layer is formed in the conventional way, problems described below arise. The problems is described with respect to FIGS. 12 to 16.

Figure 12:
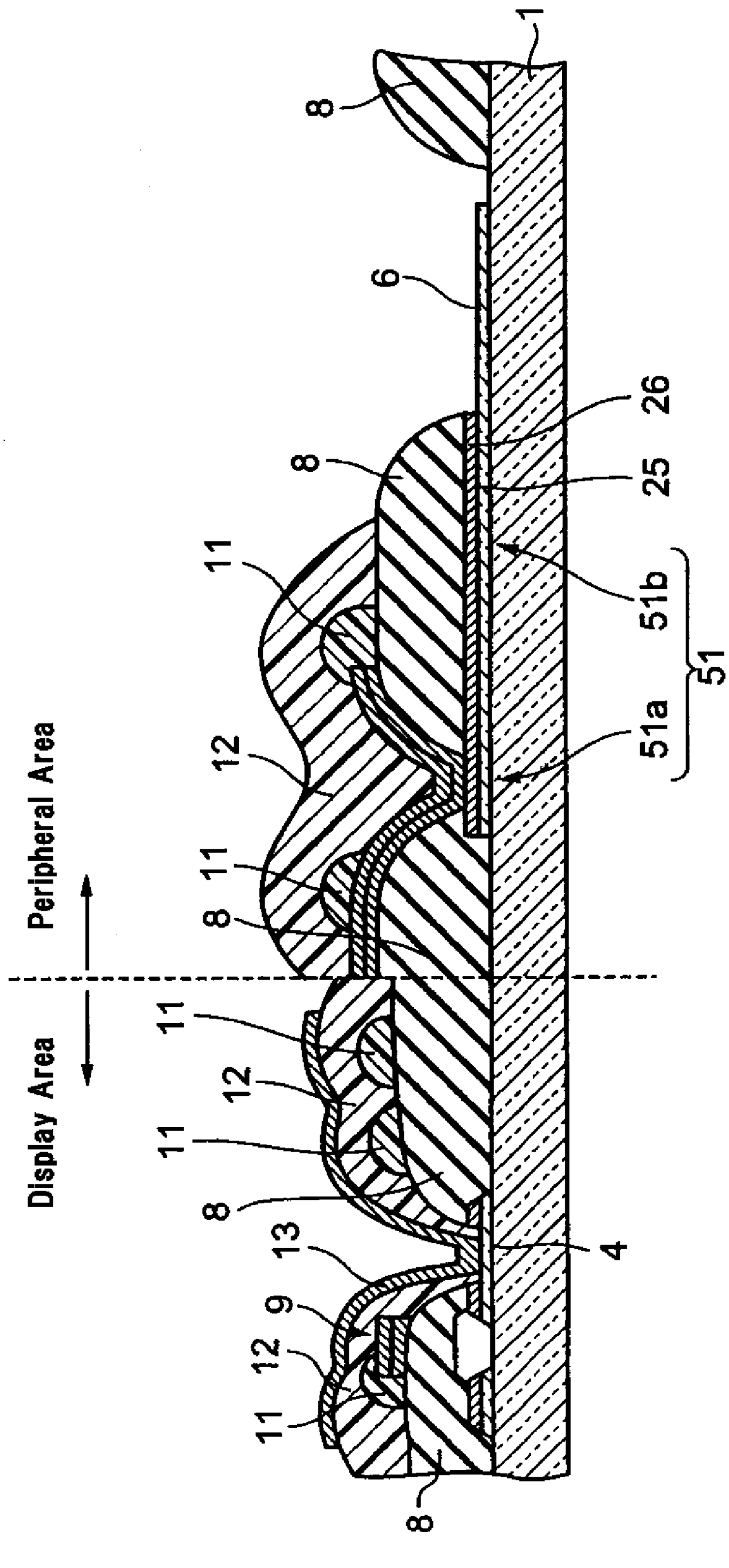
FIG. 12 is a cross-sectional view of the substrate on which the underlying layer has been formed in the conventional way and a reflective electrode 13 has been formed on the underlying layer.

FIG. 12 is a cross-sectional view of the substrate on which the underlying layer has been formed in the conventional way and a reflective electrode 13 has been formed on the underlying layer.

The underlying layer consists of a large number of projections 11 and a planarization film 12. The projections 11 are formed using photosensitive resin, and the planarization film 12 is formed so as to cover the projections 11. Since a large number of projections 11 exist under the planarization film 12, the planarization film 12 has projections and recesses on its surface. The planarization film 12 has projections and recesses on its surface and thus the reflective electrode 13 also has projections and recesses on its surface, so that it is possible to improve the reflective characteristic of the reflective electrode 13. It is described below how to form the projections 11 with reference to FIGS. 13 and 14.

Figure 13:
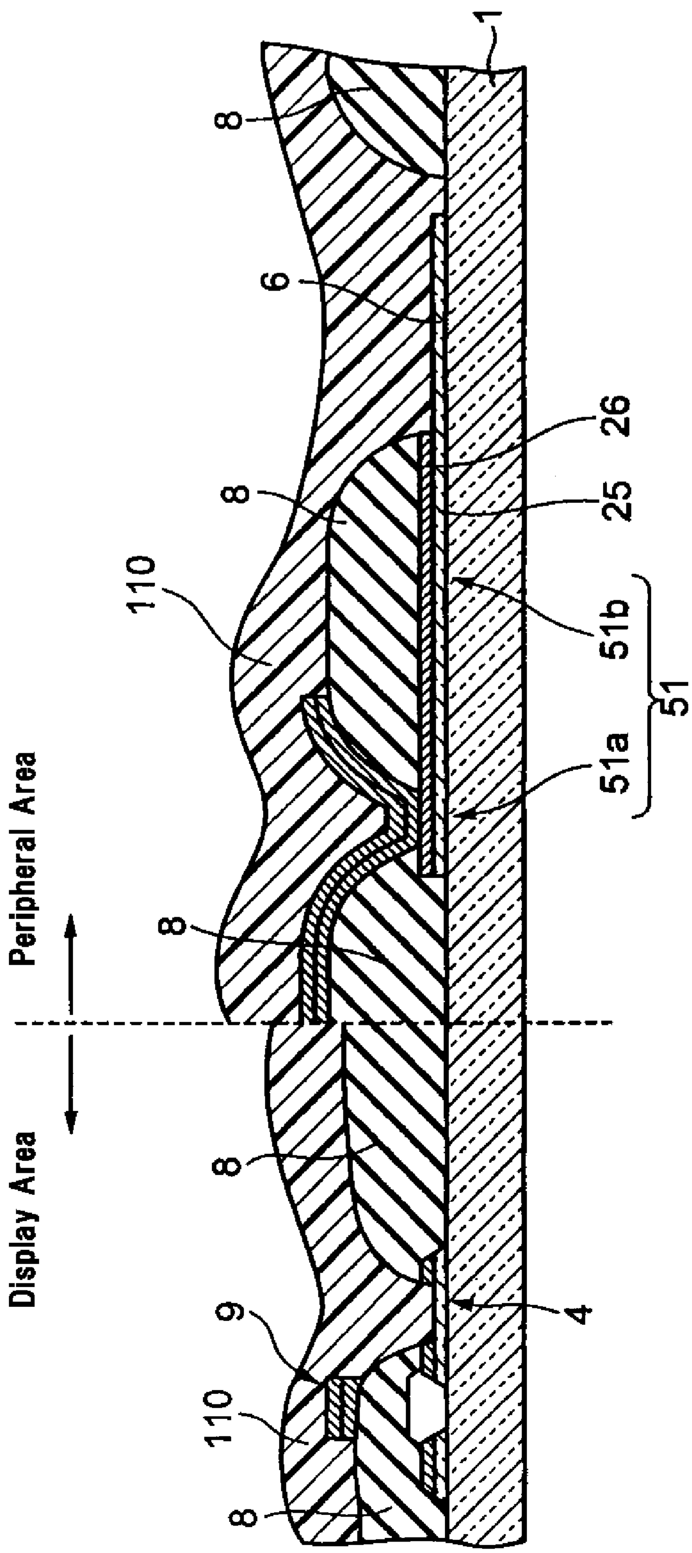
FIG. 13 is a cross-sectional view of the substrate on which a photosensitive film has been formed.
Figure 14:
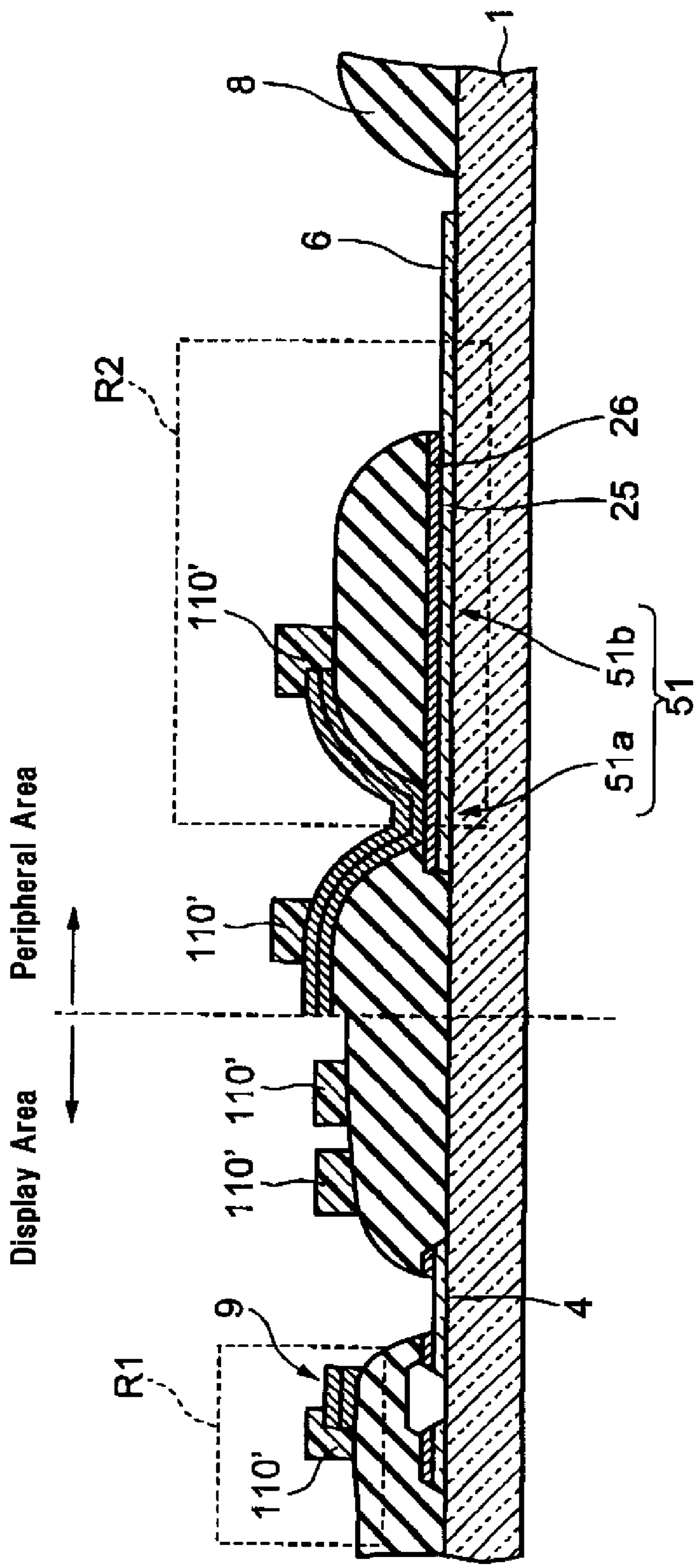
FIG. 14 is a cross-sectional view of the substrate immediately after the photosensitive film shown in FIG. 13 has been developed.

FIG. 13 is a cross-sectional view of the substrate on which a photosensitive film has been formed. FIG. 14 is a cross-sectional view of the substrate immediately after the photosensitive film shown in FIG. 13 has been developed.

In order to form the projections 11 shown in FIG. 12, the photosensitive film 110 is first formed by applying photosensitive resin on a surface of the substrate on which the gate electrodes 9 have been formed and then by pre-baking the applied photosensitive resin. After that, the photosensitive film 110 is exposed to light and then is developed in such a way that portions of the photosensitive film 110 corresponding to the projections 11 remain. By exposing the photosensitive film 110 to light and developing it as described above, a large number of projections 110' are formed, each projection 110' having a substantially rectangular in cross section (see FIG. 14). After a large number of projections 110' are formed, the projections 110' are post-baked, so that the photosensitive resin which is the material of the projections 110' melts and thus a large number of projections 11 are formed, each projection 11 having a domed shape in cross section (see FIG. 12). However, if the projections 11 are formed in a manner described above, a problem of smaller size of the projections 110' than the desired size and a problem of higher resistance of the gate terminal 6 arise. The cause of the smaller size of the projections 110' than the desired size is discussed below with respect to FIG. 15, and next, the cause of higher resistance of the gate terminal 6 is discussed below with respect to FIG. 16.

Figure 15:
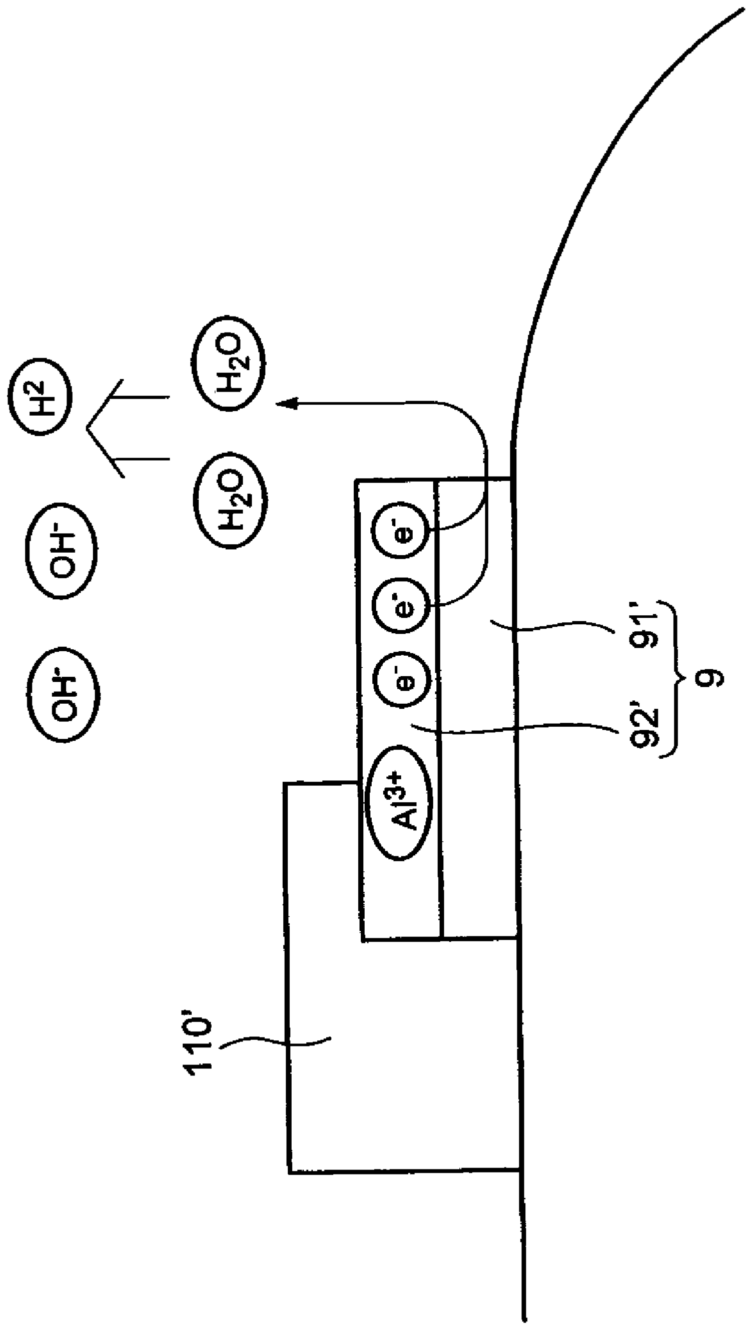
FIG. 15 is an enlarged view of a region R1 shown in FIG. 14.

FIG. 15 is an enlarged view of a region R1 shown in FIG. 14.

In order for a large number of projections 110' (see FIG. 14) to be formed from the photosensitive film 110 (see FIG. 13), it is necessary to remove unnecessary portions of the photosensitive film 110. For this purpose, the unnecessary portions of the photosensitive film 110 are removed by the developer in the developing step. Since the unnecessary portions of the photosensitive film 110 are removed by the developer, the gate electrode 9 appears and is temporarily immersed in the developer. The gate electrode 9 contains an abundance of Al and Mo since the gate electrode 9 consists of the MoCr film 91' and Al Cu film 92'. The relation between equilibrium electrode potentials of Al and Mo is as follows.

$$Al<Mo \tag{1}$$

It is considered that since the developer is an electrolyte liquid, a cell reaction represented by reaction formulas (2) and (3) occurs by contacting the MoCr film 91' and AlCu film 92' with the developer.

$$Al \rightarrow Al^{3+}+3e- \tag{2}$$

$$2e-+2H_2O \rightarrow H_2+2OH— \tag{3}$$

It is considered that the AlCu film 92' acts as an anode since the equilibrium electrode potential of Al is smaller than the equilibrium electrode potential of Mo, and thus considered that the reaction formula (2) representing an emission of electrons (e−) occurs on a priority base. On the other hand, it is considered that the MoCr film 91' acts as a cathode, and thus considered that the reaction formula (3) representing a receipt of electrons (e−) occurs on a priority base. The $H_2O$ in the left side of the reaction formula (3) is H2O mainly contained in the developer.

If the reaction represented by the reaction formula (2) occurs, $Al^{3+}$ is generated and electrons (e−) are generated. Some of the generated electrons pass through the MoCr film 91' from the AlCu film 92' and react $H_2O$ contained in the developer, so that $H_2$ and OH— are generated as shown in the reaction formula (3). If the reaction represented by the reaction formula (3) occurs, OH— is generated, so that an alkali concentration becomes higher near the MoCr film 91'. If the alkali concentration becomes higher, a speed at which the developer removes the photosensitive film 110 becomes faster accordingly, so that the removal of the photosensitive resin is accelerated near the MoCr film 91'. It is therefore considered that the material of the projections 110' located near the MoCr film 91' is removed more than necessary and thus the projections 110' become smaller in size than the desired size.

Further, it is considered that, at the peripheral area, a phenomenon described below occurs.

Figure 16:
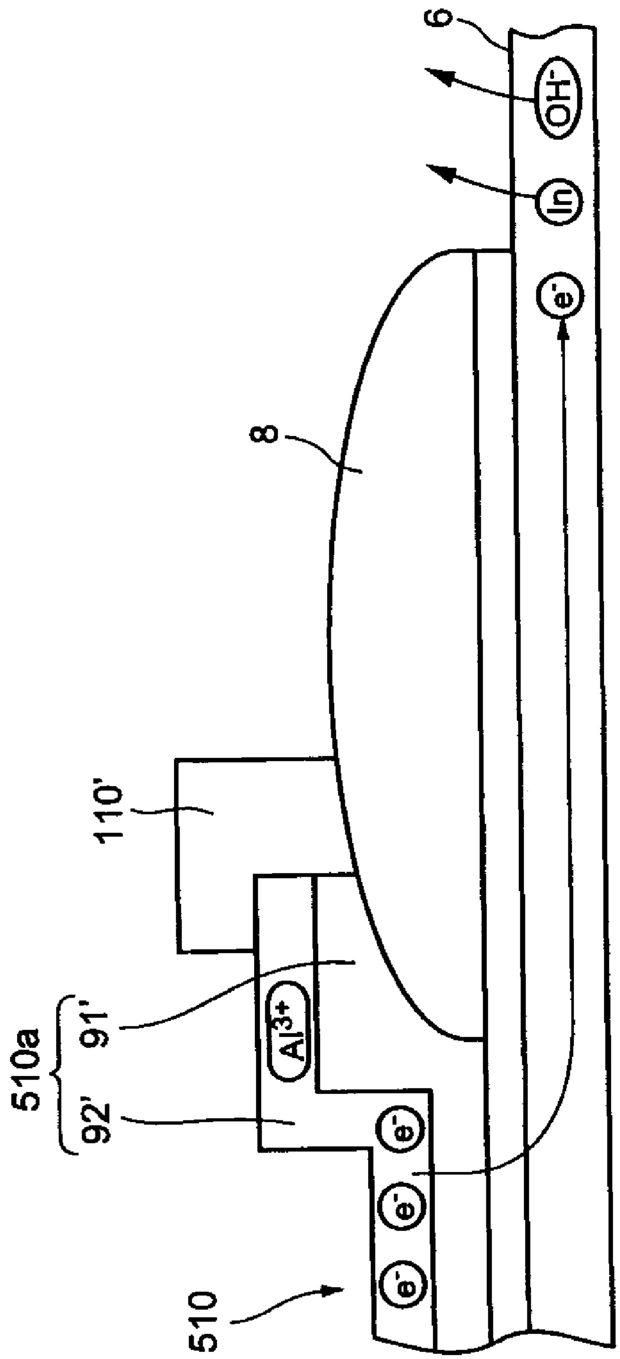
FIG. 16 is an enlarged view of a region R2 shown in FIG. 14.

FIG. 16 is an enlarged view of a region R2 shown in FIG. 14.

If the photosensitive film 110 is developed, the projection 110' is formed and the gate bus main portion 510 and the gate terminal 6 appear on the peripheral area. Therefore, the gate bus main portion 510 and the gate terminal 6 become temporarily immersed in the developer at the side of the peripheral area. The gate bus main portion 510 contains the abundant Al and Mo since the gate bus main portion 510 consists of the MoCr film 91' and the AlCu film 92' (see FIG. 8), and the gate terminal 6 contains $In_2O_3$ since ITO is used as the material of the gate terminal 6. The magnitude relationship among equilibrium electrode potentials of Al, Mo and $In_2O_3$ is represented by an equation (4).

$$Al<Mo<In_2O_3 \quad (4)$$

As shown in the equation (4), Al has the smallest equilibrium electrode potential and $In_2O_3$ has the largest equilibrium electrode potential. It is therefore considered that a cell reaction represented by reaction formulas (5) and (6) occur when the gate bus main portion 510 and the gate terminal 6 become immersed in the developer.

$$Al \rightarrow Al^{3+}+3e- \quad (5)$$

$$In_2O_3+6e-+3H_2O \rightarrow 2In+6OH— \quad (6)$$

It is considered that since Al has the smallest equilibrium electrode potential and $In_2O_3$ has the largest equilibrium electrode potential, the reaction formula (5) occurs on a priority base at the side of the AlCu film 92' and the reaction formula (6) occurs on a priority base at the side of the ITO (i.e. at the side of the gate terminal 6).

If the reaction represented by the reaction formula (5) occurs, $Al^{3+}$ is generated and electrons (e−) are generated. Some of the generated electrons pass through the MoCr film 91' from the AlCu film 92' and flow into the gate terminal 6. The electrons (e−) flowing into the gate terminal 6 cause the reaction of generation of In (Indium) from $In_2O_3$ in the gate terminal 6, as shown in the reaction formula (6). It is considered that such generated In (Indium) causes the damage of the gate terminal 6 and thus the gate terminal 6 has higher resistance.

From consideration described above, the inventor has thought that the cause of removing the projections 110' itself is the occurrence of the reaction formulas (2) and (3) and that the cause of the higher resistance of the gate terminal 6 is the occurrence of the reaction formulas (5) and (6). Therefore, in a first embodiment, the underlying layer is formed as described below in such a way that the reaction formulas (2), (3), (5) and (6) do not occur. A method of forming the underlying layer is described with reference to FIGS. 17 to 22.

Figure 17:
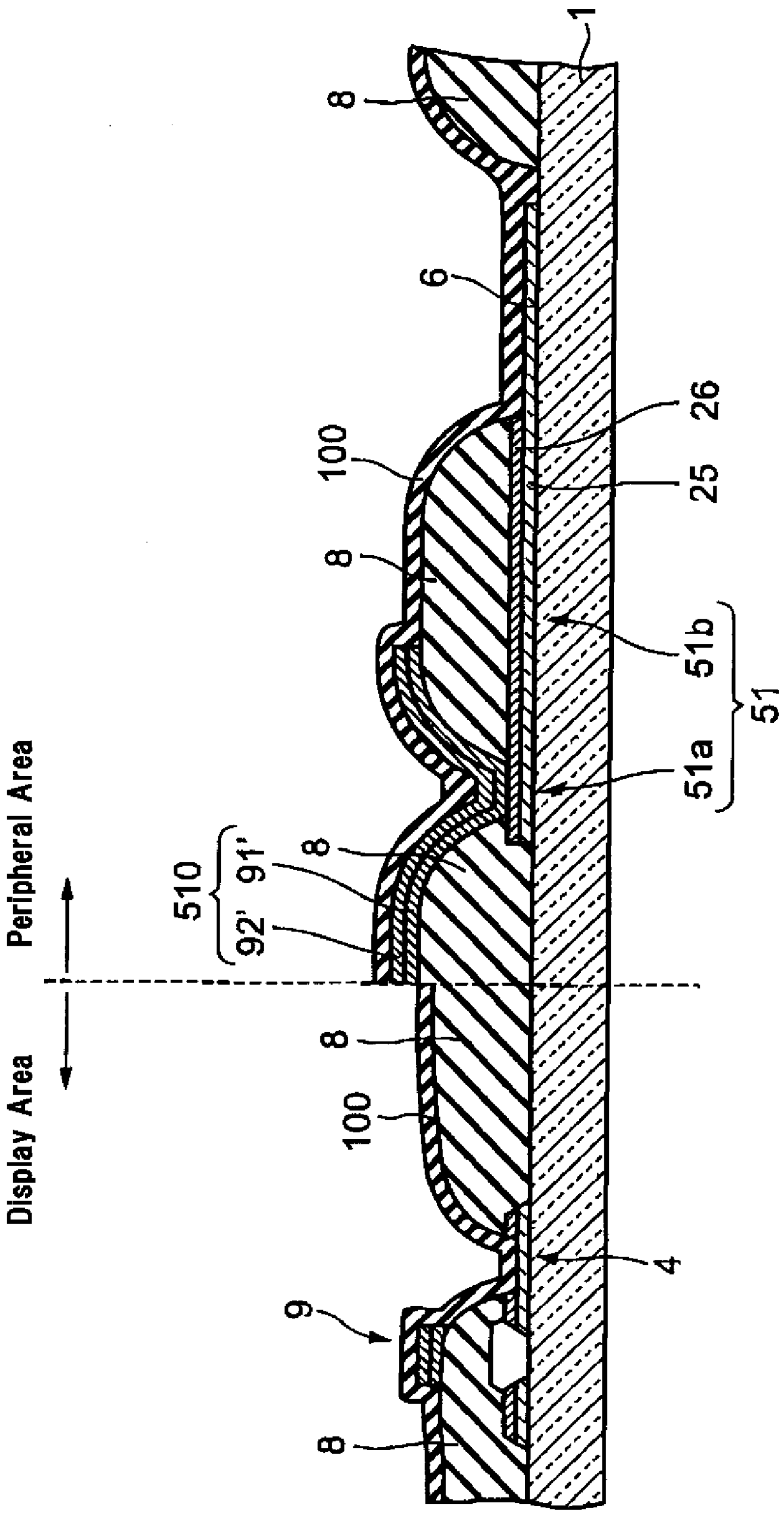
FIG. 17 is a cross-sectional view of the substrate on which a coating film has been formed.

FIG. 17 is a cross-sectional view of the substrate on which a coating film has been formed.

In the first embodiment, the coating film 100 is formed before the photosensitive film 110 (see FIG. 13) is formed. The coating film 100 is formed so as to cover the whole surface of the substrate 1 having the gate electrode 9, the gate bus main portion 510, and the gate terminal 6. After the coating film 100 is formed, the photosensitive film 110 are formed (see FIG. 18).

Figure 18:
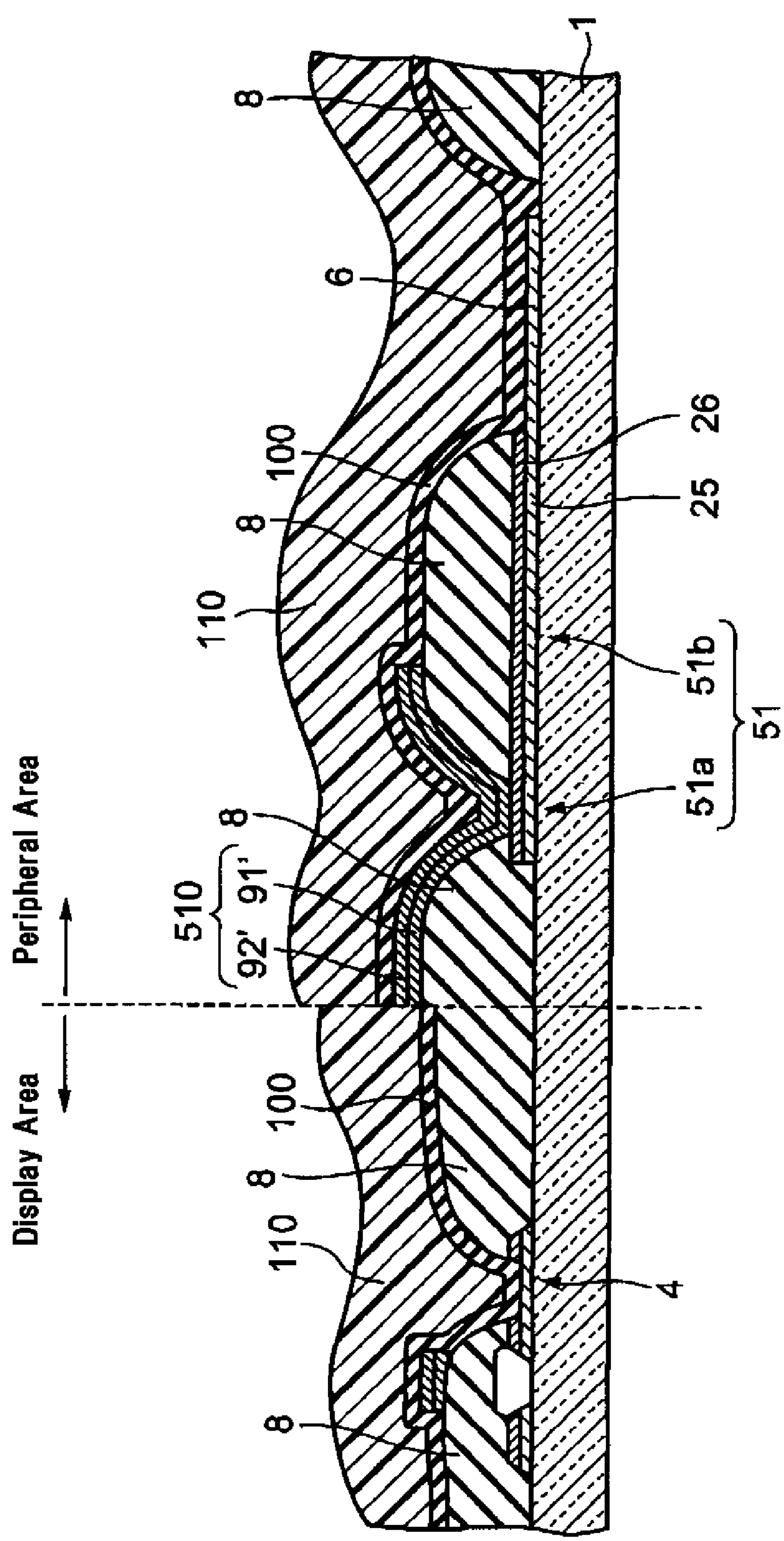
FIG. 18 is a cross-sectional view of the substrate on which the photosensitive film 110 has been formed.

FIG. 18 is a cross-sectional view of the substrate on which the photosensitive film 110 has been formed.

The photosensitive film 110 is formed by applying photosensitive resin and then pre-baking the applied photosensitive resin. After the photosensitive film 110 is formed, the photosensitive film 110 is exposed to light and developed (see FIG. 19).

Figure 19:
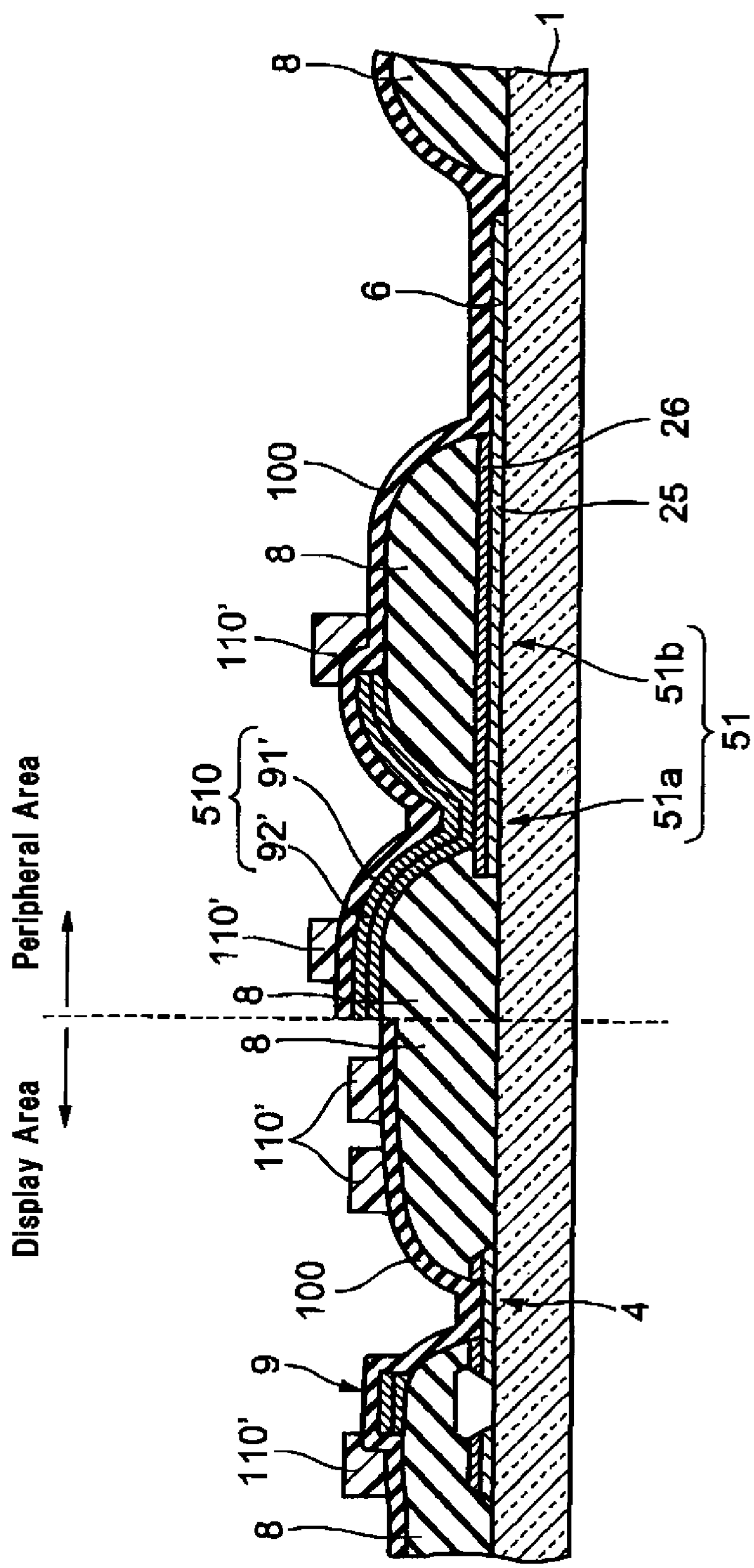
FIG. 19 is a cross-sectional view of the substrate after the photosensitive film 110 has been developed.

FIG. 19 is a cross-sectional view of the substrate after the photosensitive film 110 has been developed.

The photosensitive film 110 is exposed to light and developed in such a way that a large number of projections 110' each having a substantially cylinder shape are formed. Since the gate electrode 9 and the gate bus main portion 510 are covered with the coating film 100, the Mo and Al contained in the gate electrode 9 and the gate bus main portion 510 are prevented from being immersed in the developer during the development of the photosensitive film 110. Therefore, the reaction formulas (2) and (3) are certainly prevented from occurring, so that the projections 110' are certainly prevented from being reduced more than necessary.

Since the gate bus main portion 510 and the gate terminal 6 are covered with the coating film 100, the Mo and Al contained in the gate bus main portion 510 and the $In_2O_3$ contained in the gate terminal 6 are prevented from being immersed in the developer during the development of the photosensitive film 110. Therefore, the reaction formulas (5) and (6) are certainly prevented from occurring, so that the gate terminal 6 is certainly prevented from having the higher resistance.

Figure 20:
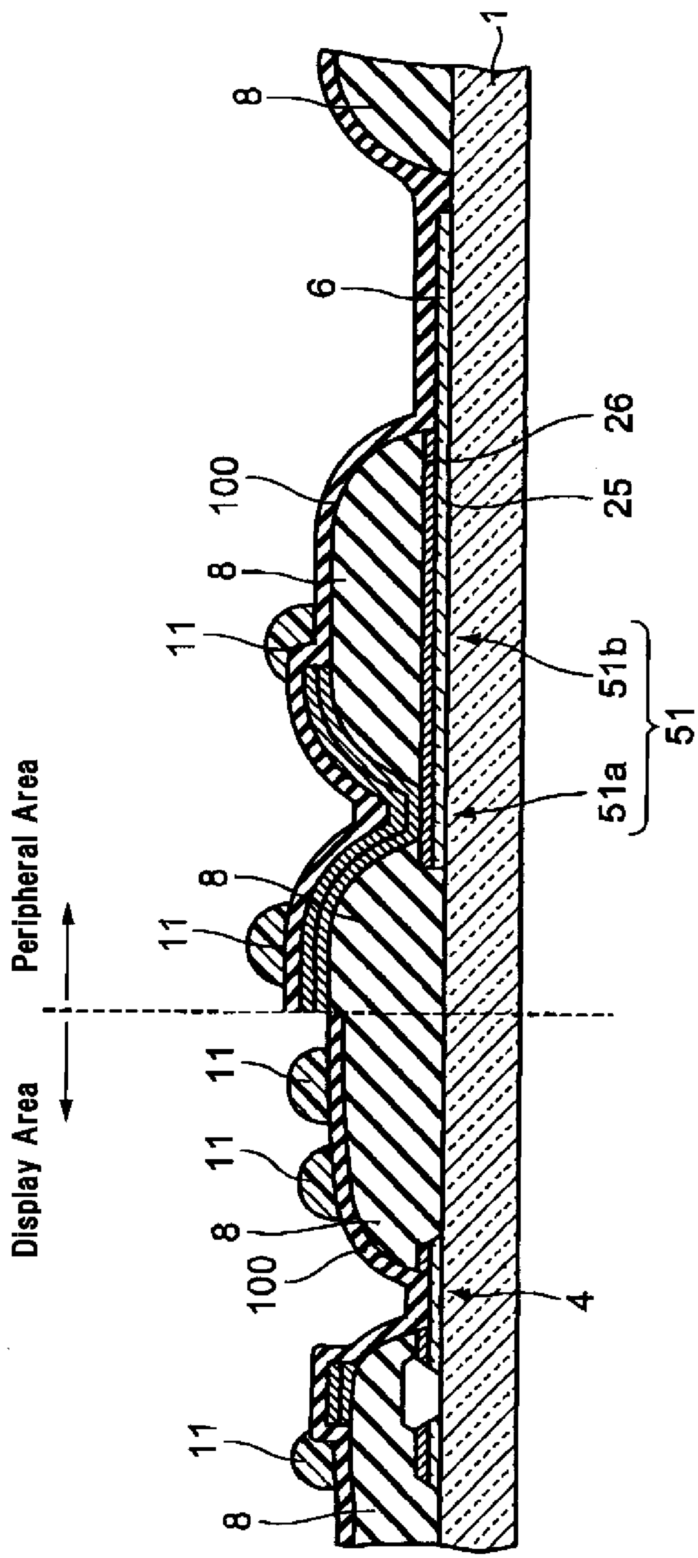
FIG. 20 is a cross-sectional view of the substrate after the projections 110' have been post-baked.

After the projections 110' are formed, the projections 110' are post-baked (see FIG. 20).

FIG. 20 is a cross-sectional view of the substrate after the projections 110' have been post-baked.

By post-baking the projections 110', the projections 110' melt and thus a dome-shaped projections 11 are formed from the substantially cylinder-shaped projections 110'. The drain electrode 4 and the gate terminal 6 shown in FIG. 20 are covered with the coating film 100, but it is noted that the drain electrode 4 is required to be electrically connected to the reflective electrode 13 described later (see FIG. 1), and that the gate terminal 6 is required to be electrically connected to a gate driver (not shown in Figures). Therefore, if the drain electrode 4 and the gate terminal 6 remain covered with the coating film 100, the drain electrode 4 and the reflective electrode 13 can not be electrically connected to each other, and the gate terminal 6 and the gate driver can not be electrically connected to each other. To circumvent such situation, after a large number of projections 11 are formed, the coating film 100 is etched using the projections 11 as etching masks (see FIG. 21) in order to expose the drain electrode 4 and the gate terminal 6.

Figure 21:
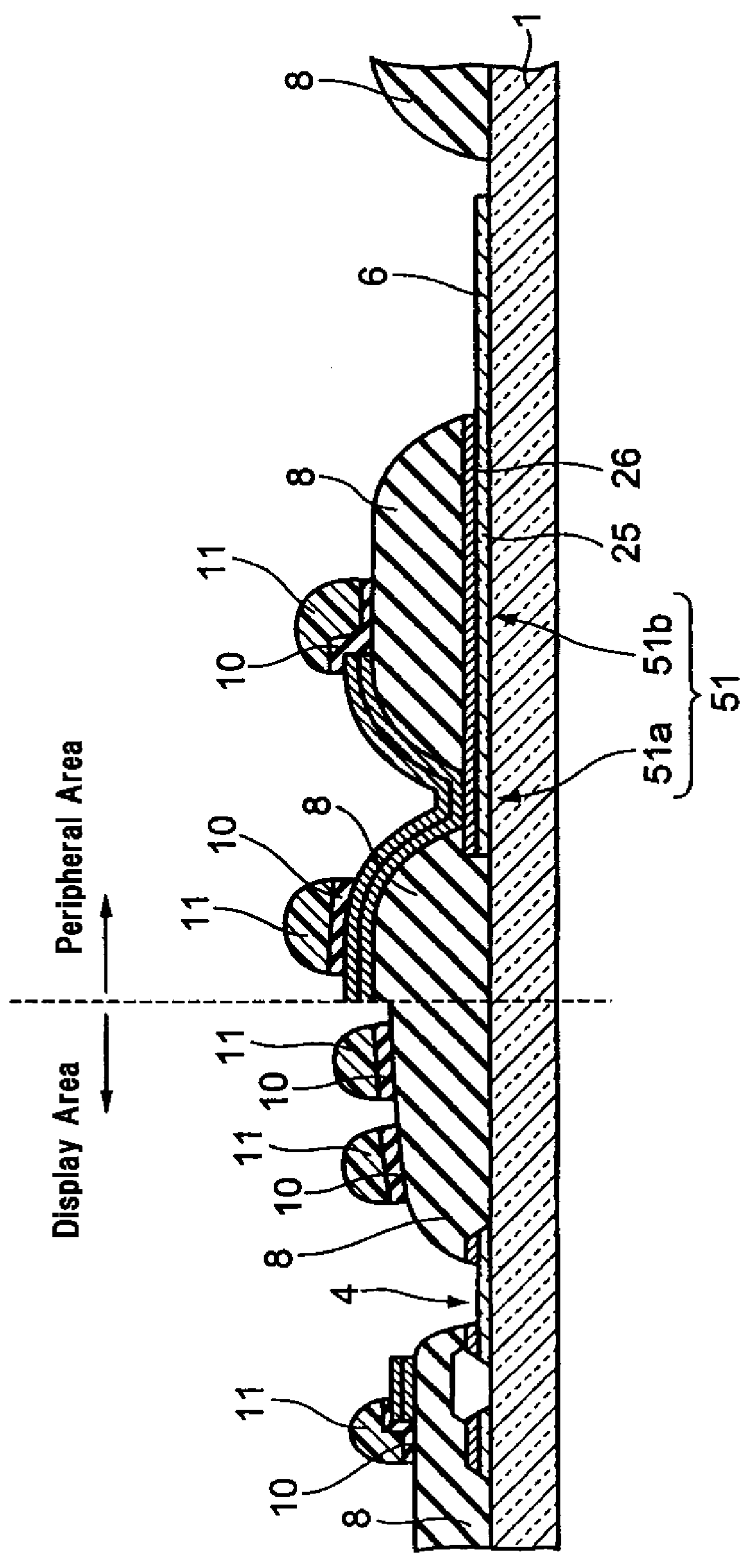
FIG. 21 is a cross-sectional view of the substrate after the coating film 100 has been etched.

FIG. 21 is a cross-sectional view of the substrate after the coating film 100 has been etched.

By etching the coating film 100 using the projections 11 as the etching masks, a film piece 10 of the coating film 100 remains under each of the projections 11, and the drain electrode 4 and the gate terminal 6 appear. Now, a thing that has to be noted is that what kind of materials must be selected as the materials of the coating film 100. When the coating film 100 is etched, the coating film 100 is generally over-etched in order not to remain residues of the coating film 100 on the drain electrode 4 and the gate terminal 6. Therefore, for example, if the material of the coating film 100 is the same material as the gate insulating film 8 existing immediately below the coating film 100, the gate insulating film 8 which should not be etched may be etched together with the coating film 100 by etching the gate insulating film 8, so that the reliability of the TFTs and others may be degraded. For this reason, a ratio of an etch rate of the material of the coating film 100 to an etch rate of the material of the gate insulating film 8 (etch selectivity) is required to be sufficiently large. If the etch selectivity is large sufficiently, the gate insulating film 8 can be hardly etched even if the coating film 100 is over-etched. If the material of the gate insulating film 8 is e.g. SiNx or $SiO_2$, the material of the coating film 100 is preferably e.g. chromium molybdenum oxide.

Figure 22:
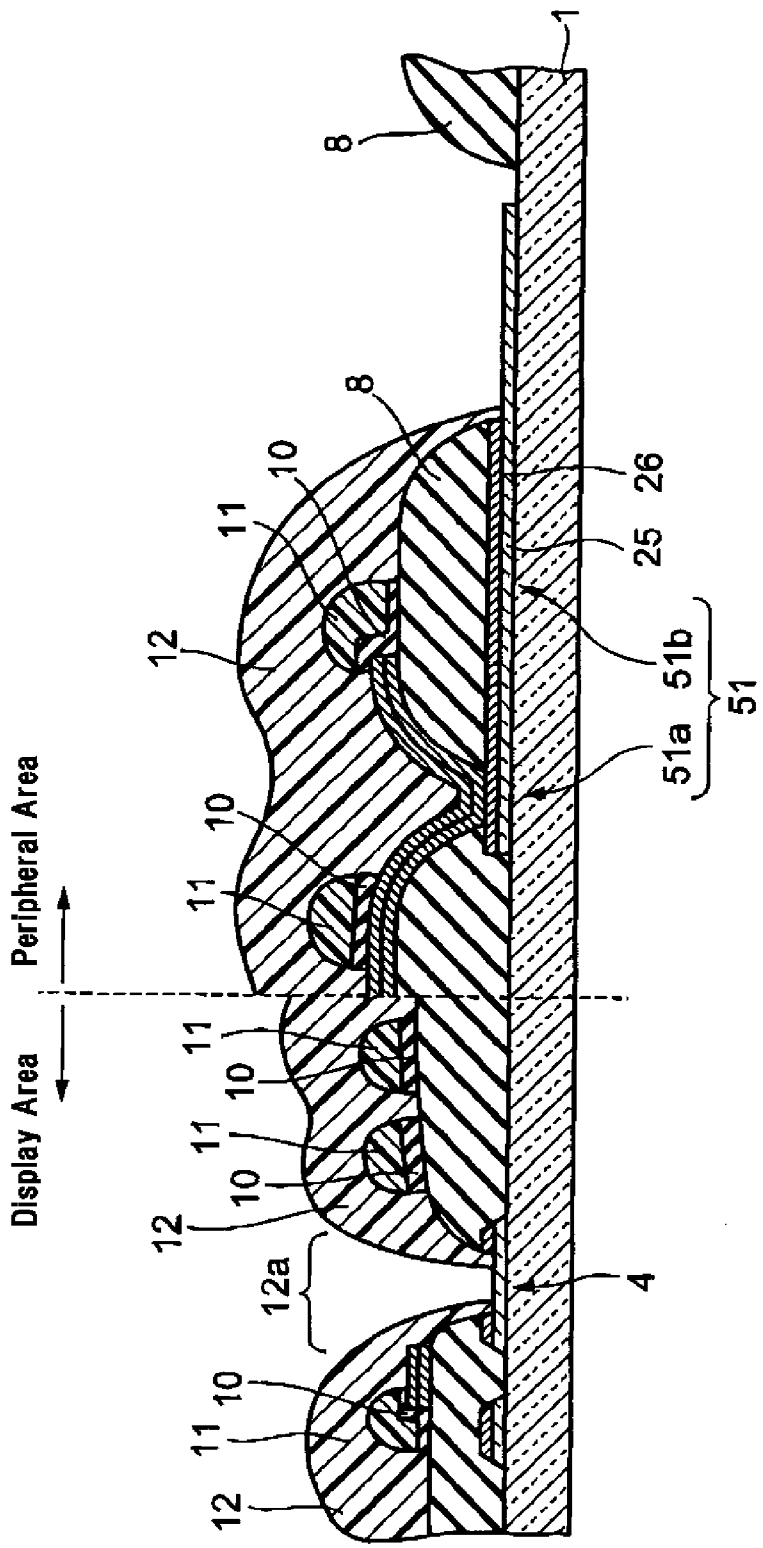
FIG. 22 is a cross-sectional view of the substrate on which the planarization film 12 has been formed.

After the coating film 100 is etched, a planarization film 12 is formed (see FIG. 22).

FIG. 22 is a cross-sectional view of the substrate on which the planarization film 12 has been formed.

The planarization film 12 comprises a hole 12*a* for exposing a part of the drain electrode 4 from the surface of the planarization film 12. Since a large number of the projections 11 are present below the planarization film 12, the surface of the planarization film 12 reflects the shape of each of the projections 11 and thus comprises a large number of projections and recesses.

After the underlying layer is formed, the reflective electrode 13 is formed within each pixel area by forming an Al film having mainly Al and then patterning the Al film (see FIGS. 1 and 2). In this way, the TFT array substrate 20 is manufactured.

As described above, since the coating film 100 is formed before the photosensitive film 110 is formed (see FIG. 17), the gate electrode 9, the gate bus main portion 510, and the gate terminal 6 are protected by the coating film 100 from the developer while the photosensitive film 110 is developed. Therefore, the occurrence of the reaction formulas (2) and (3) and the reaction formulas (5) and (6) are certainly prevented when the photosensitive film 110 is developed, so that the problem of removing the material of the projection 110' (or projection 11) more than necessary, and the problem of the higher resistance of the gate terminal 6 can be circumvented.

In the first embodiment, the coating film 100 is formed so as to cover both the MoCr film 91' and the AlCu film 92' (the films 91' and 92' form the gate electrode 9 (and the gate bus main portion 510)) in order to prevent the occurrence of the reaction formulas (2) and (3). However, it is also noted that, if only one of the MoCr film 91' and the AlCu film 92' is covered, the occurrence of the reaction formulas (2) and (3) can be prevented. In the first embodiment, the coating film 100 is formed so as to cover both the MoCr film 91' and the AlCu film 92' since it is easier to form the coating film 100 so as to cover both the MoCr film 91' and the AlCu film 92' than to form the coating film 100 so as to cover only one of them.

In the first embodiment, the coating film 100 is formed so as to cover both the gate bus main portion 510 and the gate terminal 6 in order to prevent the occurrence of the reaction formulas (5) and (6). However, it is also noted that, if only one of the gate bus main portion 510 and the gate terminal 6 is covered, the occurrence of the reaction formulas (5) and (6) can be prevented.

In the first embodiment, since the conductive film 93 has double layer structure of AlCu film 92/MoCr film 91, the gate electrode 9 and the gate bus main portion 510 also have double layer structure of AlCu film 92'/MoCr film 91'. However, the present invention can be applied even if each of the gate electrode 9 and the gate bus main portion 510 has, for example, a triple layer structure of AlCu film/MoCr film/AlCu film instead of double layer structure of AlCu film 92'/MoCr film 91'. In such case of triple layer structure, the occurrence of the reaction formulas (2), (3), (5), and (6) can be prevented by covering the triple layer structure with the coating film 100.

In the first embodiment, the example in which ITO is used as the material of the gate terminal 6 is described. However, even if e.g. IZO is used instead of ITO, the occurrence of the reaction formulas (2), (3), (5), and (6) can be prevented by using the present invention.

Embodiment 2

Figure 23:
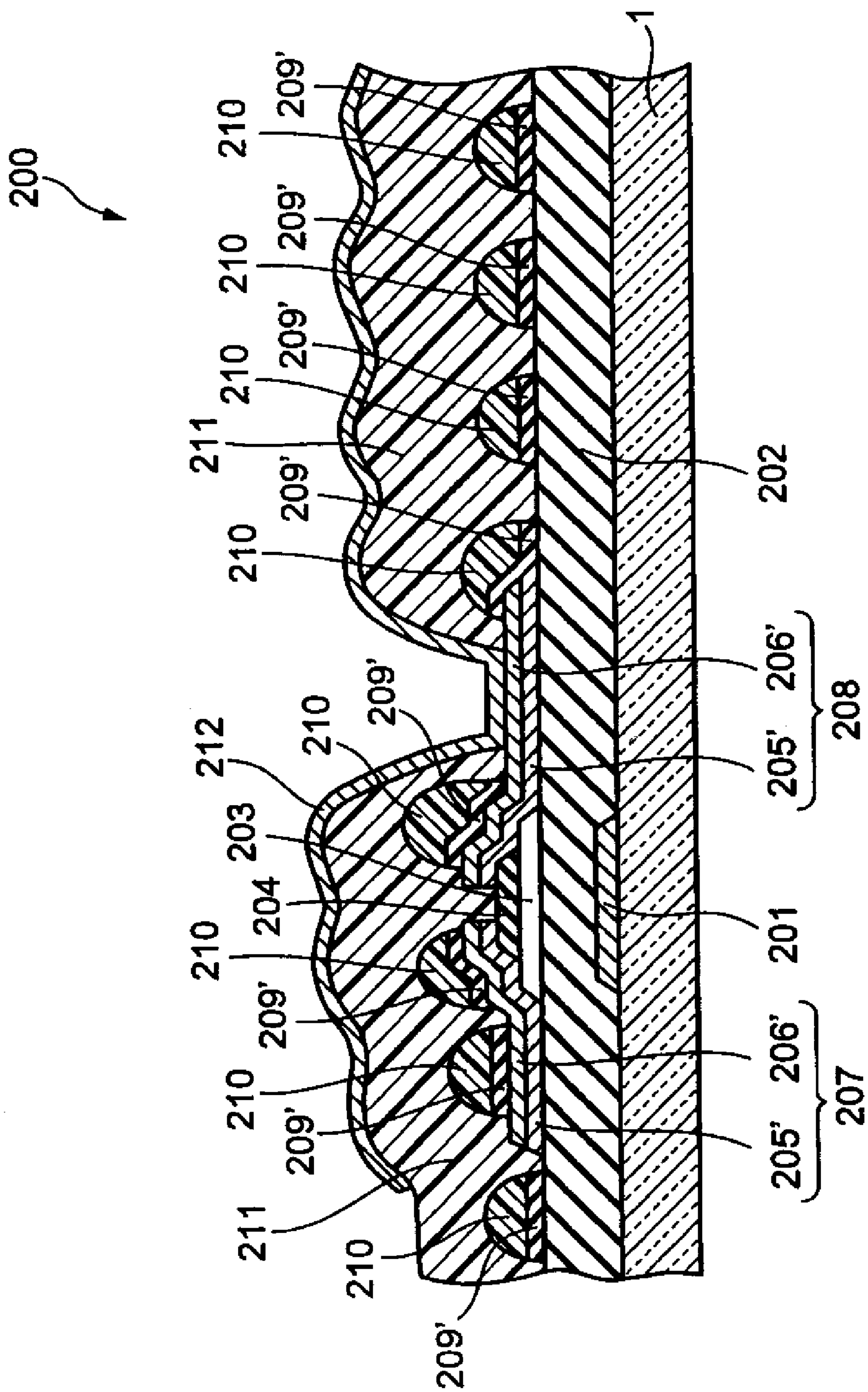
FIG. 23 is a cross-sectional view of a TFT array substrate 200 of second embodiment according to the present invention, the TFT array substrate 200 used in a reflective liquid crystal display device of bottom gate type.

FIG. 23 is a cross-sectional view of a TFT array substrate 200 of second embodiment according to the present invention, the TFT array substrate 200 used in a reflective liquid crystal display device of bottom gate type.

A method of manufacturing the TFT array substrate 200 is described below.

Figure 24:
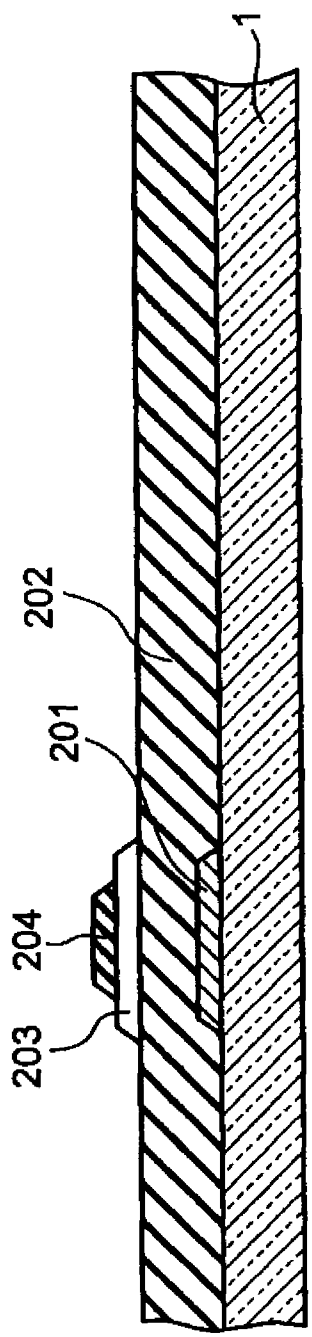
FIG. 24 is a cross-sectional view of the substrate on which the gate electrode 201, the gate insulating film 202, the a-Si layer 203 and the protective film 204 have been formed.

First, on a glass substrate 1 are formed a gate electrode 201, a gate insulating film 202, an a-Si layer 203 and a protective film 204 (see FIG. 24).

FIG. 24 is a cross-sectional view of the substrate on which the gate electrode 201, the gate insulating film 202, the a-Si layer 203 and the protective film 204 have been formed.

After the protective film 204 is formed, a conductive film is formed using material of a source electrode and others.

Figure 25:
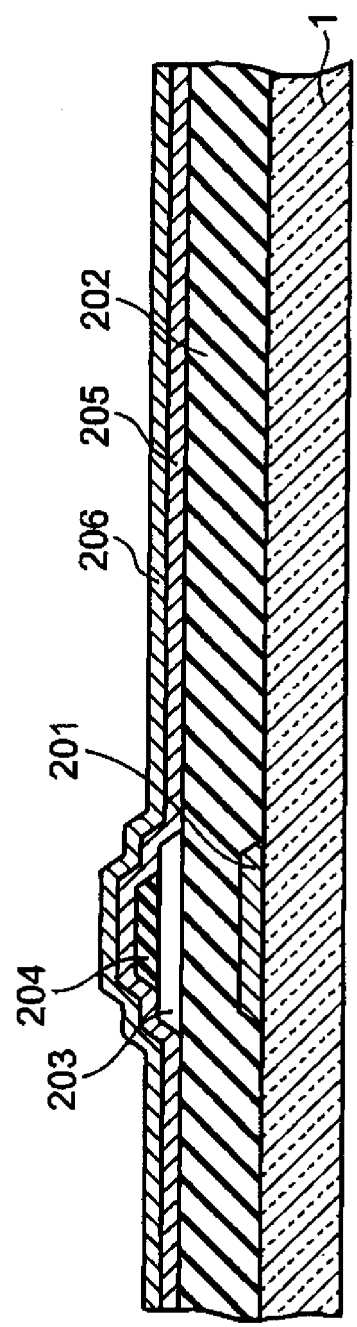
FIG. 25 is a cross-sectional view of the substrate on which the conductive film has been formed.

FIG. 25 is a cross-sectional view of the substrate on which the conductive film has been formed.

In the second embodiment, a double layer film consisting of an ITO film 205 and an MoCr film 206 is formed as the conductive film. After the ITO film 205 and the MoCr film 206 are formed, the films 205 and 206 are wet-etched.

Figure 26:
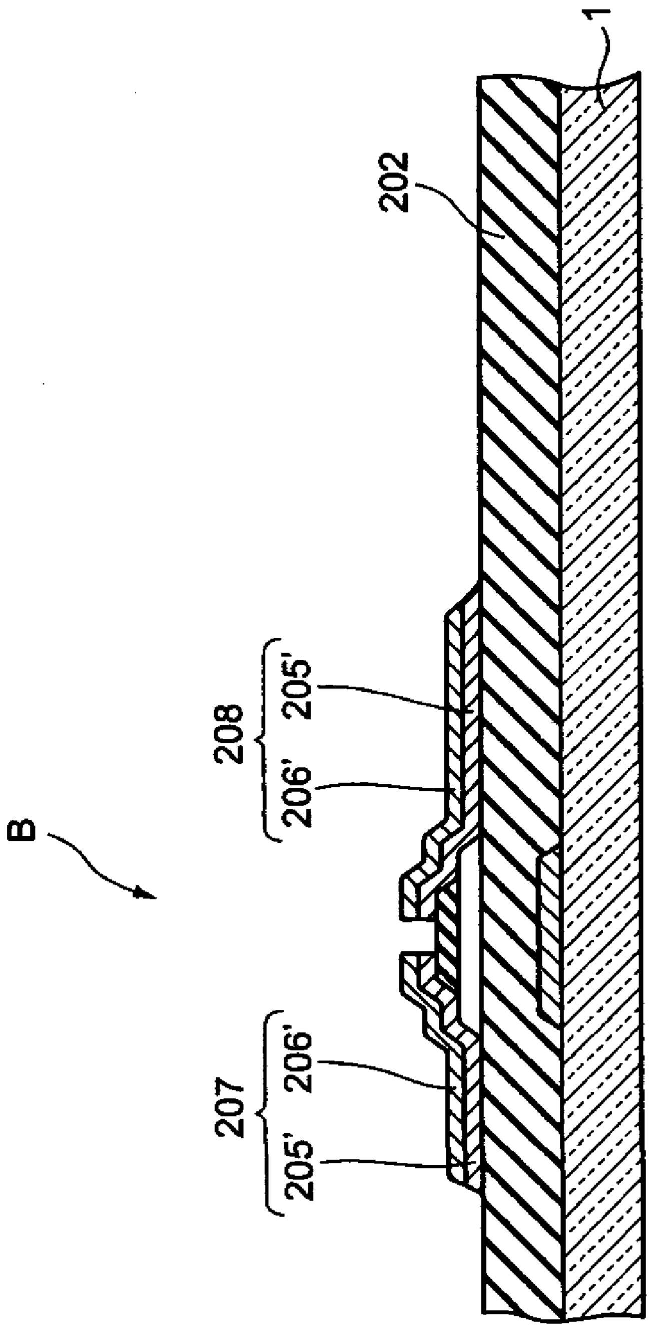
FIG. 26 is a cross-sectional view of the substrate after the ITO film 205 and the MoCr film 206 have been wet-etched.

FIG. 26 is a cross-sectional view of the substrate after the ITO film 205 and the MoCr film 206 have been wet-etched.

By continuously wet-etching the ITO film 205 and the MoCr film 206, a source electrode 207, a drain electrode 208 and a source bus (not shown) each consisting of the wet-etched ITO film 205' and MoCr film 206' are formed.

After the source electrode 207, the drain electrode 208 and others are formed, an underlying layer under a reflective electrode 212 (see FIG. 23) is formed before the reflective electrode 212 is formed. However, if the underlying layer is formed in the conventional way, the ITO film 205' and the MoCr film 206' become immersed in the developer while photosensitive resin of material of the underlying layer is developed. As a result of this, it is considered that a cell reaction represented below occurs.

$$Mo \rightarrow Mo^{3+} + 3e- \quad (7)$$

$$In_2O_3 + 6H^+ + 6e- \rightarrow 2In + 3H_2O \quad (8)$$

Since the equilibrium electrode potential of Mo is smaller than the equilibrium electrode potential of $In_2O_3$ (see equation (4)), it is considered that, at the side of the MoCr film 206', the reaction formula (7) representing the emission of electrons (e−) occurs on a priority base. If the reaction represented by the reaction formula (7) occurs, $Mo^{3+}$ is generated and electrons (e−) are generated. It is considered that since some of the generated electrons arrive at the ITO film 205' from the MoCr film 206', a chemical reaction as shown in the reaction formula (8) occurs in the ITO film 205' and thus In (Indium) is generated. Such generated In (Indium) causes the higher resistance of the ITO film 205', so that there exist a problem of causing the higher resistance of the source electrode 207 and the drain electrode 208.

To solve this problem in the second embodiment, after the source electrode 207, the drain electrode 208 and others are formed and before the photosensitive resin is applied, a coating film is formed as in the case of the first embodiment.

Figure 27:
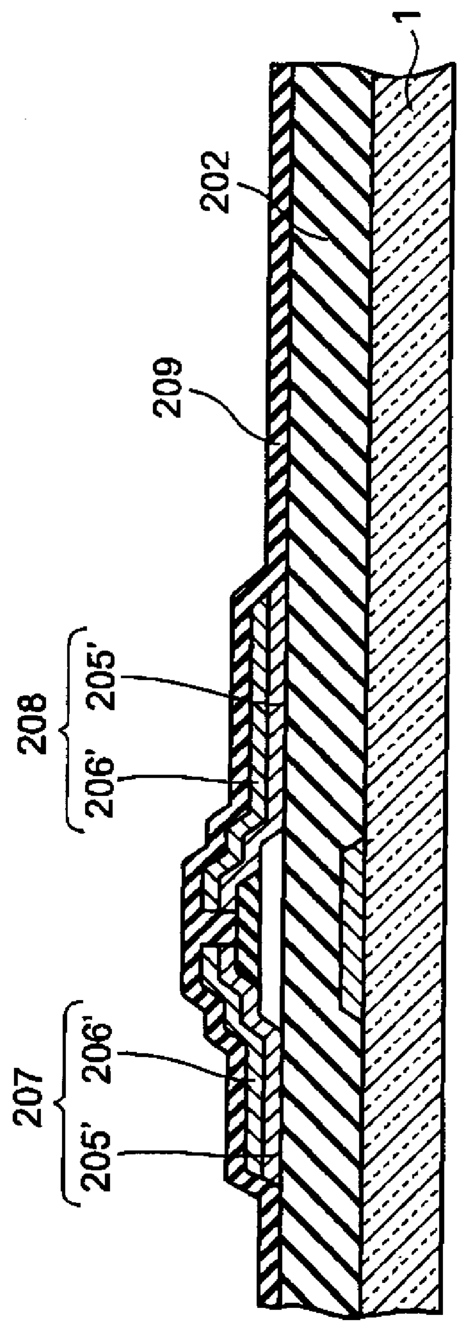
FIG. 27 is a cross-sectional view of the substrate on which a coating film 209 has been formed.

FIG. 27 is a cross-sectional view of the substrate on which a coating film 209 has been formed.

If the material of the gate insulating film 202 is SiNx or $SiO_2$, the material of the coating film 209 is preferably, e.g. chromium molybdenum oxide. After the coating film 209 is formed, a large number of projections are formed in the same manner as described with respect to FIGS. 18 to 20 (see FIG. 28).

Figure 28:
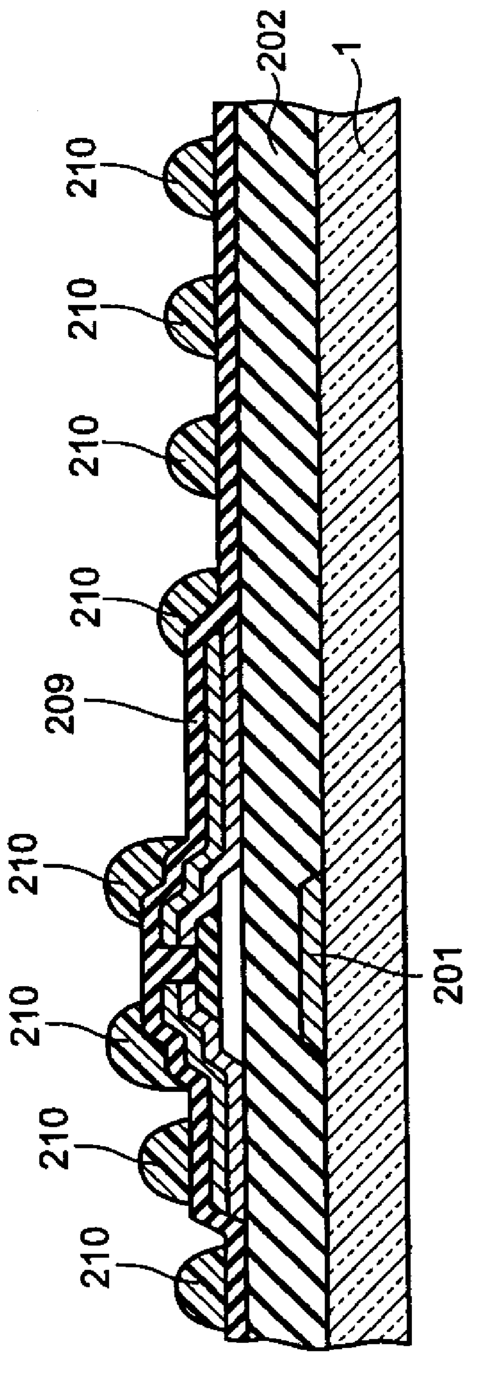
FIG. 28 is a cross-sectional view of the substrate on which a large number of projections 210 have been formed.

FIG. 28 is a cross-sectional view of the substrate on which a large number of projections 210 have been formed.

After a large number of projections 210 are formed, the coating film 209 is etched using a large number of projections

210 as etching masks. By this etching step, a piece 209' of the coating film 209 remain under each of the projections 210 as shown in FIG. 23. After the coating film 209 is etched, a planarization film 211 is formed (see FIG. 23) and then a reflective electrode 212 is formed (see FIG. 23). In this way, the TFT array substrate 200 is manufactured.

In the second embodiment, since the coating film 209 is formed before the photosensitive resin of the material of the projections 210 is applied, the MoCr film 206' and the ITO film 205' are certainly prevented from being immersed in the developer while the photosensitive resin of the material of the projections 210 is developed. Therefore, the reactions represented by the reaction formulas (7) and (8) do not occur, so that the ITO film 205' is prevented from being damaged. As a result of this, the source electrode 207, the drain electrode 208, and the source bus (not shown) can have lower resistance.

In the second embodiment, the coating film 209 is formed so as to cover both the ITO film 205' and the MoCr film 206' (the films 205' and 206' form the source electrode 207 and others) in order to prevent the occurrence of the reaction formulas (7) and (8). However, it is also noted that, if only one of the ITO film 205' and the MoCr film 206' is covered, the occurrence of the reaction formulas (7) and (8) can be prevented. In the second embodiment, the coating film 209 is formed so as to cover both the ITO film 205' and the MoCr film 206' since it is easier to form the coating film 209 so as to cover both the ITO film 205' and the MoCr film 206' than to form the coating film 209 so as to cover only one of them.

Embodiment 3

Figure 29:
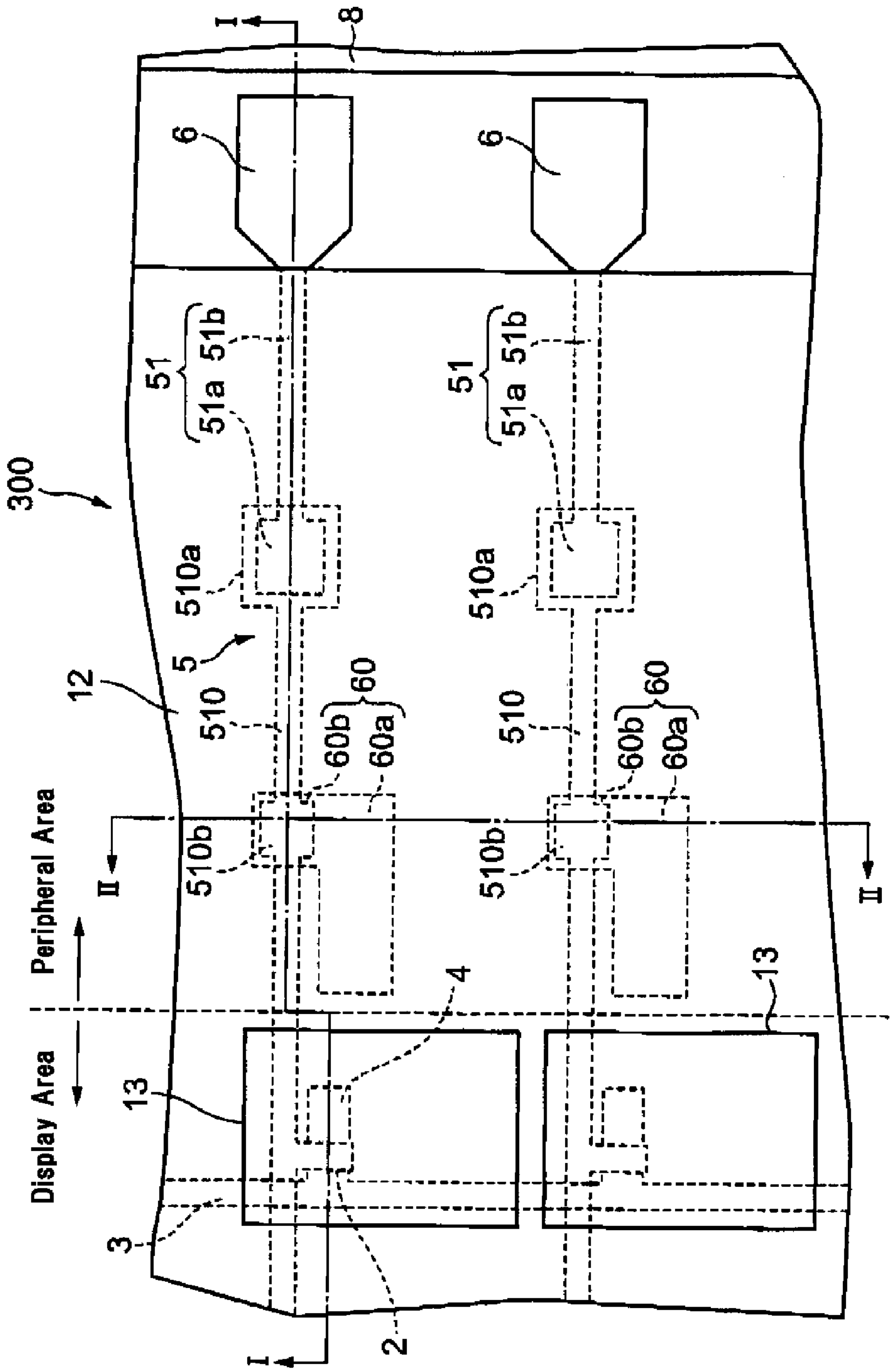
FIG. 29 is a plan view of a part of a TFT array substrate 300 of a third embodiment according to the present invention, the TFT array substrate 300 used in a reflective liquid crystal display device of top gate type.
Figure 30:
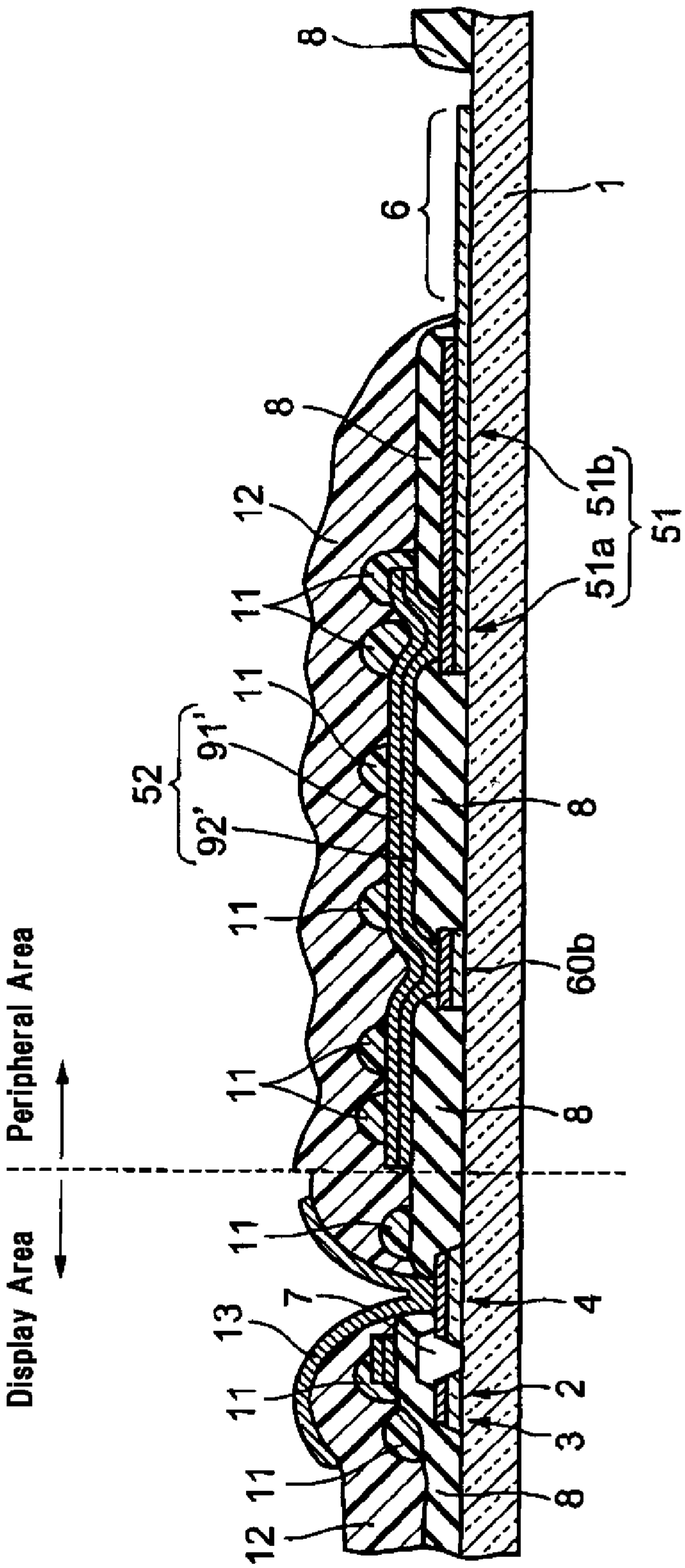
FIG. 30 is a cross-sectional view of the substrate 300, viewed in I-I direction shown in FIG. 29.
Figure 31:
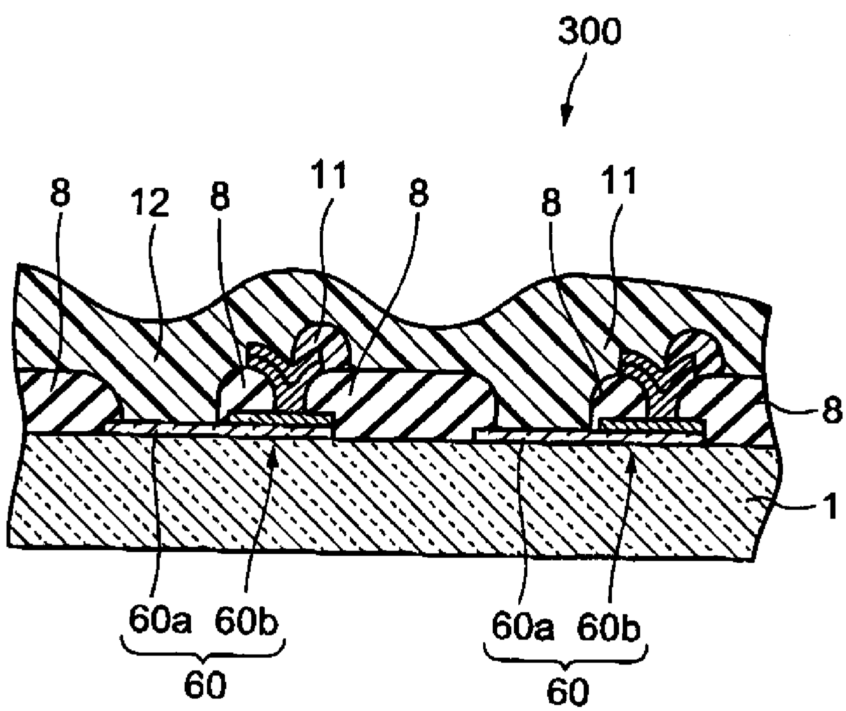
FIG. 31 is a cross-sectional view of the substrate 300, viewed in II-II direction shown in FIG. 29.

FIG. 29 is a plan view of a part of a TFT array substrate 300 of a third embodiment according to the present invention, the TFT array substrate 300 used in a reflective liquid crystal display device of top gate type. FIG. 30 is a cross-sectional view of the substrate 300, viewed in I-I direction shown in FIG. 29. FIG. 31 is a cross-sectional view of the substrate 300, viewed in II-II direction shown in FIG. 29.

The left side of FIG. 29 is a display area in which TFTs, reflective electrodes 13 and others are formed. The right side of FIG. 29 is a peripheral area in which gate terminals 6 are formed. It is noted that, for the sake of convenience, the display area and the peripheral area are schematically illustrated.

A method of manufacturing the TFT array substrate 300 is described below.

Figure 32:
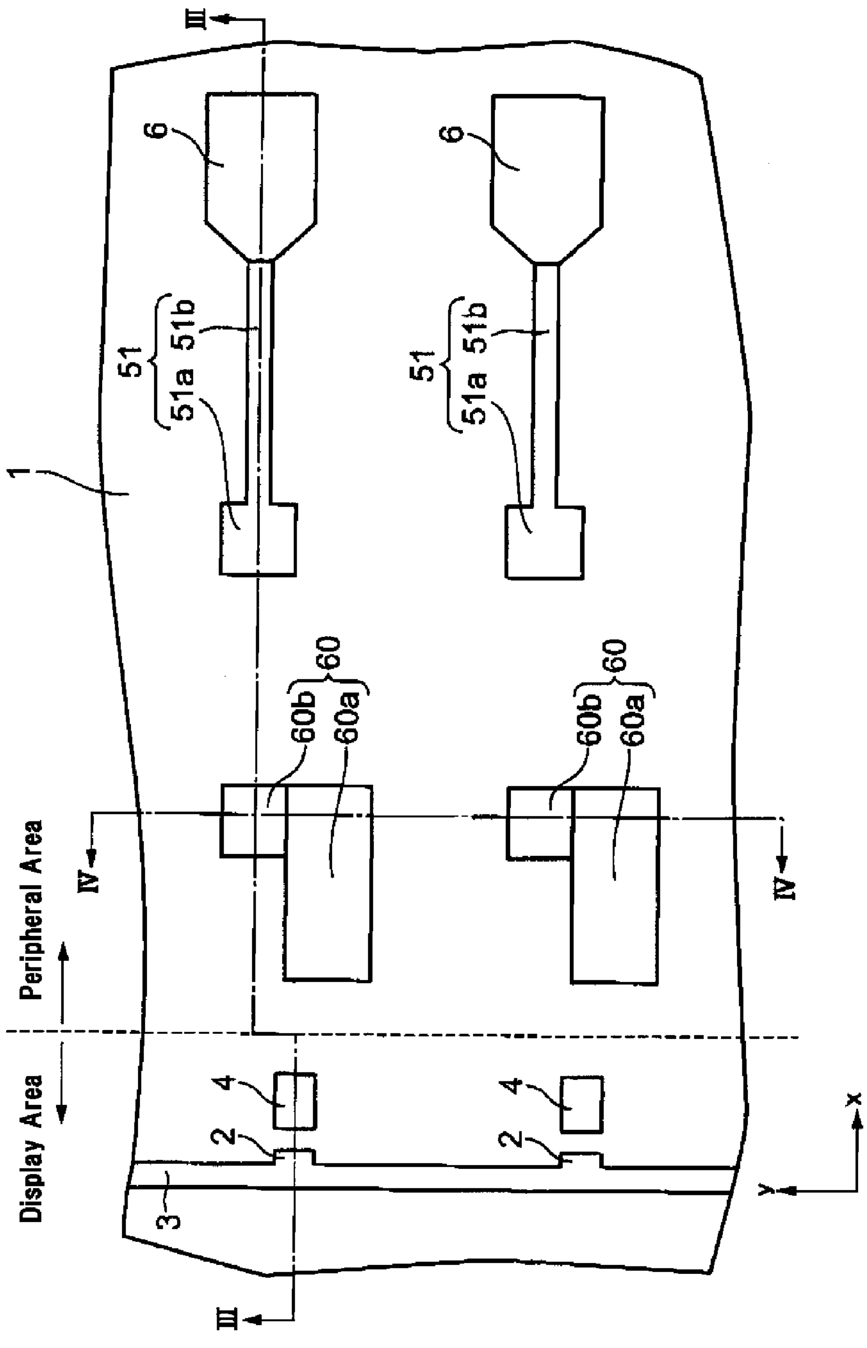
FIG. 32 is a plan view of a part of the substrate on which the gate bus end portions 51, the sacrificial electrodes 60 and others have been formed.

First, on a glass substrate 1 are formed source electrodes 2, source buses 3, drain electrodes 4, gate bus end portions 51, gate terminals 6 and sacrificial electrodes (see FIG. 32).

Figure 33:
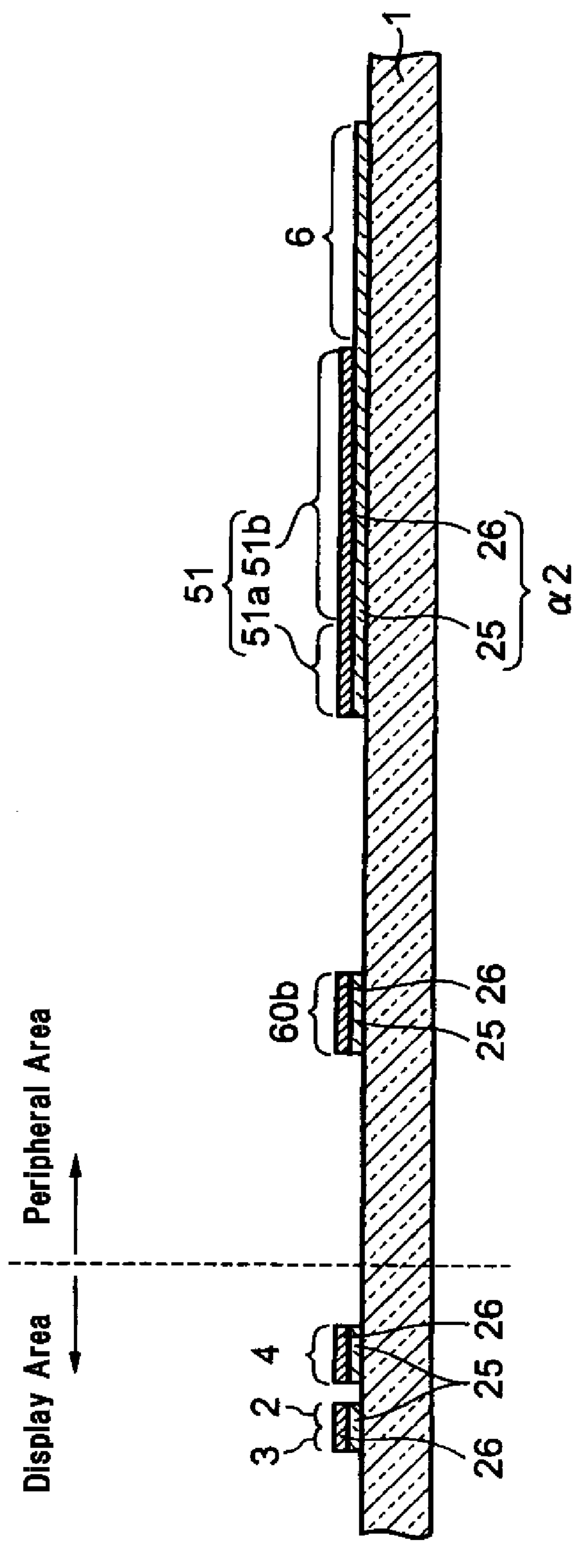
FIG. 33 is a cross-sectional view of the substrate, viewed in III-III direction shown in FIG. 32.
Figure 34:
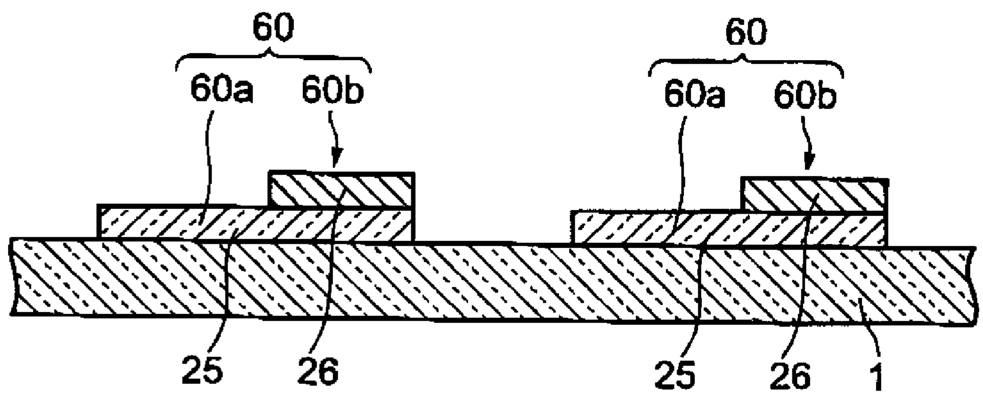
FIG. 34 is a cross-sectional view of the substrate, viewed in IV-IV direction shown in FIG. 32.

FIG. 32 is a plan view of a part of the substrate on which the gate bus end portions 51, the sacrificial electrodes 60 and others have been formed. FIG. 33 is a cross-sectional view of the substrate, viewed in III-III direction shown in FIG. 32. FIG. 34 is a cross-sectional view of the substrate, viewed in IV-IV direction shown in FIG. 32.

As shown in FIG. 32, formed on the display area are the source electrode 2, the source bus 3, and drain electrode 4. The source bus 3 is formed so as to extend in a y direction. The source electrode 2 is formed so as to be continuous with the source bus 3. Formed on the peripheral area are the gate bus end portion 51, the gate terminal 6 and the sacrificial electrode 60. The gate bus end portion 51 comprises a connection portion 51*a* and an extending portion 51*b*. The connection portion 51*a* is directly connected to a gate bus main portion 510 described later (see FIGS. 40 and 41). The extending portion 51*b* extends from the connection portion 51*a* to the gate terminal 6. The sacrificial electrode 60 comprises a sacrificial electrode main portion 60*a* and a sacrificial electrode connection portion 60*b*. The connection portion 60*b* is connected to the gate bus main portion 510 described later. The sacrificial electrode 60 is formed nearer the display area than the gate bus terminal 6 is formed. The sacrificial electrode 60 itself dose not contribute to the circuit operation of the TFT array substrate 300. However, the sacrificial electrode 60 has a role of preventing the gate terminal 6 from being damaged during the manufacture of the TFT array substrate 300. It is described later how the sacrificial electrode 60 prevents the gate terminal 6 from being damaged during the manufacture of the TFT array substrate 300.

As shown in FIG. 33, the source electrode 2, the source bus 3, the drain electrode 4, and the gate bus end portion 51 are double layer structure consisting of an ITO portion 25 and a MoCr portion 26. The ITO portion 25 contains ITO and the MoCr portion 26 contains MoCr. In case where the gate bus end portion 51 and others are the double layer structure consisting of the ITO portion 25 and the MoCr portion 26 instead of a single layer structure of the ITO portion 25, the gate bus end portion 51 and others can have lower resistance. The connection portion 51*a* of the gate bus end portion 51 is the double layer structure consisting of the ITO portion 25 and the MoCr portion 26 in this embodiment, but may be a single layer structure of only ITO portion 25. Even if the connection portion 51*b* of the gate bus end portion 51 is the single layer structure of only ITO portion 25, the gate bus end portion 51 itself can have the lower resistance under the condition that the extending portion 51*b* of the gate bus end portion 51 is the double layer structure consisting of the ITO portion 25 and the MoCr portion 26. However, the gate bus end portion 51 and others may be the single layer structure of only ITO portion 25 as long as the gate bus end portion 51 and others can have the sufficient lower resistance.

Further as shown in FIG. 34, as to the sacrificial electrode 60, only sacrificial electrode connection portion 60*b* is the double layer structure consisting of an ITO portion 25 and a MoCr portion 26, and the sacrificial electrode main portion 60*a* consists of only ITO portion 25. The gate terminal 6 consists of only ITO portion 25.

Figure 35:
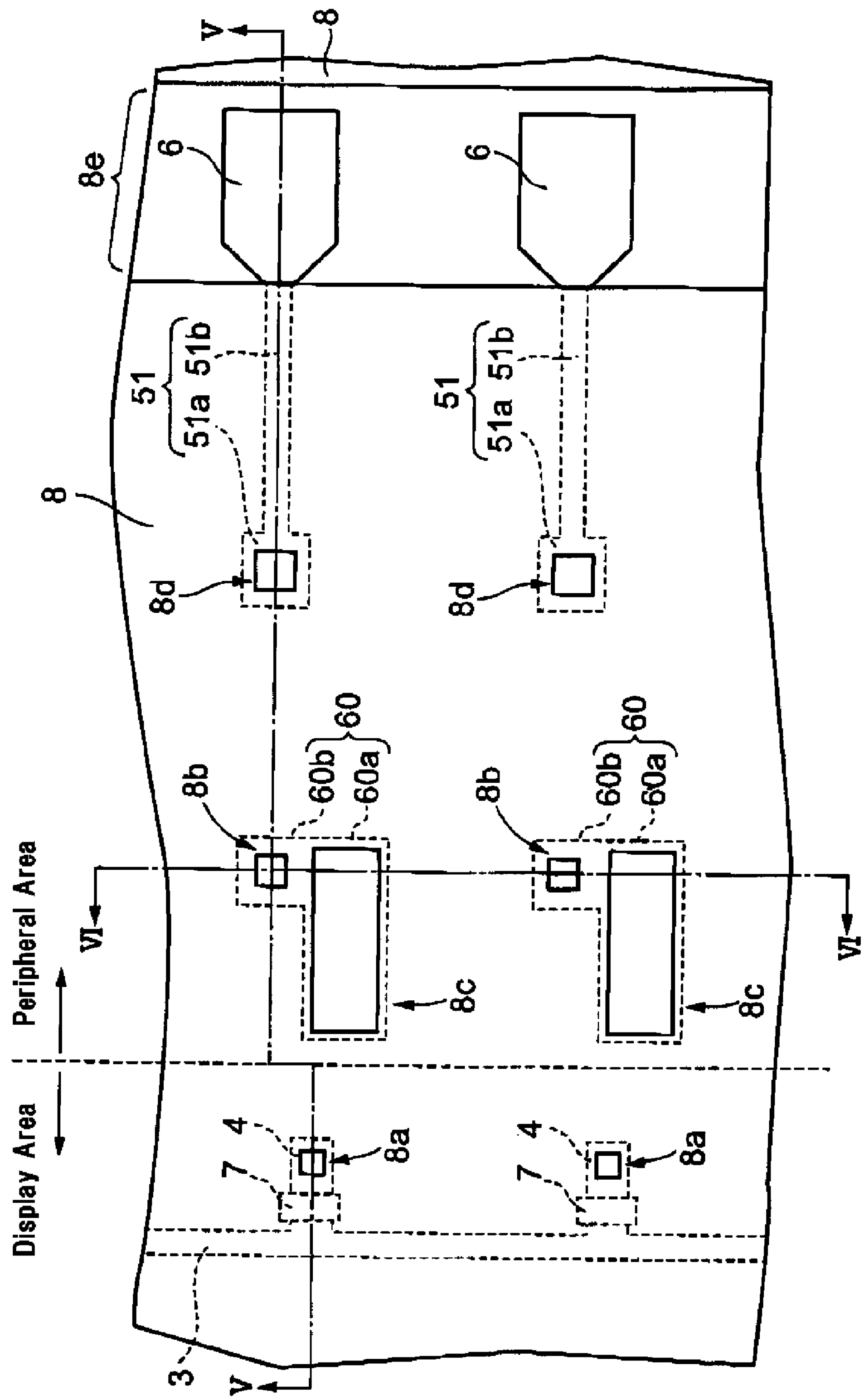
FIG. 35 is a plan view of a part of the substrate on which the a-Si layer 7 and the gate insulating film 8 have been formed.
Figure 36:
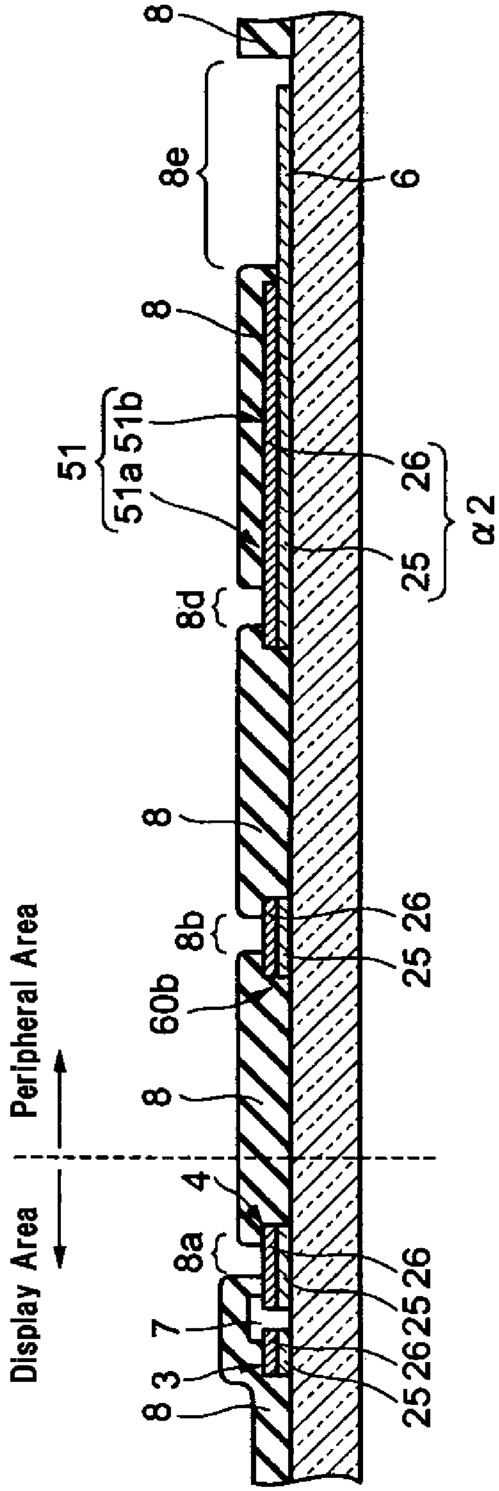
FIG. 36 is a cross-sectional view of the substrate, viewed in V-V direction shown in FIG. 35.
Figure 37:
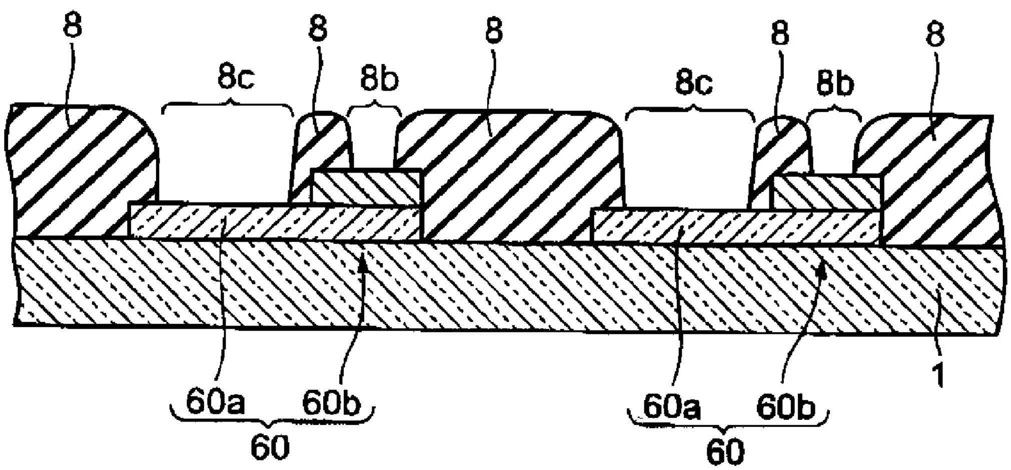
FIG. 37 is a cross-sectional view of the substrate, viewed in VI-VI direction shown in FIG. 35.

After the sacrificial electrode 60 and others are formed, an a-Si layer and a gate insulating film are formed (see FIGS. 35 to 37).

FIG. 35 is a plan view of a part of the substrate on which the a-Si layer 7 and the gate insulating film 8 have been formed. FIG. 36 is a cross-sectional view of the substrate, viewed in V-V direction shown in FIG. 35. FIG. 37 is a cross-sectional view of the substrate, viewed in VI-VI direction shown in FIG. 35.

After the a-Si layer 7 is formed, the gate insulating film 8 is formed on the substrate 1 on which the a-Si layer 7 has been formed. The gate insulating film 8 is patterned so as to comprise holes 8*a*, 8*b*, 8*c*, 8*d* and 8*e*. The hole 8*a* is to expose the drain electrode 4 from the surface of the gate insulating film 8. The hole 8*b* is to expose the sacrificial electrode connection portion 60*b* from the surface of the gate insulating film 8. The hole 8*c* is to expose the sacrificial electrode main portion 60*a* from the surface of the gate insulating film 8. The hole 8*d* is to expose the connection portion 51*a* of the gate bus end portion 51 from the surface of the gate insulating film 8. The hole 8*e* is to expose the gate terminal 6 from the surface of the gate insulating film 8.

Figure 38:
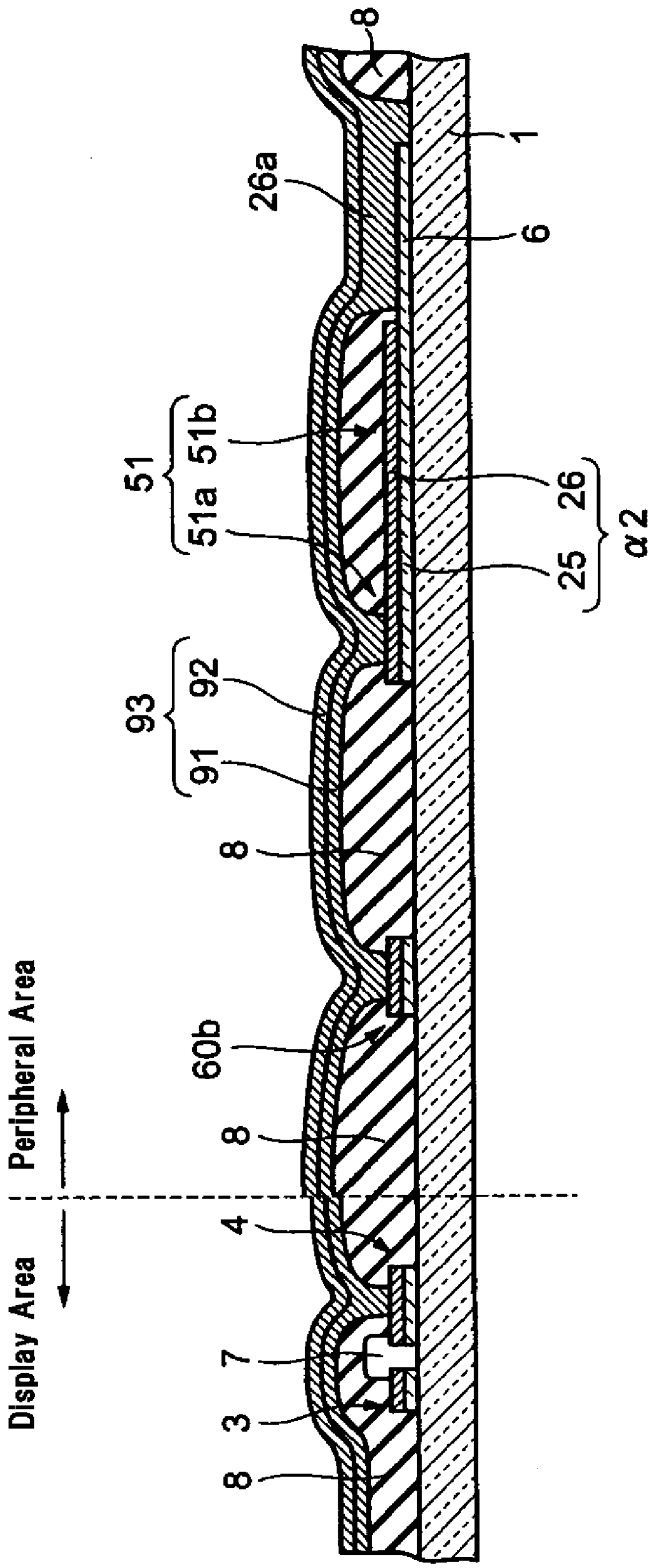
FIG. 38 is cross-sectional view of the substrate on which the conductive film 93 has been formed.
Figure 39:
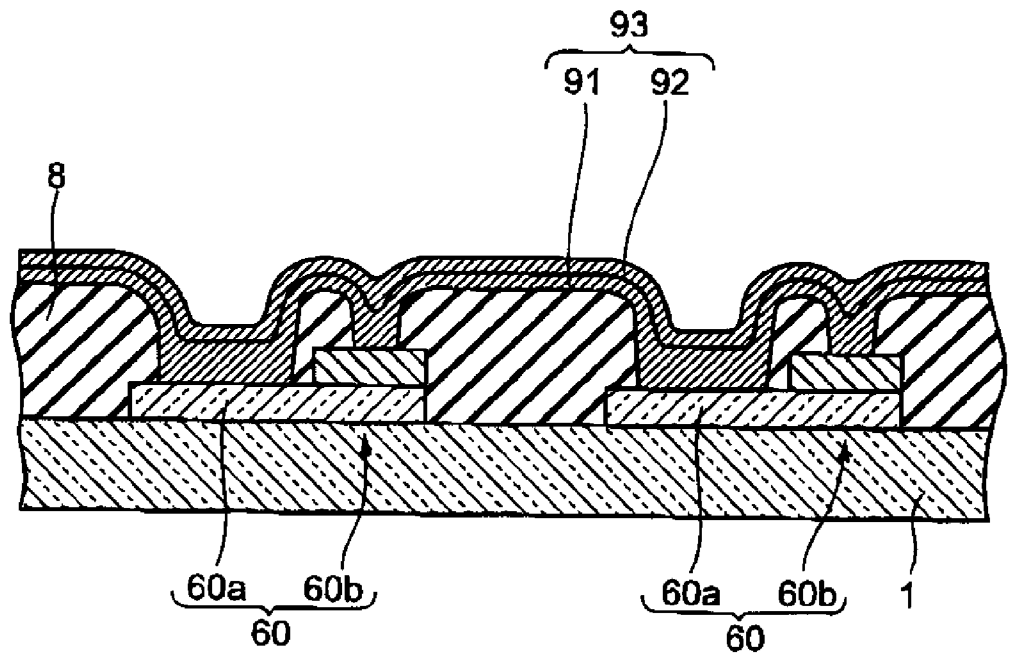
FIG. 39 is cross-sectional view of the substrate on which the conductive film 93 has been formed.

After the gate insulating film 8 comprising such holes 8*a* to 8*e* is formed, a conductive film is formed using material of gate electrode and gate bus main portion (see FIGS. 38 and 39).

FIGS. 38 and 39 are cross-sectional views of the substrate on which the conductive film 93 has been formed. FIGS. 38 and 39 are cross-sectional views corresponding to FIGS. 36 and 37, respectively.

The conductive film 93 consists of a MoCr film 91 and an AlCu film 92. The MoCr film 91 is formed using material which has mainly Mo and has added Cr. The AlCu film 92 is formed using material which has mainly Al and has added Cu. After the MoCr film 91 and the AlCu film 92 are formed, the films 91 and 92 are wet-etched (see FIGS. 40 to 42).

Figure 40:
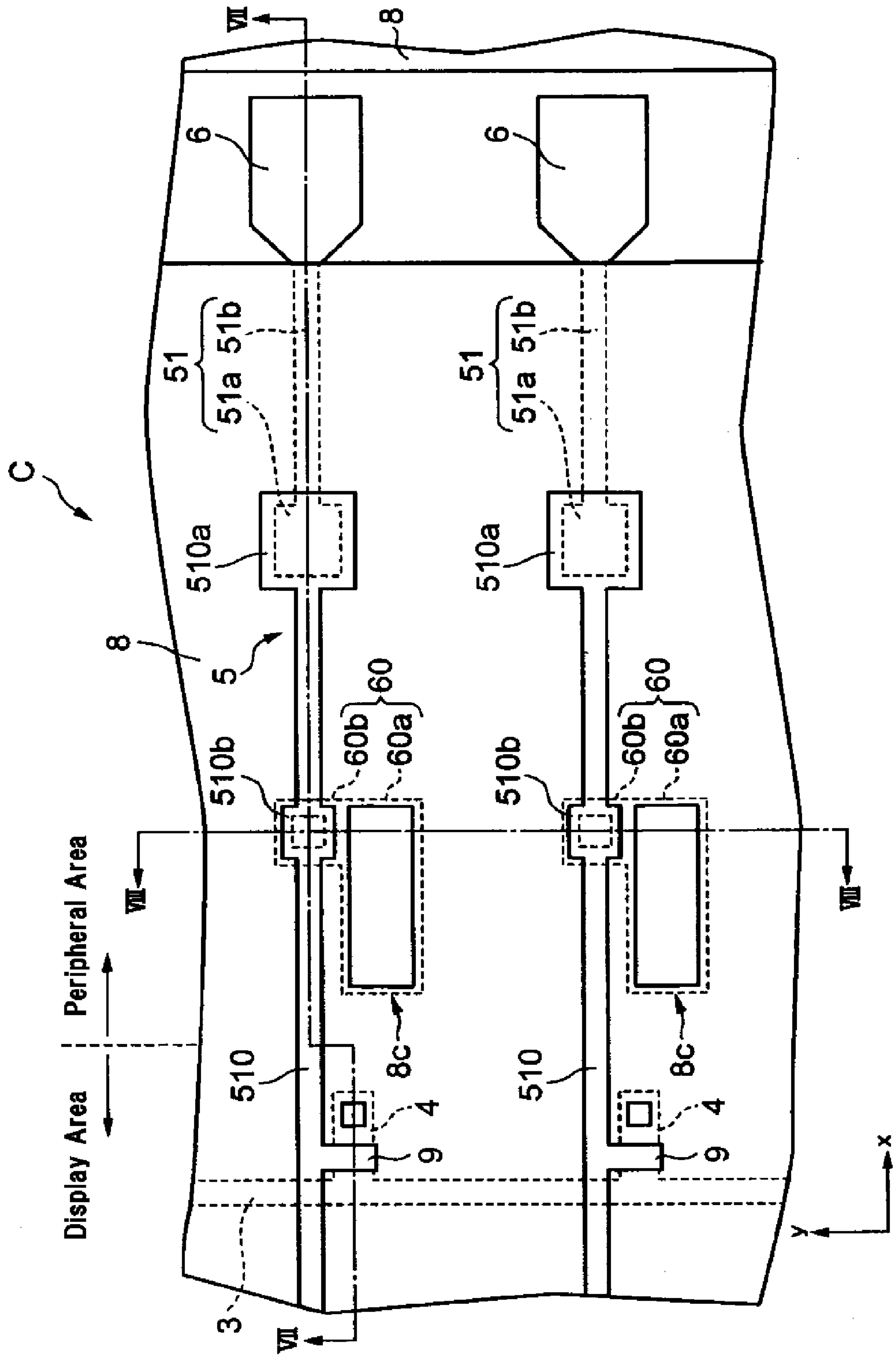
FIG. 40 is a plan view of a part of the substrate after the MoCr film 91 and the AlCu film 92 have been wet-etched.
Figure 41:
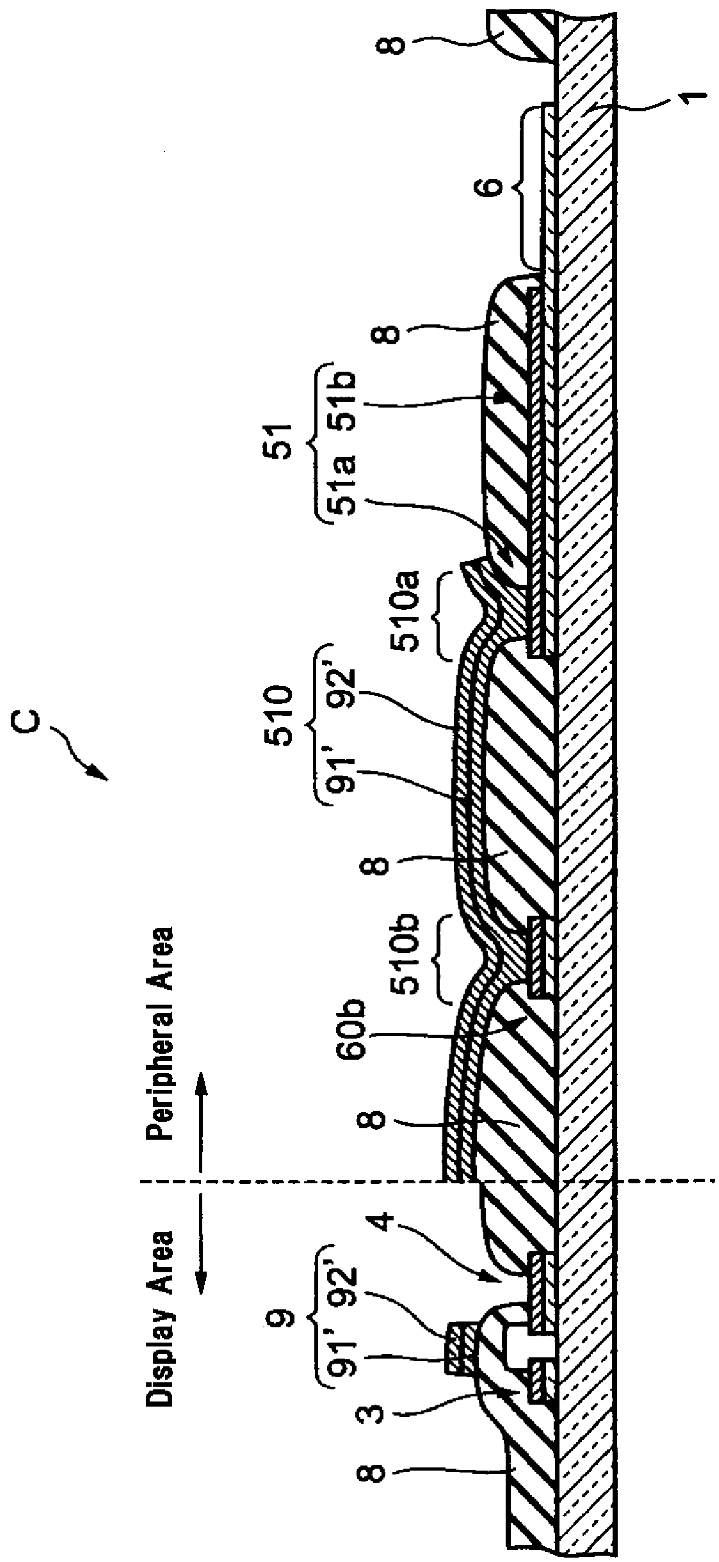
FIG. 41 is a cross-sectional view of the substrate, viewed in VII-VII direction shown in FIG. 40.
Figure 42:
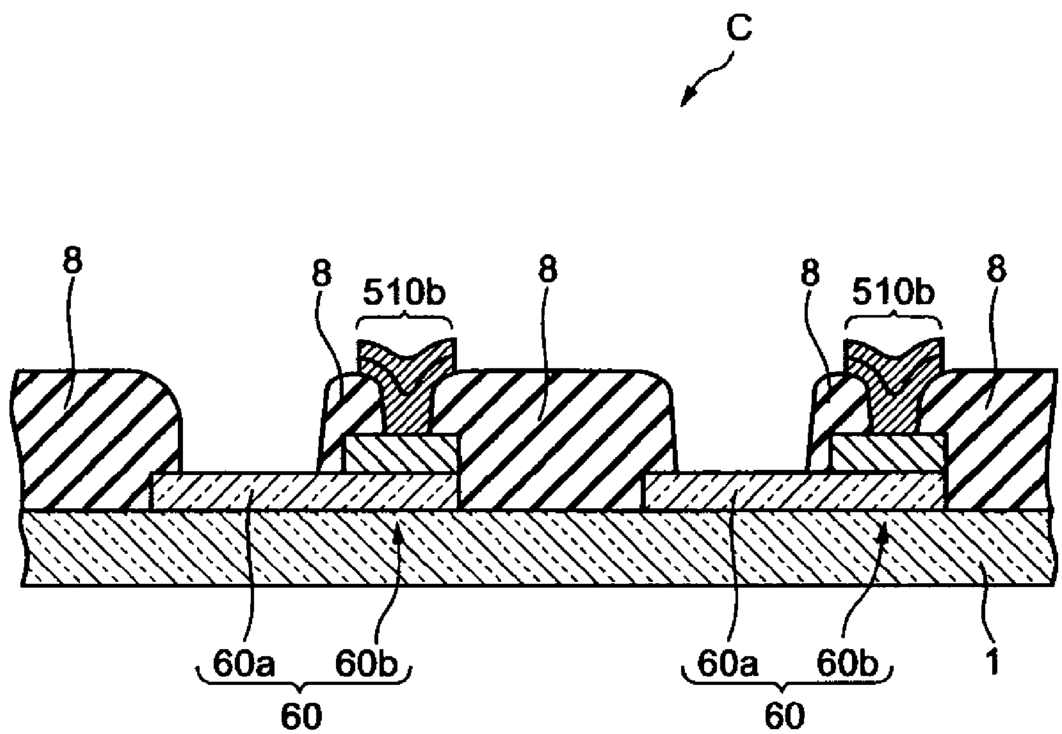
FIG. 42 is a cross-sectional view of the substrate, viewed in VIII-VIII direction shown in FIG. 40.

FIG. 40 is a plan view of a part of the substrate after the MoCr film 91 and the AlCu film 92 have been wet-etched. FIG. 41 is a cross-sectional view of the substrate, viewed in VII-VII direction shown in FIG. 40. FIG. 42 is a cross-sectional view of the substrate, viewed in VIII-VIII direction shown in FIG. 40.

By continuously wet-etching the AlCu film 92 and the MoCr film 91, the gate electrode 9 and the gate bus main portion 510 are formed as shown in FIG. 41, the gate electrode 9 and the gate bus main portion 510 each comprising double layer structure consisting of a MoCr film 91' and the AlCu film 92'. The gate bus main portion 510 is formed so as to extend in the x direction as shown in FIG. 40. An end terminal 510*a* of the gate bus main portion 510 is connected to the connection portion 51*a* of the gate bus end portion 51 via the hole 8*d* (see FIG. 36) of the gate insulating film 8. The gate bus 5 consists of the combination of the gate bus end portion 51 and the gate bus main portion 510. The gate bus main portion 510 comprises a wider portion 510*b* having a wider width between the end terminal 510*a* and the display area. The wider portion 510*b* is connected to the sacrificial electrode connection portion 60*b* via the hole 8*b* (see FIG. 36) of the gate insulating film 8. The gate electrode 9 is formed so as to be continuous with the gate bus main portion 510.

Further, by wet-etching the AlCu film 92 and the MoCr film 91, the gate terminal 6 and the sacrificial electrode main portion 60*a* appear.

After the gate electrode 9 and the gate bus main portion 510 are formed, projections 11 (see FIG. 43) of the underlying layer under the reflective electrode 13 are formed.

Figure 43:
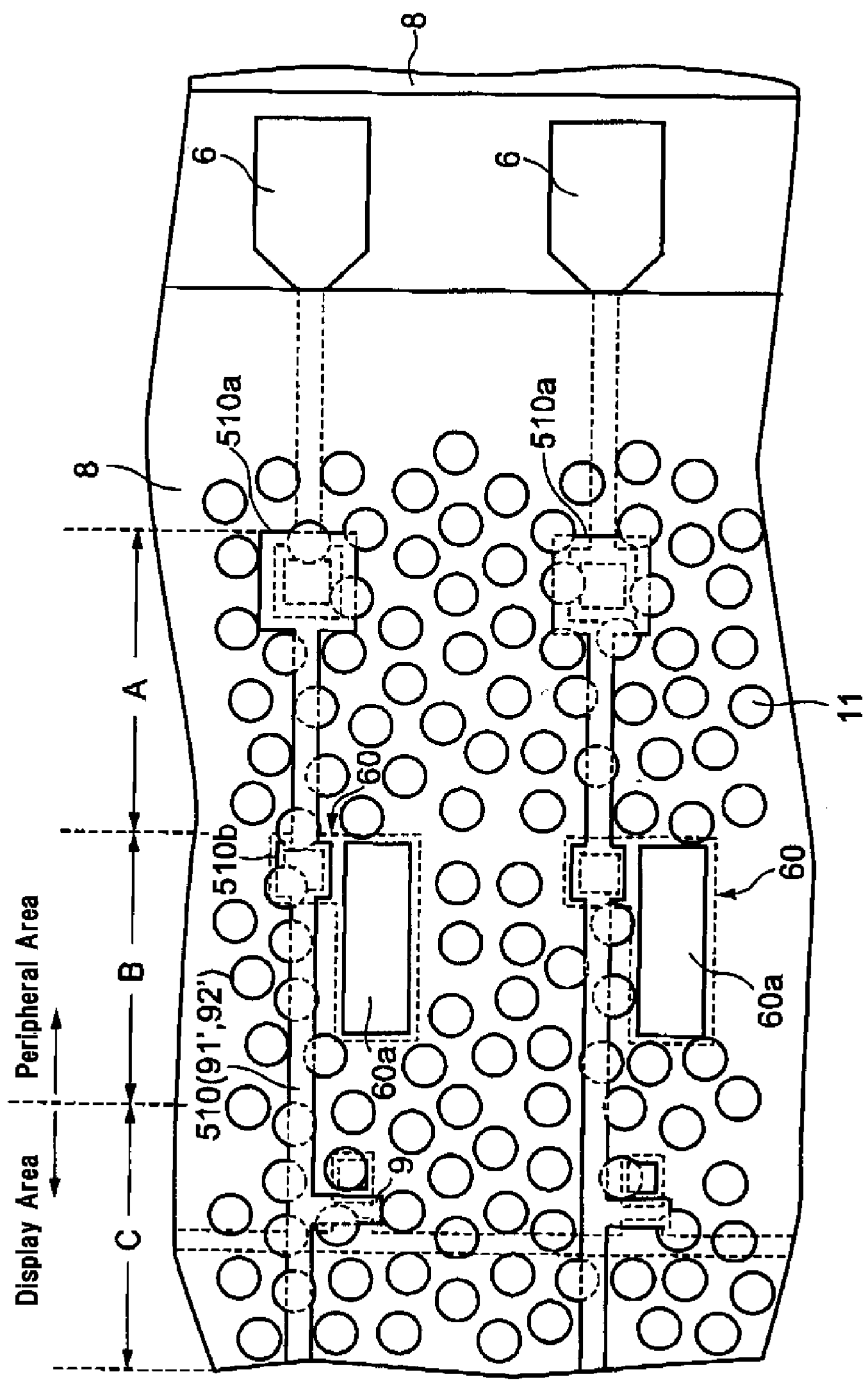
FIG. 43 is a plan view of a part of the substrate immediately after the projections 11 have been formed.

FIG. 43 is a plan view of a part of the substrate immediately after the projections 11 have been formed. It is noted that the projections 11 are shown by circles.

The projections 11 are formed by forming a photosensitive film on the substrate on which the gate electrode 9 and the gate bus main portion 510 have been formed, and then by exposing the photosensitive film to light, developing and baking it in such a way that the projections 11 remain. During the developing step, unnecessary portion of the photosensitive film is removed. As a result of this, the gate electrode 9 and the gate bus main portion 510 partially appear. Therefore, the gate electrode 9 and the gate bus main portion 510 are temporarily immersed in the developer. Further, portions of the photosensitive film covering the sacrificial electrode main portion 60*a* and the gate terminal 6 are completely removed by the developer, so that the sacrificial electrode main portion 60*a* and the gate terminal 6 are temporarily immersed in the developer. The gate electrode 9 and the gate bus main portion 510 contain Al and Mo since the gate electrode 9 and the gate bus main portion 510 consist of the MoCr film 91' and AlCu film 92'. The gate terminal 6 and the sacrificial electrode main portion 60*a* contain $In_2O_3$. Since the magnitude relationship among equilibrium electrode potentials of Al, Mo and $In_2O_3$ is represented by the equation (4), Al has the smallest equilibrium electrode potential and $In_2O_3$ has the largest equilibrium electrode potential. It is therefore considered that the cell reaction represented by reaction formulas (5) and (6) (the reaction formulas (5) and (6) are referred to in the explanation of FIG. 16) occurs when the gate electrode 9 and the gate bus main portion 510 become immersed in the developer. The reaction formulas (5) and (6) are again described below.

$$Al \rightarrow Al^{3+} + 3e- \quad (5)$$

$$In_2O_3 + 6e- + 3H_2O \rightarrow 2In + 6OH— \quad (6)$$

Since Al has the smaller equilibrium electrode potential than that of $In_2O_3$, it is considered that, in the AlCu film 92' of the gate electrode 9 and the gate bus main portion 510, the reaction formula (5) representing the emission of the electrons (e−) occurs on a priority base. In FIG. 43, the AlCu film 92' of the gate electrode 9 and the gate bus main portion 510 is divided into three portions A, B, and C (the portion A is near the gate terminal 6, the portion B is near the sacrificial electrode 60, and the portion C exists in the display area). Next, behaviors of the electrons generated in the portions A, B, and C are discussed.

It is considered that the electrons generated in the portion A flow into the gate terminals 6 and the sacrificial electrode 60 since the portion A is formed between the gate terminal 6 and the sacrificial electrode 60. Most of the electrons generated in the portions B and C flow toward the gate terminal 6. It is however considered that most of the electrons generated in the portions B and C flow into the sacrificial electrode 60 through the wider portion 510*b* of the gate bus main portion 510 before flowing into the gate terminal 6 since the sacrificial electrode 60 formed using the same material as the gate terminal 6 is formed on the way. That is, it is considered that most of the electrons generated in the portions B and C flow into the sacrificial electrode 60 and thus only a few electrons flow into the gate terminal 6. Further, it can be considered that the number of electrons generated in the portion A by the reaction formula (5) may be sufficiently larger than the number of electrons generated in the portion C since the length of the AlCu film 92' of the portion A is sufficiently longer than that of the AlCu film 92' of the portion C. From the consideration described above, it can be considered that most of the electrons generated into the portions A, B, and C flow into the sacrificial electrode 60. Therefore, the reaction formula (6) is liable to occur in the sacrificial electrode 60, but is less liable to occur in the gate terminal 6, and thus it is considered that the sacrificial electrode 60 is heavily damaged but the gate terminal 6 is less susceptible to damage.

As described above, in the third embodiment, not only the gate terminal 6 but also the sacrificial electrode main portion 60*a* appears when the photosensitive film is developed. Now, assuming that the gate terminal 6 appears but the sacrificial electrode main portion 60*a* dose not appear. In this case, the sacrificial electrode main portion 60*a* dose not contact with the developer. Therefore, the reaction formula (6) occurs in the gate terminal 6 intensively, so that the gate terminal 6 may be heavily damaged.

However, as described above, since not only the gate terminal 6 but also the sacrificial electrode main portion 60*a* appears in the third embodiment, the sacrificial electrode 60 is damaged instead of the gate terminal 6. The sacrificial electrode 60 itself dose not participate in the operation of the TFT array substrate 300 at all. Therefore, the operation of the TFT array substrate 300 is not affected even if the sacrificial electrode 60 is damaged. Further, since the sacrificial electrode 60 is damaged instead of the gate terminal 6, the gate terminal 6 is not substantially damaged and thus can have lower resistance. Therefore, the formation of sacrificial electrode 60 can lead to the lower resistance of the gate terminal 6, and the operation of the TFT array substrate 300 is not affected. It is noted that if an area of the sacrificial electrode main portion 60*a* of the sacrificial electrode 60 is too small, the sacrificial electrode 60 can not sufficiently display the function of protecting the gate terminal 6 from the cell reaction. For this reason, it is preferable that the area of the sacrificial electrode main portion 60*a* of the sacrificial electrode 60 is larger.

In the above explanation, it is described that the cell reaction between the AlCu film 92' and the gate terminal 6 ($In_2O_3$) become less liable to occur by means of the sacrificial electrode 60. Now, the effect of the sacrificial electrode 60 on a cell reaction between the AlCu film 92' and the MoCr film 91' will be also discussed. The reaction formulas (2) and (3) (the cell reaction between Al and Mo) may occur between the AlCu film 92' and the MoCr film 91'. However, as shown in the equation (4), Mo has the smaller equilibrium electrode potential than that of $In_2O_3$. Therefore, the cell reaction between the AlCu film 92' and the MoCr film 91' (the reaction formulas (2) and (3)) is less liable to occur than the cell reaction between the AlCu film 92' and the sacrificial electrode 60 ($In_2O_3$) (the reaction formulas (5) and (6)). That is to say, the reaction formulas (2) and (3) between the MoCr film 91' and the AlCu film 92' become less liable to occur since the MoCr film 91' and the AlCu film 92' are electrically connected to the sacrificial electrode 60. Therefore, the phenomenon in which the material of the projections 11 is removed more than necessary because of the reaction formulas (2) and (3) can be less liable to occur.

After the projections 11 are formed as shown in FIG. 43, the planarization film 12 is formed (see FIGS. 29 to 31). In this way, the underlying layer consisting of the projections 11 and the planarization film 12 is formed. After the underlying layer is formed, the reflective electrodes 13 are formed (see FIGS. 29 to 31). In this way, the TFT array substrate 300 is manufactured.

In the third embodiment, the sacrificial electrode 60 which dose not participate in the circuit operation of the TFT array substrate 300 at all is connected to the gate bus main portion 510, so that the sacrificial electrode 60 is damaged by the reaction formula (6) instead of the gate terminal 6. Therefore, the gate terminal 6 can efficiently prevented from being damaged, so that the gate terminal 6 can have the lower resistance.

In the example described above, in order that the sacrificial electrode main portion 60*a* of the sacrificial electrode 60 can appear before the projections 11 are formed, the substrate from the surface of which the sacrificial electrode main portion 60*a* of the sacrificial electrode 60 is appearing is manufactured by using the method described with respect to FIGS. 32 to 42. However, even if different methods are used, the sacrificial electrode main portion 60*a* of the sacrificial electrode 60 can appear before the projections 11 are formed. One of the different methods is described below with respect to FIGS. 44 to 56.

Figure 44:
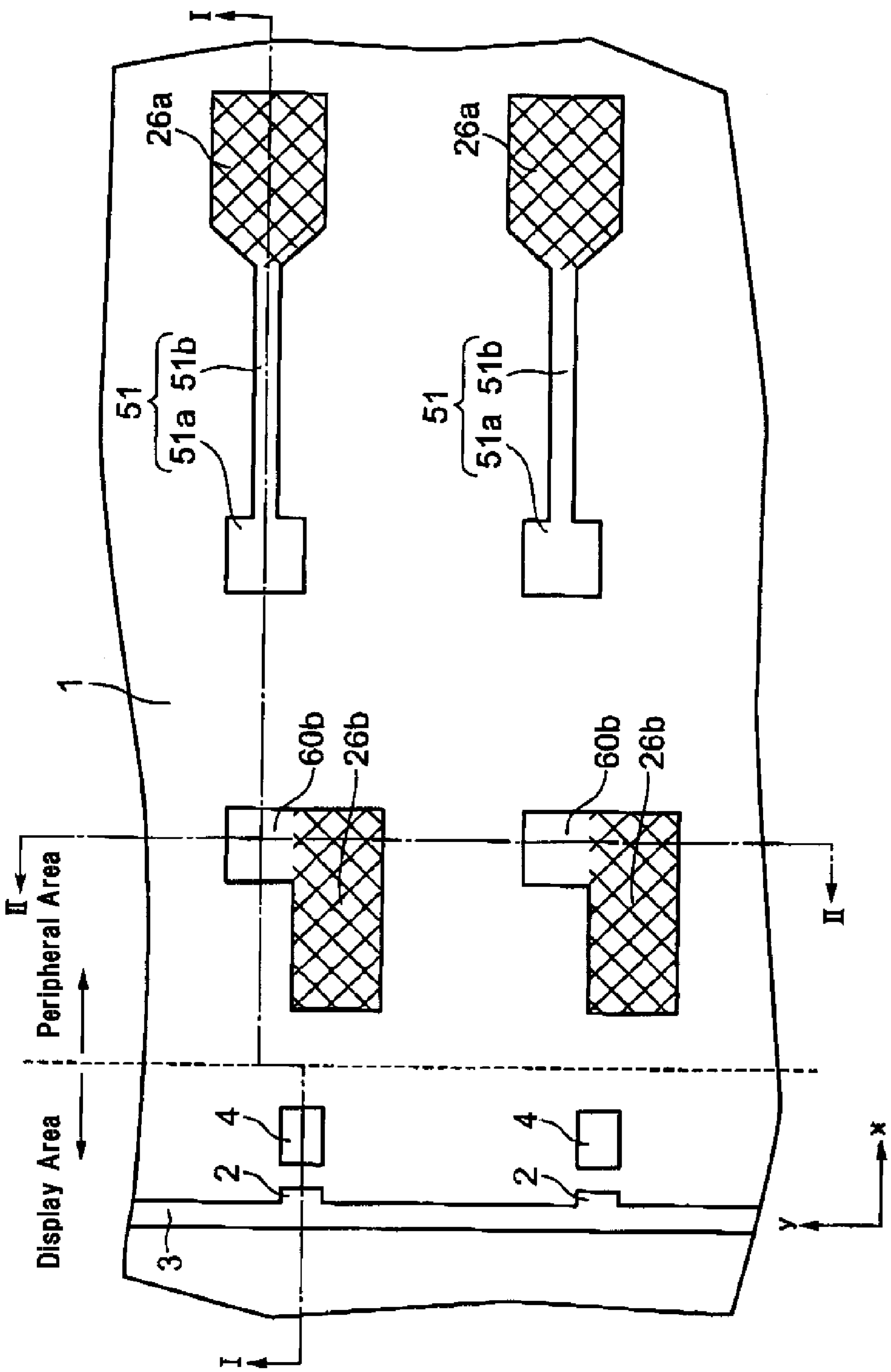
FIG. 44 is a plan view of a part of the substrate on which the gate bus end portion 51 and others have been formed.
Figure 45:
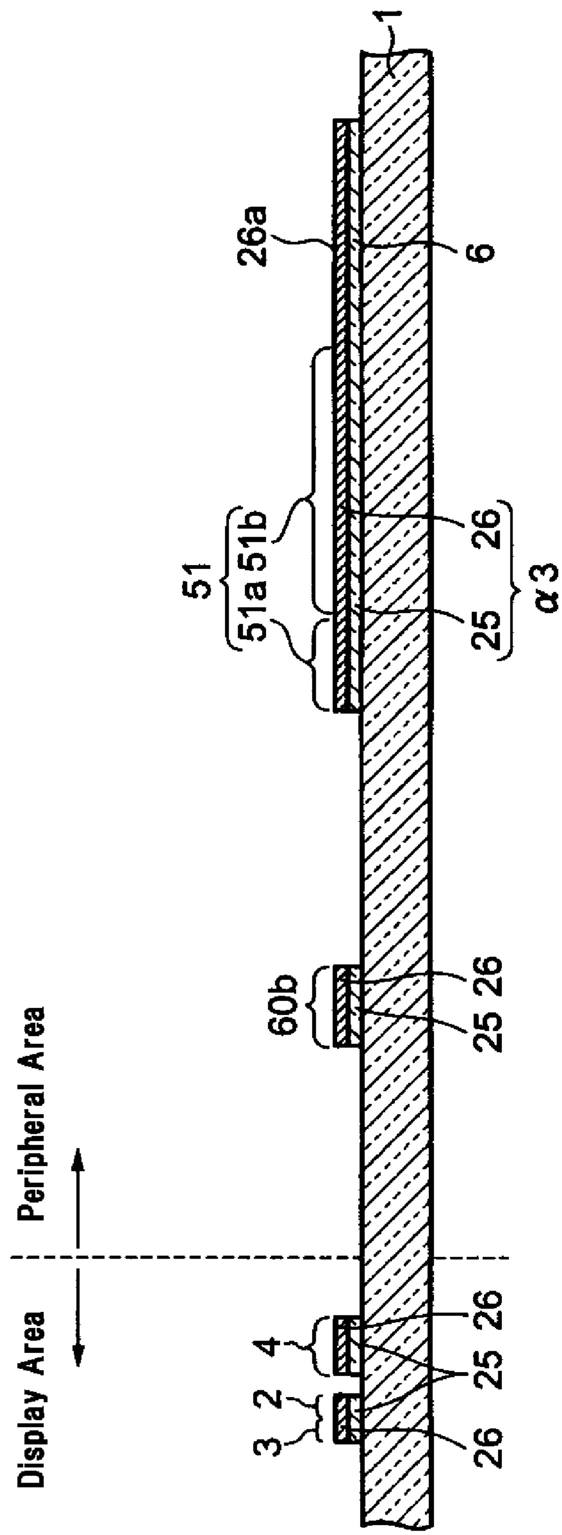
FIG. 45 is a cross-sectional view of the substrate, viewed in I-I direction shown in FIG. 44.
Figure 46:
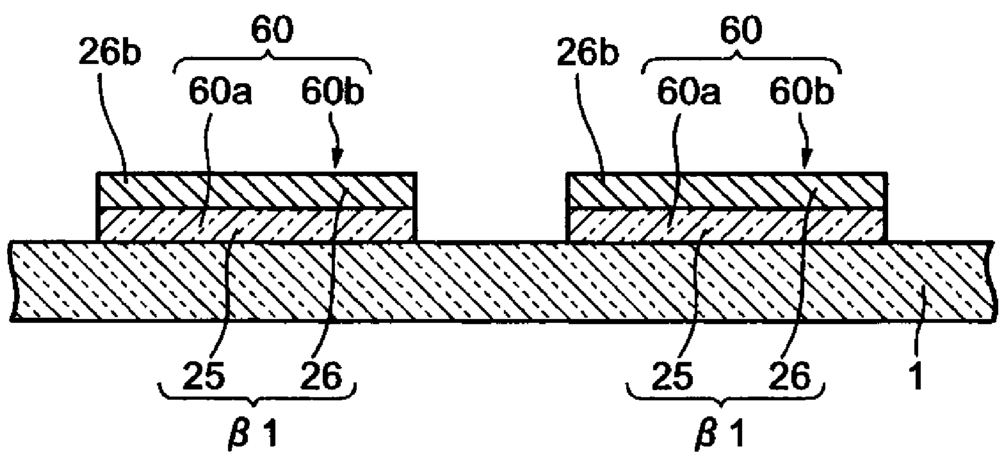
FIG. 46 is a cross-sectional view of the substrate, viewed in II-II direction shown in FIG. 44.

FIG. 44 is a plan view of a part of the substrate on which the gate bus end portion 51 and others have been formed. FIG. 45 is a cross-sectional view of the substrate, viewed in I-I direction shown in FIG. 44. FIG. 46 is a cross-sectional view of the substrate, viewed in II-II direction shown in FIG. 44.

As shown in FIG. 44, formed on the display area are the source electrode 2, the source bus 3, and drain electrode 4. The source bus 3 is formed so as to extend in y direction. The source electrode 2 is formed so as to be continuous with the source bus 3. Formed on the peripheral area are the gate bus end portion 51, the gate terminal 6 and the sacrificial electrode 60. The source bus 3, the gate bus end portion 51 and others are formed by forming double layer films of ITO film/MoCr film on the substrate 1 and then patterning the ITO film and the MoCr in the same shape. For this reason, the gate terminal 6 is covered with a portion 26*a* of the MoCr portion 26 (the portion 26*a* is shown by cross hatching in FIG. 44), and the sacrificial electrode 60*a* is covered with a portion 26*b* of the MoCr portion 26 (the portion 26*b* is also shown by cross hatching in FIG. 44). However, the portions 26*a* and 26*b* of the MoCr portion 26 are not required for the gate terminal 6 and the sacrificial electrode main portion 60*a*, so that the portion 26*a* of the MoCr portion 26 (which is referred below to as "MoCr unnecessary portion 26*a*") and the portion 26*b* (which is referred below to as "MoCr unnecessary portion 26*b*") must be removed. However, if we try to remove the MoCr unnecessary portions 26*a* and 26*b* from structure shown in FIGS. 44 to 46, special photolithographic steps for removing the MoCr unnecessary portions 26*a* and 26*b* are required, this increases the number of manufacturing steps. Therefore, in order to manufacture the TFT array substrate without increasing the number of manufacturing steps, an a-Si layer and a gate insulating film are formed without removing the MoCr unnecessary portions 26*a* and 26*b* at once.

It is noted that a double layer structure α3 (see FIG. 45) consisting of the ITO portion 25 and the MoCr portion 26 forms the gate bus end portion 51, the gate terminal 6, and the MoCr unnecessary portion 26*a* and that a double layer structure β1 (see FIG. 46) consisting of the ITO portion 25 and the MoCr portion 26 forms the sacrificial electrode 60 and the MoCr unnecessary portion 26*b*.

Figure 47:
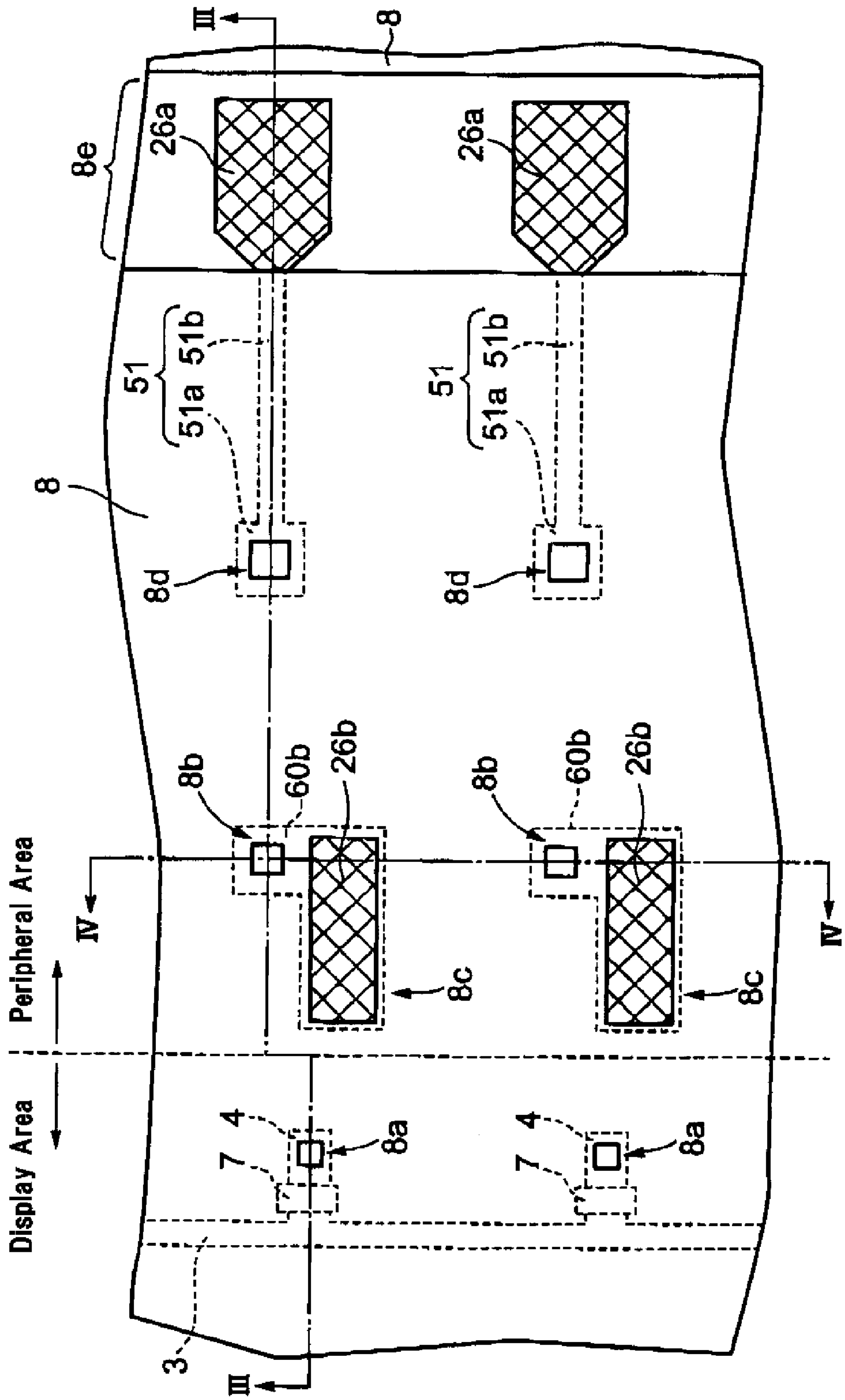
FIG. 47 is a plan view of a part of the substrate on which the a-Si layer 7 and the gate insulating film 8 have been formed.
Figure 48:
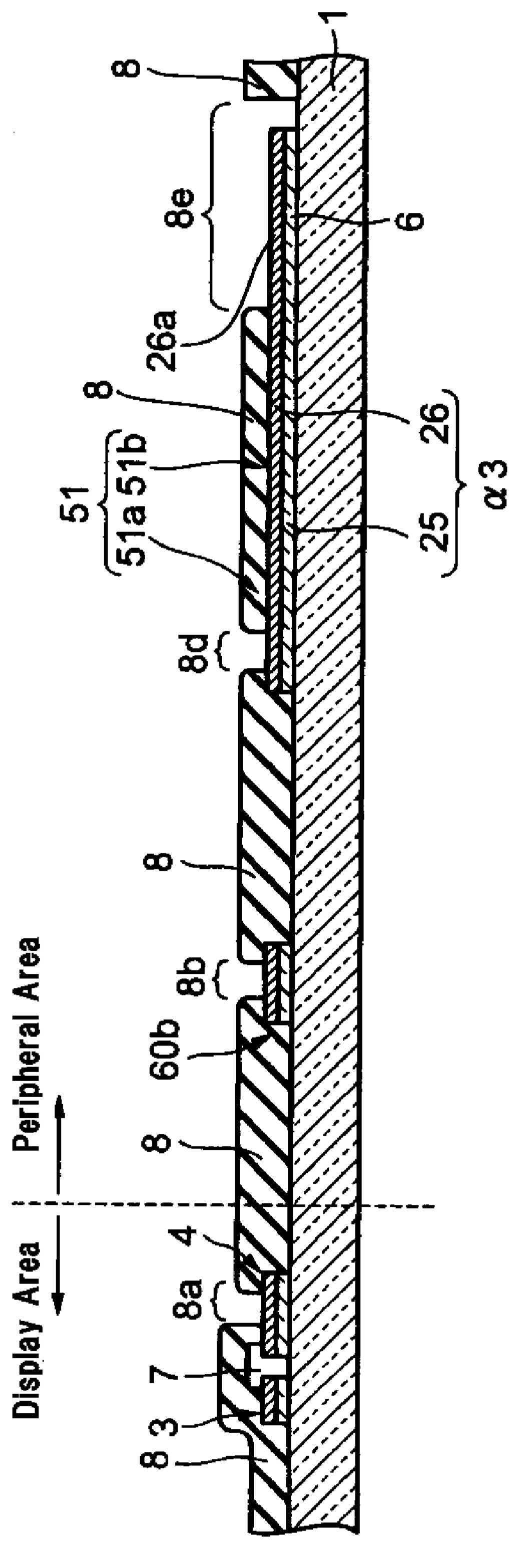
FIG. 48 is a cross-sectional view of the substrate, viewed in III-III direction shown in FIG. 47.
Figure 49:
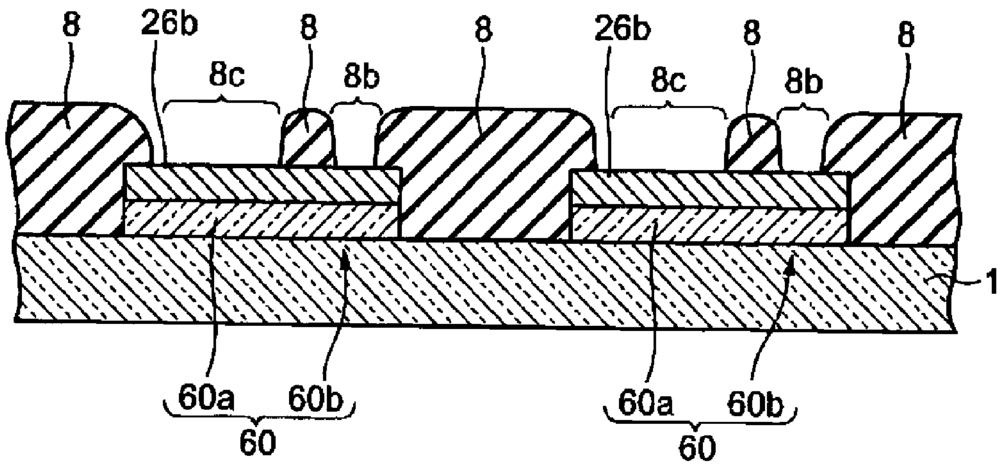
FIG. 49 is a cross-sectional view of the substrate, viewed in IV-IV direction shown in FIG. 47.

FIG. 47 is a plan view of a part of the substrate on which the a-Si layer 7 and the gate insulating film 8 have been formed. FIG. 48 is a cross-sectional view of the substrate, viewed in III-III direction shown in FIG. 47. FIG. 49 is a cross-sectional view of the substrate, viewed in IV-IV direction shown in FIG. 47.

After the a-Si layer 7 is formed, the gate insulating film 8 is formed so as to cover the surface of the substrate on which the a-Si has been formed. The gate insulating film 8 comprises holes 8*a*, 8*b*, 8*c*, 8*d*, and 8*e*. The hole 8*a* is to expose the drain electrode 4 from the surface of the gate insulating film 8. The hole 8*b* is to expose the sacrificial electrode connection portion 60*b* from the surface of the gate insulating film 8. The hole 8*c* is to expose the MoCr unnecessary portion 26*b* covering the sacrificial electrode main portion 60*a* from the surface of the gate insulating film 8. The hole 8*d* is to expose the connection portion 51*a* of the gate bus end portion 51 from the surface of the gate insulating film 8. The hole 8*e* is to expose the MoCr unnecessary portion 26*a* covering the gate terminal 6 from the surface of the gate insulating film 8.

Figure 50:
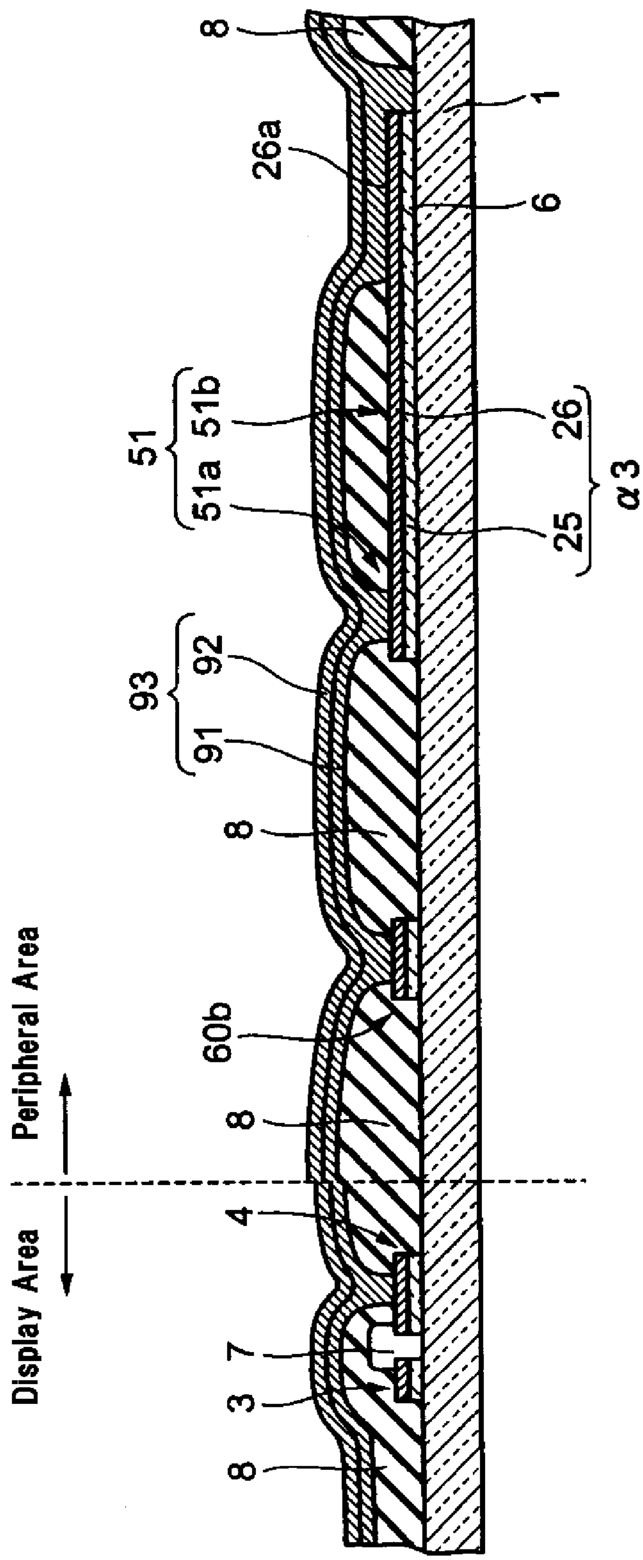
FIG. 50 is cross-sectional view of the substrate on which the conductive film 93 has been formed.
Figure 51:
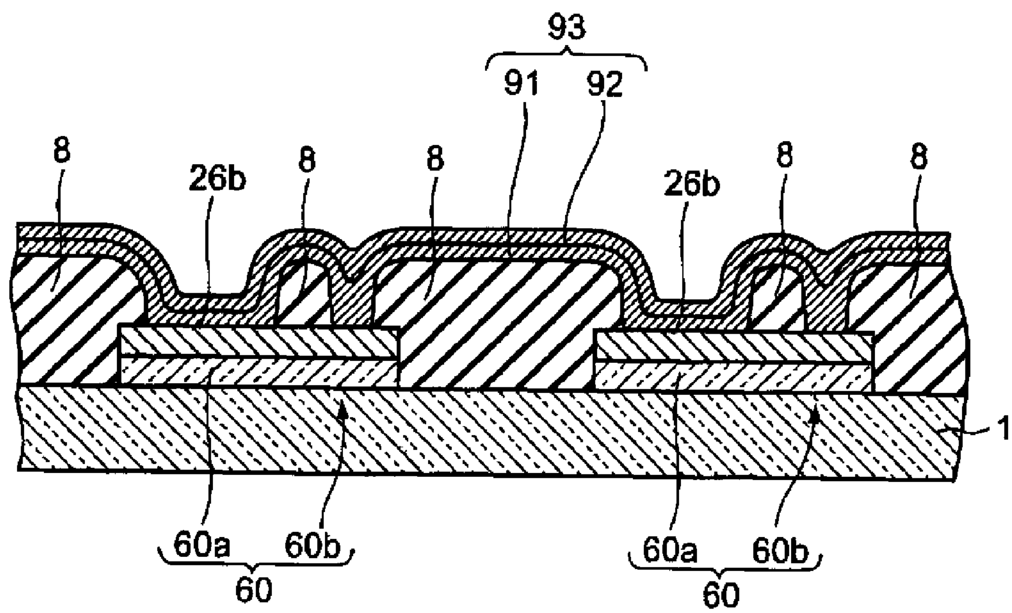
FIG. 51 is cross-sectional views of the substrate on which the conductive film 93 has been formed.

After the gate insulating film 8 having such holes 8*a* to 8*e* is formed, a conductive film 93 as shown in FIGS. 38 and 39 is formed (see FIGS. 50 and 51).

FIGS. 50 and 51 are cross-sectional views of the substrate on which the conductive film 93 has been formed. FIGS. 50 and 51 are cross-sectional views corresponding to FIGS. 48 and 49, respectively.

The conductive film 93 has a double layer structure of a MoCr film 91 and an AlCu film 92. After the conductive film 93 of the AlCu film 92/the MoCr film 91 is formed, the conductive film 93 is patterned using photolithographic technology (see FIGS. 52 to 54).

Figure 52:
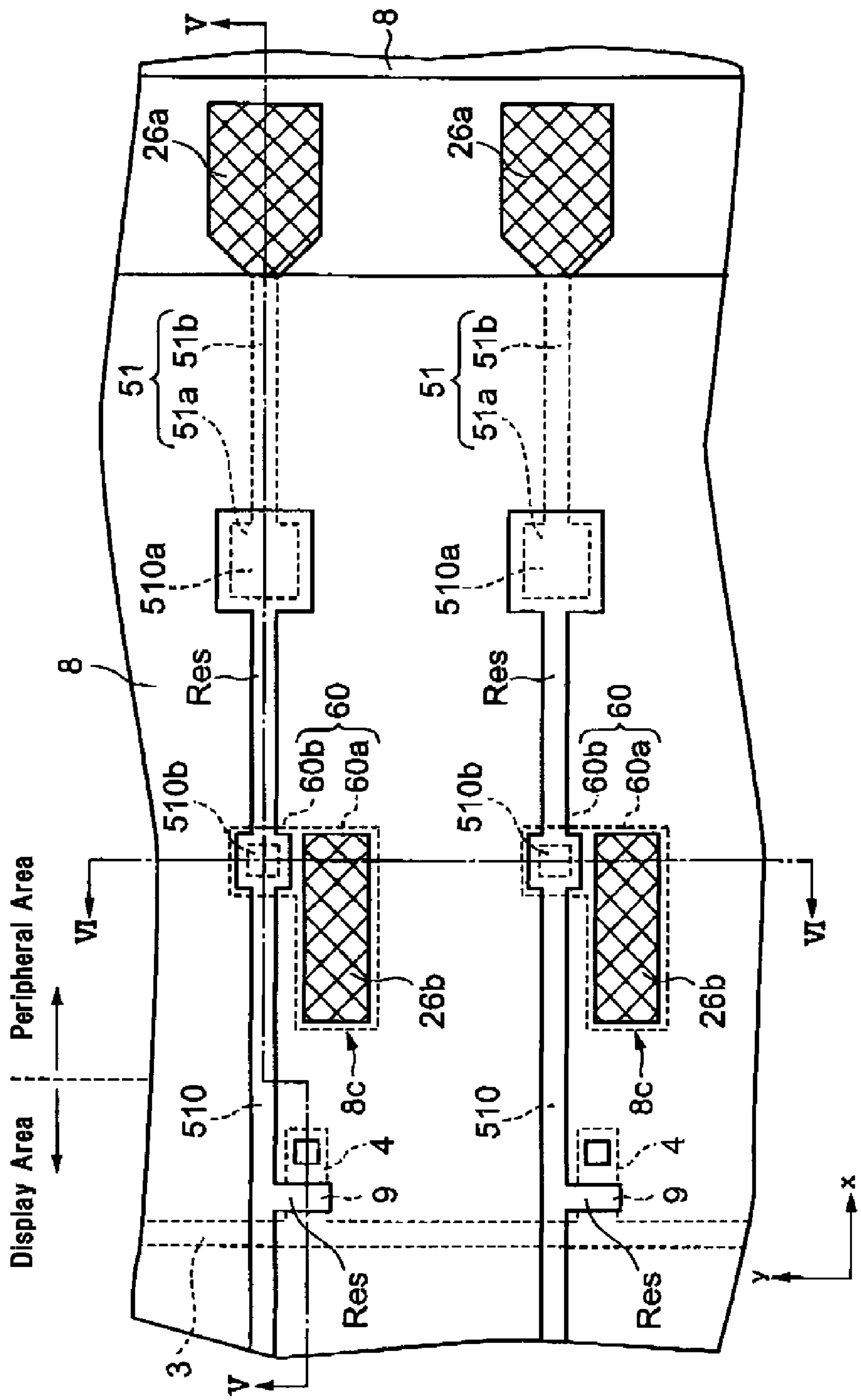
FIG. 52 is a plan view of a part of the substrate after the conductive film 93 has been patterned.
Figure 53:
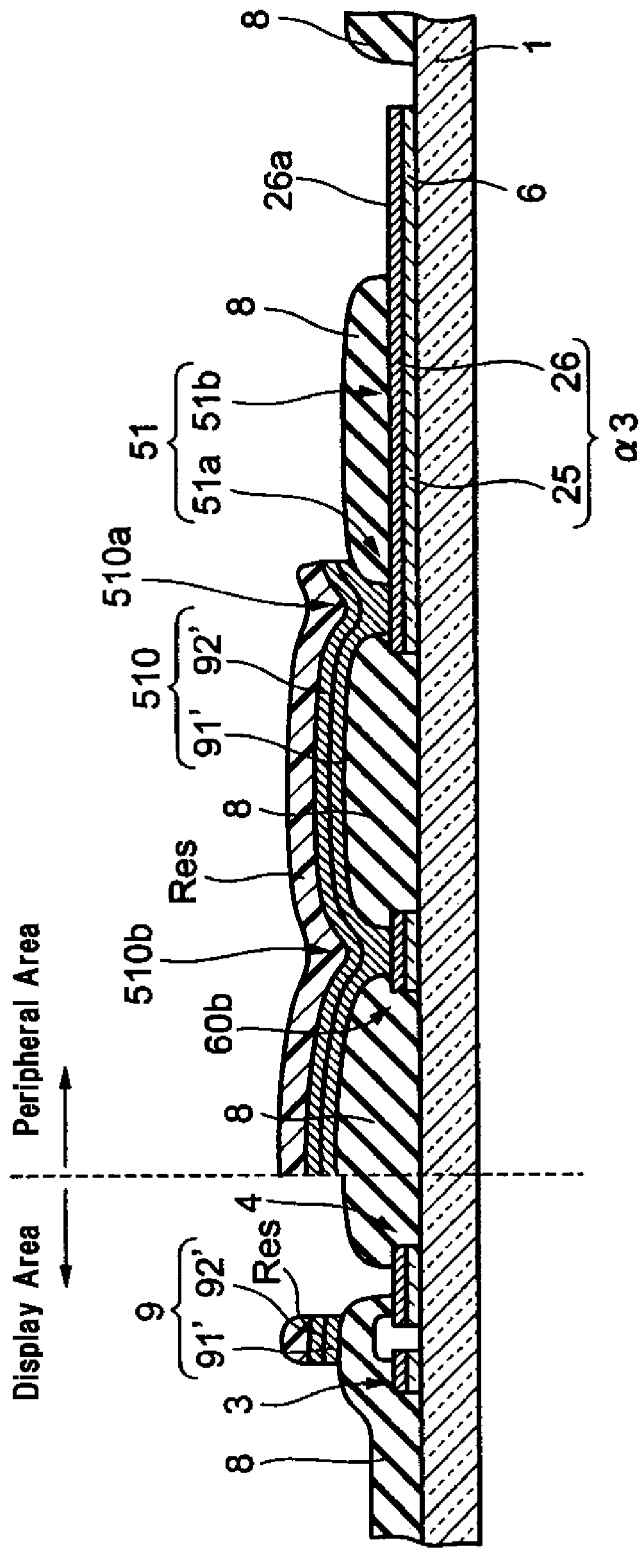
FIG. 53 is a cross-sectional view of the substrate, viewed in V-V direction shown in FIG. 52.
Figure 54:
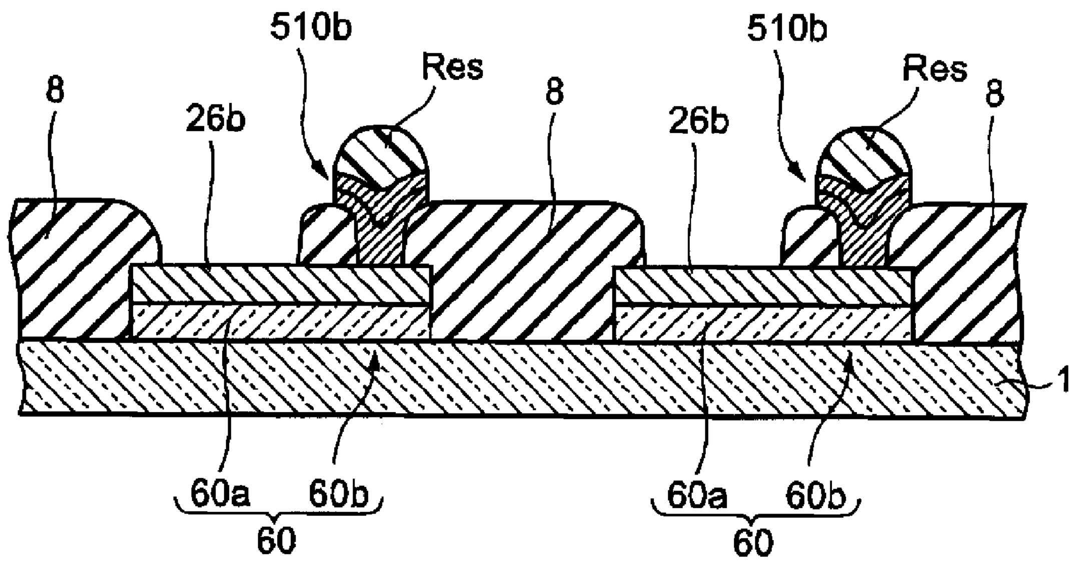
FIG. 54 is a cross-sectional view of the substrate, viewed in VI-VI direction shown in FIG. 52.

FIG. 52 is a plan view of a part of the substrate after the conductive film 93 has been patterned. FIG. 53 is a cross-sectional view of the substrate, viewed in V-V direction shown in FIG. 52. FIG. 54 is a cross-sectional view of the substrate, viewed in VI-VI direction shown in FIG. 52.

The conductive film 93 is wet-etched. Portions of the conductive film 93 covered with resist films Res remain without removing, but portions of the conductive film 93 non-covered with resist films Res are removed. As a result of this, a gate electrode 9 and a gate bus main portion 510 are formed under the resist films Res, and the MoCr unnecessary portions 26*a* and 26*b* appear. It is noted that the gate terminal 6 is covered with the MoCr unnecessary portion 26*a* and that the sacrificial electrode main portion 60*a* is covered with the MoCr unnecessary portion 26*b*. Since the MoCr unnecessary portion 26*a* is not required for the gate terminal 6, the MoCr unnecessary portion 26*a* must be removed. On the other hand, the MoCr unnecessary portion 26*b* also must be removed since the sacrificial electrode main portion 60*a* must be appearing as described with respect to FIG. 43 in order that the sacrificial electrode 60 can function so as to prevent the gate terminal 6 from being damaged. For this reason, after the conductive film 93 is wet-etched, the MoCr unnecessary portions 26*a* and 26*b* also are wet-etched (see FIGS. 55 and 56).

Figure 55:
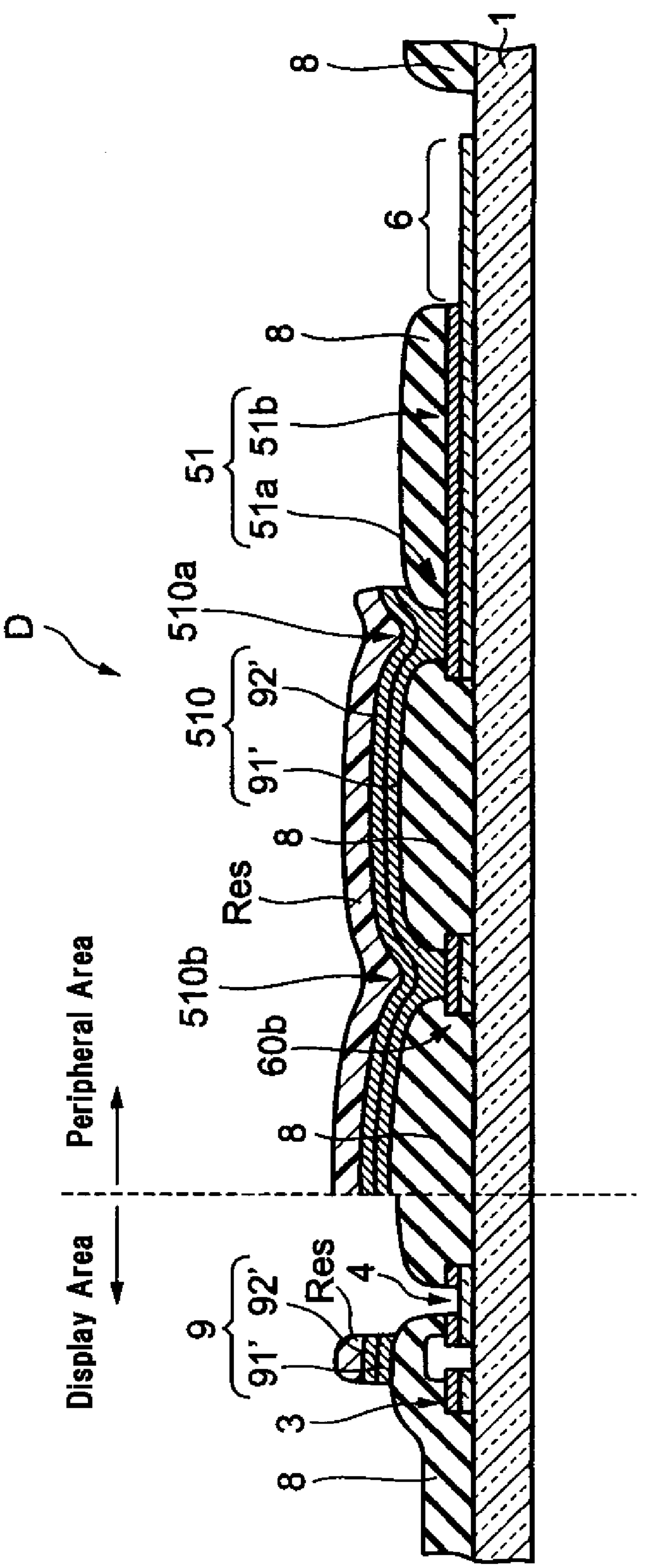
FIG. 55 is cross-sectional view of the substrate after the MoCr unnecessary portions 26*a* and 26*b* have been wet-etched.
Figure 56:
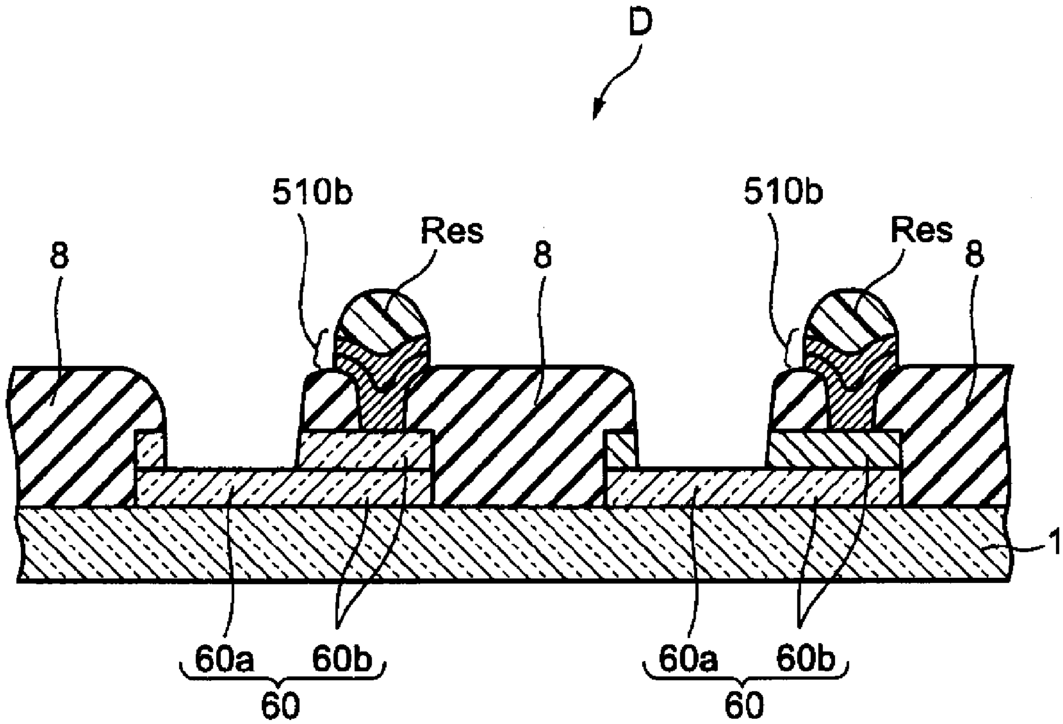
FIG. 56 is cross-sectional view of the substrate after the MoCr unnecessary portions 26*a* and 26*b* have been wet-etched.

FIGS. 55 and 56 are cross-sectional views of the substrate after the MoCr unnecessary portions 26*a* and 26*b* have been wet-etched. FIGS. 55 and 56 are cross-sectional views corresponding to FIGS. 53 and 54, respectively.

The MoCr unnecessary portions 26*a* and 26*b* are wet-etched after the MoCr film 91 of the conductive film 93 is etched. This removes the MoCr unnecessary portions 26*a* and 26*b*, so that a conductive portion possessor D is manufactured. The gate terminal 6 and the sacrificial electrode main portion 60*a* are exposed from the surface of the possessor D. By etching the MoCr unnecessary portions 26*a* and 26*b* as described above, the gate terminal 6 and the sacrificial electrode main portion 60*a* appear without special photolithographic steps for removing the MoCr unnecessary portions 26*a* and 26*b*. After the MoCr unnecessary portions 26*a* and 26*b* are removed, the resist films Res are removed.

After the resist films Res are removed, the underlying layer and the reflective electrodes are formed.

In this embodiment, the sacrificial electrode main portion 60*a* is still being covered with the MoCr unnecessary portion 26*b* immediately after the conductive film 93 is etched (i.e. immediately after the gate electrode 9 and the gate bus main portion 510 are formed) (see FIG. 52), but the MoCr unnecessary portion 26*b* is etched following the etching of the conductive film 93. Therefore, the sacrificial electrode main portion 60*a* can appear before the projections 11 of the underlying layer are formed, so that the gate terminals 6 can be less susceptible to damage.

Further, in the third embodiment, the example in which ITO is used as the material of the gate terminal 6 is described. However, according to the present invention, even if e.g. IZO is used instead of ITO, the phenomenon in which the material of the projections 11 is removed more than necessary is less liable to occur and the gate terminals 6 are less susceptible to damage.

Embodiment 4

Figure 57:
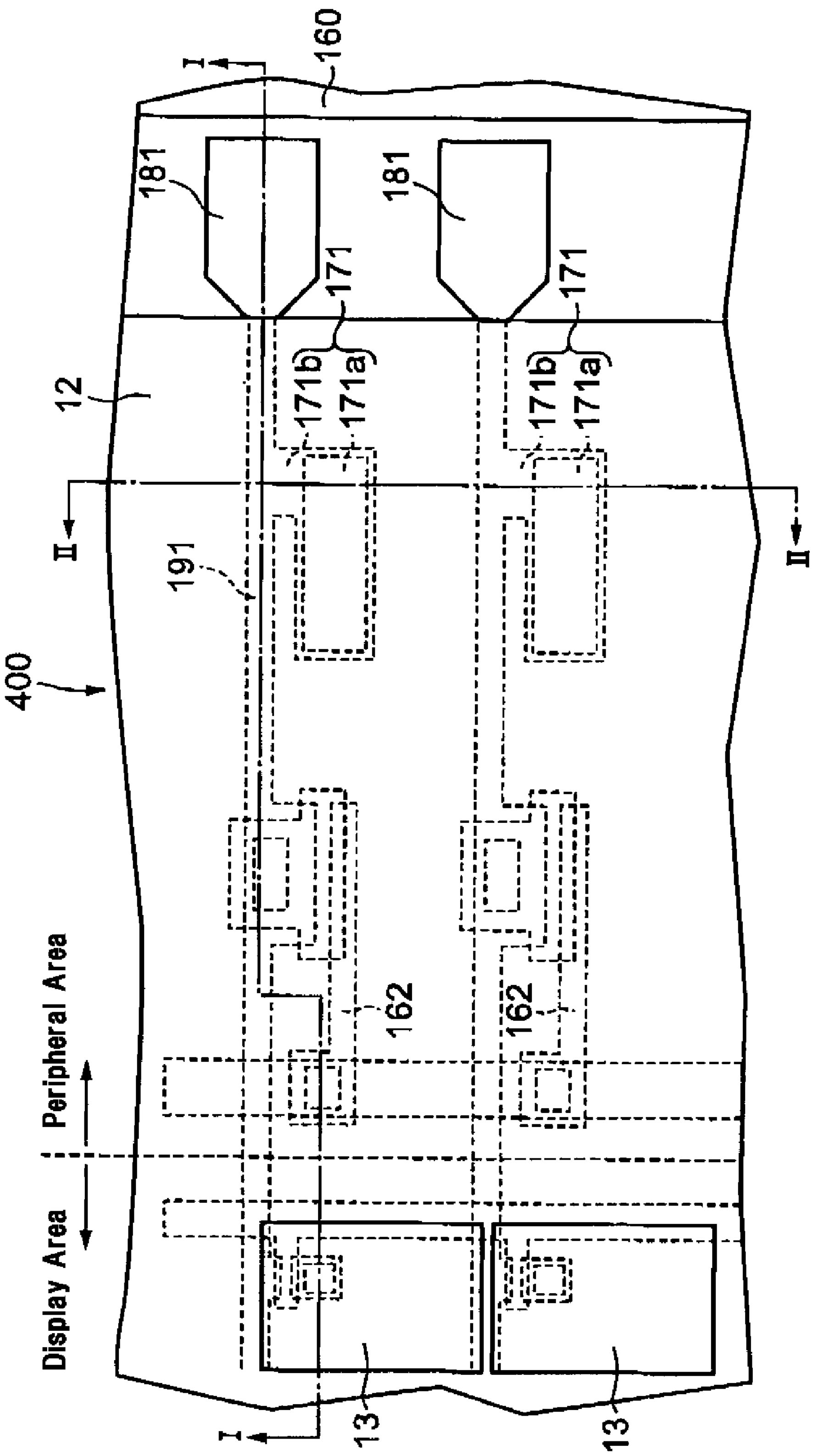
FIG. 57 is a plan view of a part of a TFT array substrate 400 of a fourth embodiment according to the present invention, the TFT array substrate 400 used in a reflective liquid crystal display device of top gate type.
Figure 58:
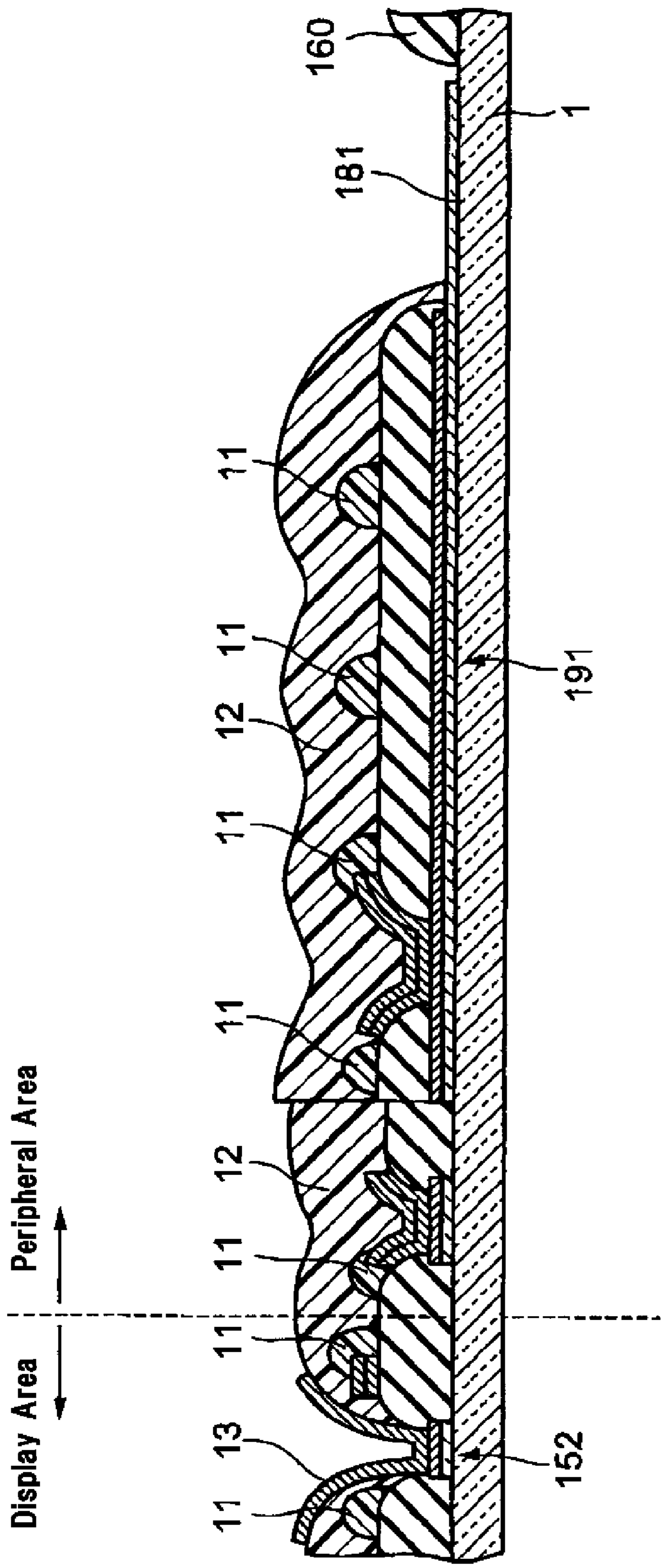
FIG. 58 is a cross-sectional view of the substrate 400, viewed in I-I direction shown in FIG. 57.
Figure 59:
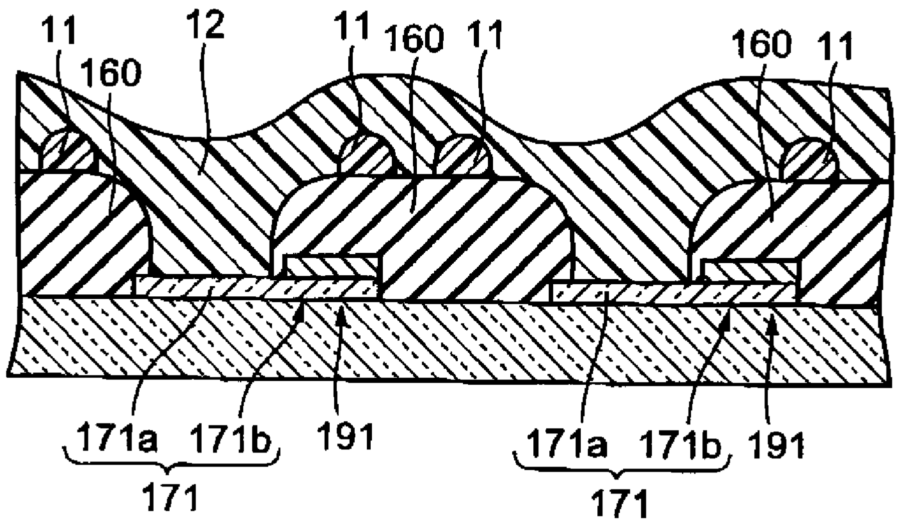
FIG. 59 is a cross-sectional view of the substrate 400, viewed in II-II direction shown in FIG. 57.

FIG. 57 is a plan view of a part of a TFT array substrate 400 of a fourth embodiment according to the present invention, the TFT array substrate 400 used in a reflective liquid crystal display device of top gate type. FIG. 58 is a cross-sectional view of the substrate 400, viewed in I-I direction shown in FIG. 57. FIG. 59 is a cross-sectional view of the substrate 400, viewed in II-II direction shown in FIG. 57.

The left side of FIG. 57 is a display area in which TFTs, reflective electrodes 13 and others are formed. The right side of FIG. 57 is a peripheral area in which ESD transistors and source terminals 181 are formed. The ESD transistor is to prevent TFT provided in each pixel of the display area from being static-broken. It is noted that, for the sake of convenience, the display area and the peripheral area are schematically illustrated.

A method of manufacturing the TFT array substrate 400 is described below.

Figure 60:
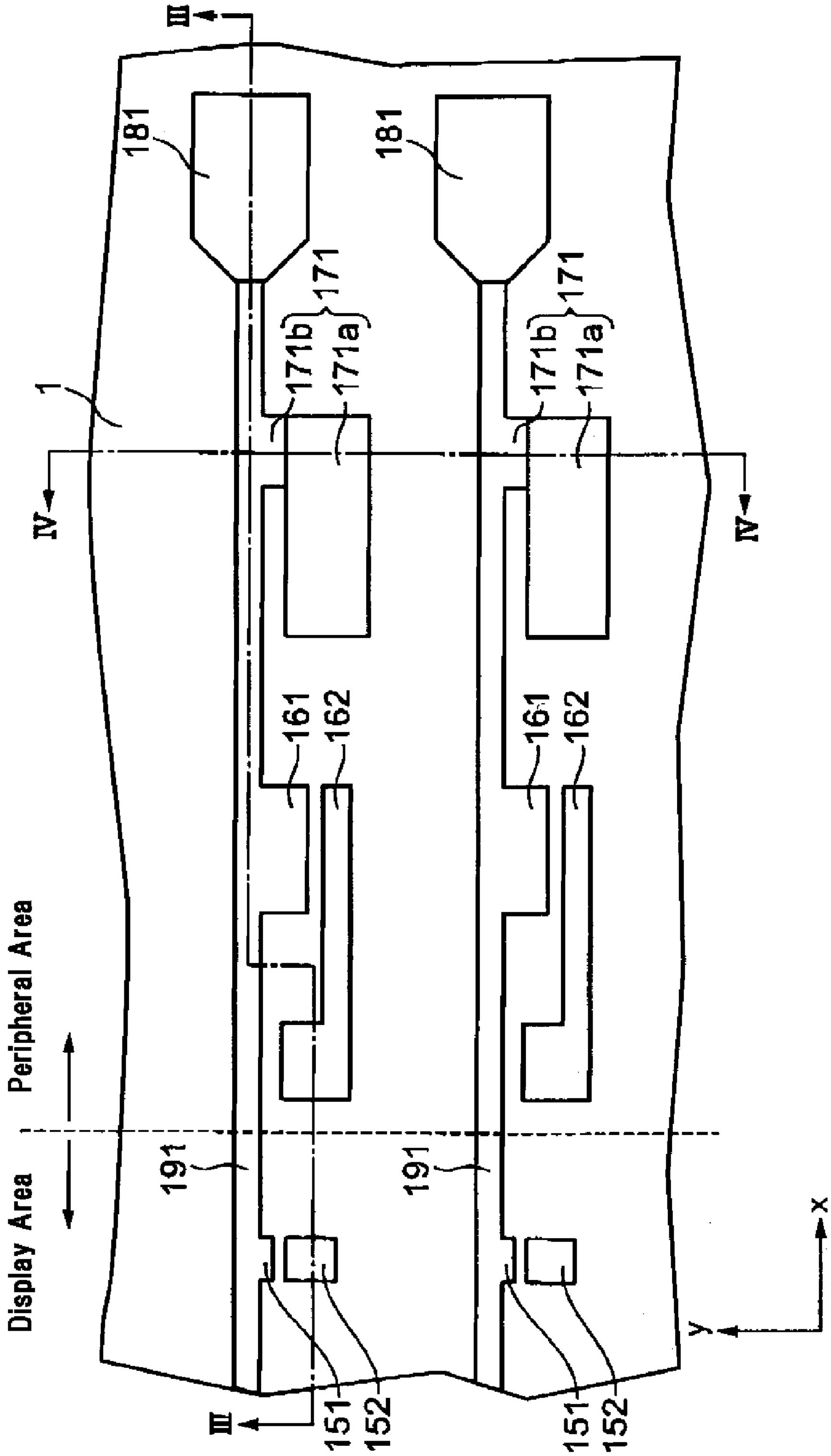
FIG. 60 is a plan view of a part of the substrate on which the source bus 191, the sacrificial electrodes 171 and others have been formed.

First, on a glass substrate 1 are formed source buses, sacrificial electrodes, and others (see FIG. 60).

Figure 61:
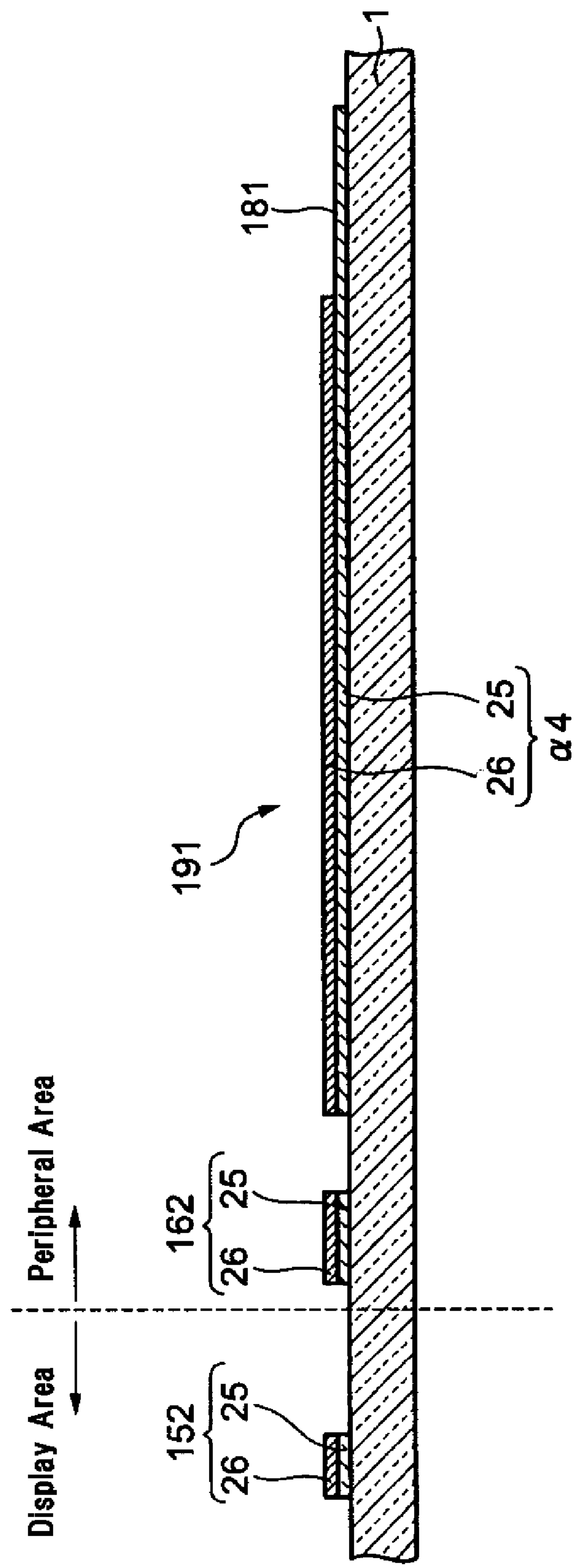
FIG. 61 is a cross-sectional view of the substrate, viewed in III-III direction in FIG. 60.
Figure 62:
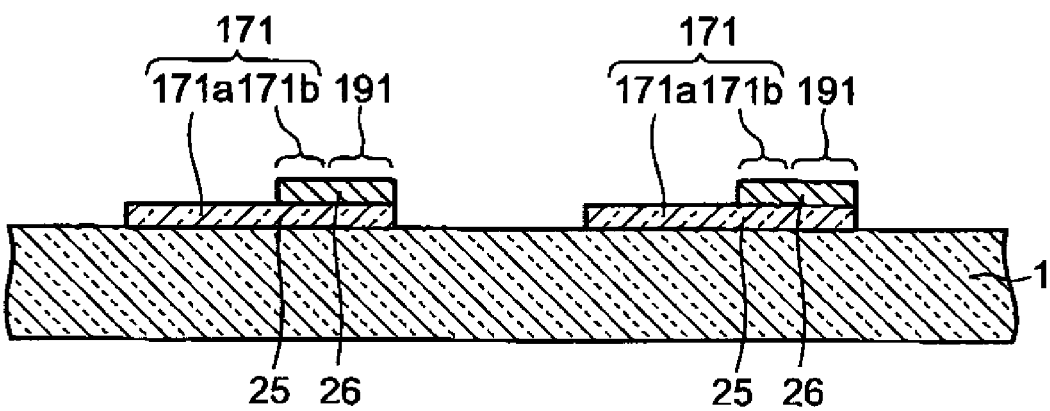
FIG. 62 is a cross-sectional view of the substrate, viewed in IV-IV direction in FIG. 60.

FIG. 60 is a plan view of a part of the substrate on which the source bus 191, the sacrificial electrodes 171 and others have been formed. FIG. 61 is a cross-sectional view of the substrate, viewed in III-III direction in FIG. 60. FIG. 62 is a cross-sectional view of the substrate, viewed in IV-IV direction in FIG. 60.

Formed on the display area of the substrate 1 are the source electrode 151 and the drain electrode 152 of the TFT. Formed on the peripheral area are the source electrode 161 and the drain electrode 162 of the ESD transistor, the sacrificial electrode 171, and the source terminal 181. The source bus 191 is formed so as to extend in the x direction across the display area and the peripheral area. The source electrode 151 of the TFT, the source electrode 161 of the ESD transistor, the sacrificial electrode 171, and the source terminal 181 are formed so as to be continuous with the source bus 191. The sacrificial electrode 171 comprises a sacrificial electrode main portion 171*a* and a sacrificial electrode connection portion 171*b*. The sacrificial electrode main portion 171*a* is connected to the source bus 191 through the sacrificial electrode connection portion 171*b*.

The source electrode 151 and the drain electrode of the TFT, the source electrode 161 and the drain electrode 162 of the ESD transistor, and the source bus 191 are double layer structure consisting of an ITO portion 25 and a MoCr portion 26. In case where the source bus 191 and others are the double layer structure consisting of the ITO portion 25 and the MoCr portion 26 instead of a single layer structure of the ITO portion 25, the source bus 191 and others can have lower resistance. In the sacrificial electrode 171, only sacrificial electrode connection portion 171*b* is the double layer structure consisting of the ITO portion 25 and the MoCr portion 26, and the sacrificial electrode main portion 171*a* consists of the ITO portion 25. The source terminal 181 consists of the ITO portion 25. A double layer structure α4 (see FIG. 61) consisting of the ITO portion 25 and the MoCr portion 26 forms the source bus 191, the source terminal 181, and the sacrificial electrode 171.

Such sacrificial electrode 171 and others are formed by forming double layer films of MoCr film/ITO film on the substrate 1 and then patterning the double layer films in the shape shown in FIGS. 60 to 62.

Figure 63:
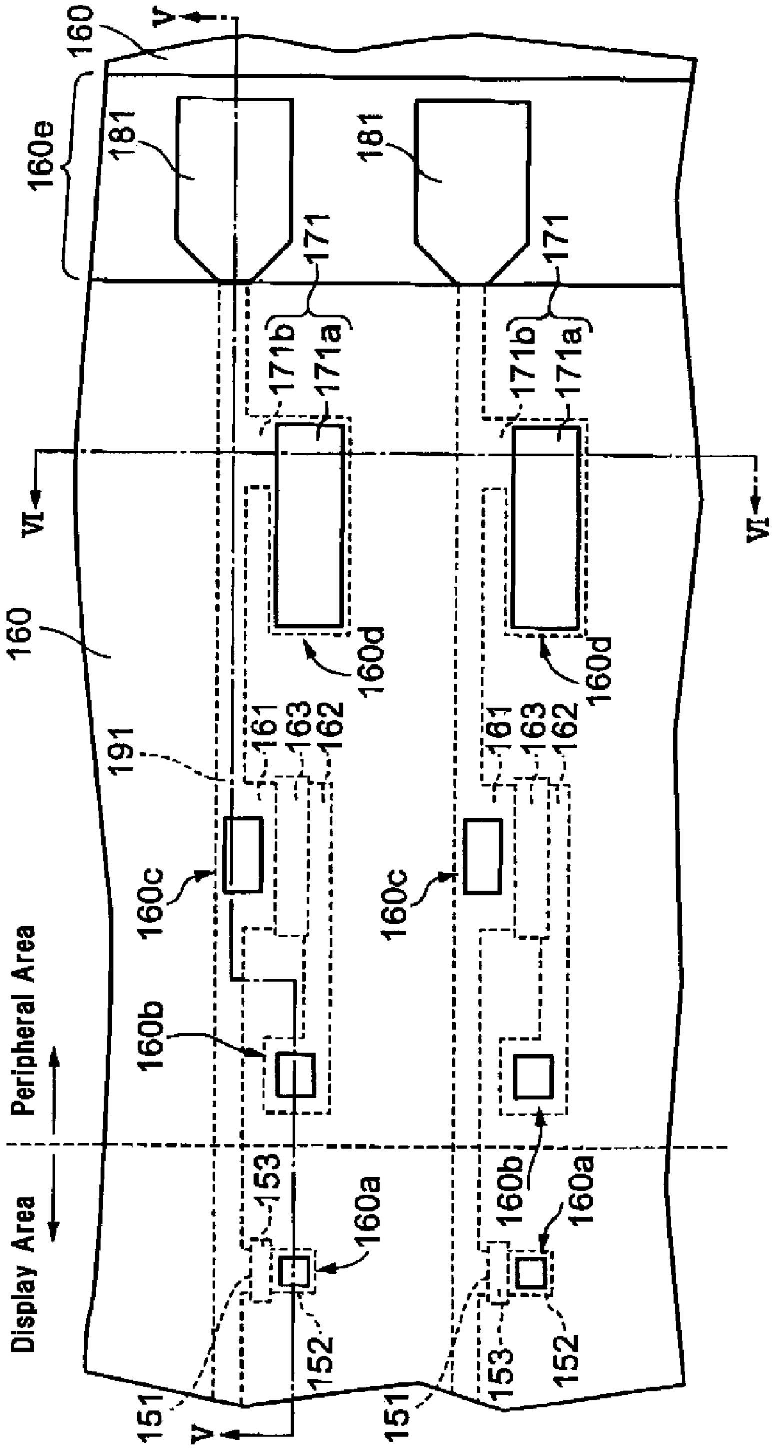
FIG. 63 is a plan view of a part of the substrate 1 on which the a-Si layer 153 and 163 and the gate insulating film 160 have been formed.
Figure 64:
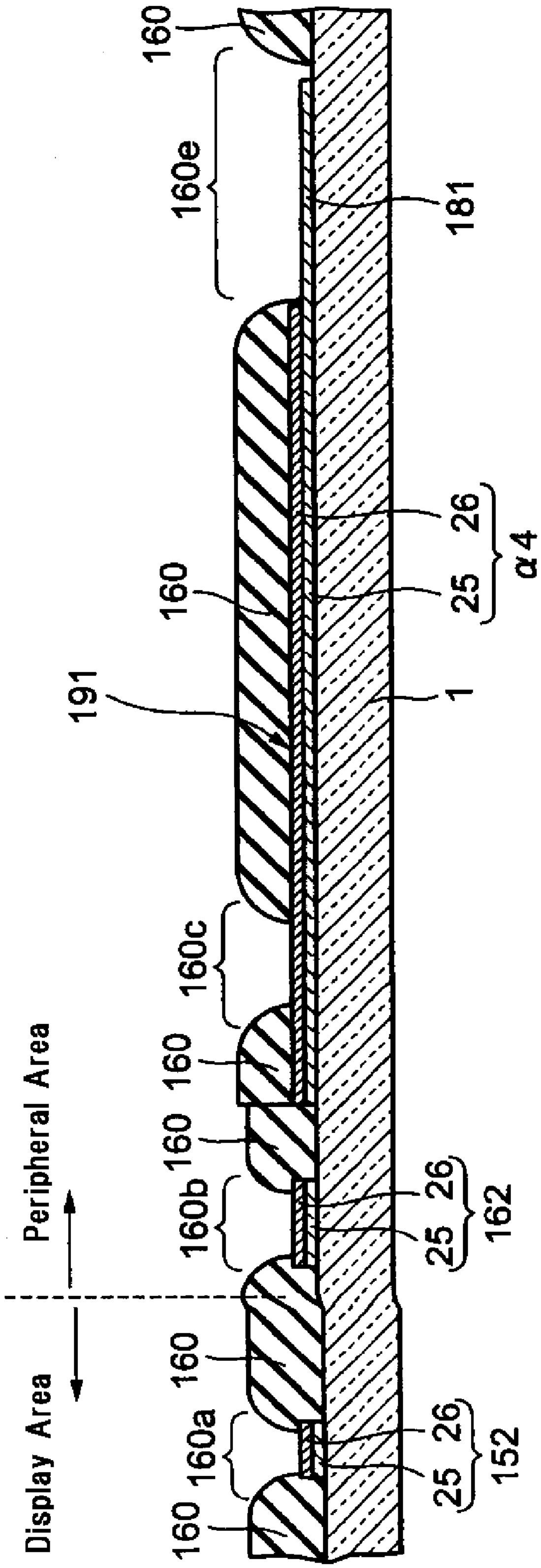
FIG. 64 is a cross-sectional view of the substrate, viewed in V-V direction shown in FIG. 63.
Figure 65:
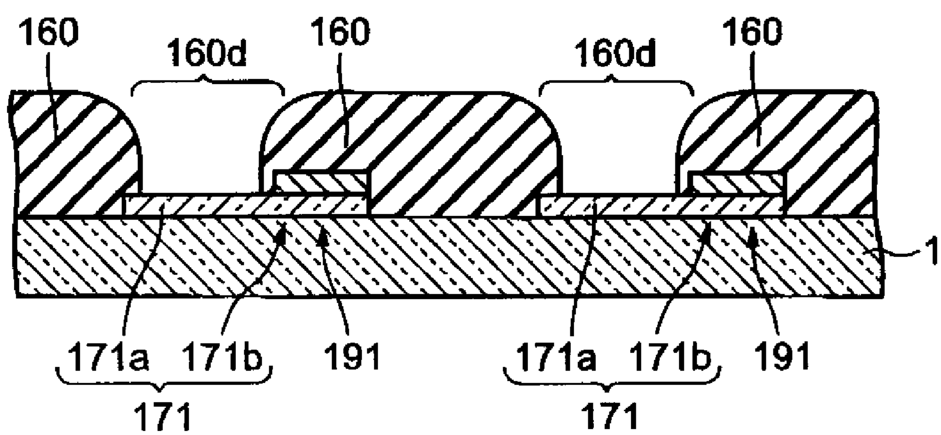
FIG. 65 is a cross-sectional view of the substrate, viewed in VI-VI direction shown in FIG. 63.

After the sacrificial electrode 171 and others are formed, an a-Si layer and an gate insulating film are formed (see FIGS. 63 to 65).

FIG. 63 is a plan view of a part of the substrate 1 on which the a-Si layer 153 and 163 and the gate insulating film 160 have been formed. FIG. 64 is a cross-sectional view of the substrate, viewed in V-V direction shown in FIG. 63. FIG. 65 is a cross-sectional view of the substrate, viewed in VI-VI direction shown in FIG. 63.

On the display area, the a-Si layer 153 is formed between the source electrode 151 and the drain electrode 152 of the TFT. On the peripheral area, the a-Si layer 163 is formed between the source electrode 161 and the drain electrode 162 of the ESD transistor. After the a-Si layers 153 and 163 are formed, the gate insulating film 8 is formed on the substrate 1 on which the a-Si layers 153 and 163 have been formed. The gate insulating film 160 has been patterned so as to comprise holes 160*a*, 160*b*, 160*c*, 160*d* and 160*e*. The hole 160*a* is to expose the drain electrode 152 from the surface of the gate insulating film 160. The hole 160*b* is to expose the drain electrode 162 of the ESD transistor from the surface of the gate insulating film 160. The hole 160*c* is to expose the source bus 191 from the surface of the gate insulating film 160. The hole 160*d* is to expose the sacrificial electrode main portion 171*a* from the surface of the gate insulating film 160. The hole 160*e* is to expose the source terminal 181 from the surface of the gate insulating film 160.

Figure 66:
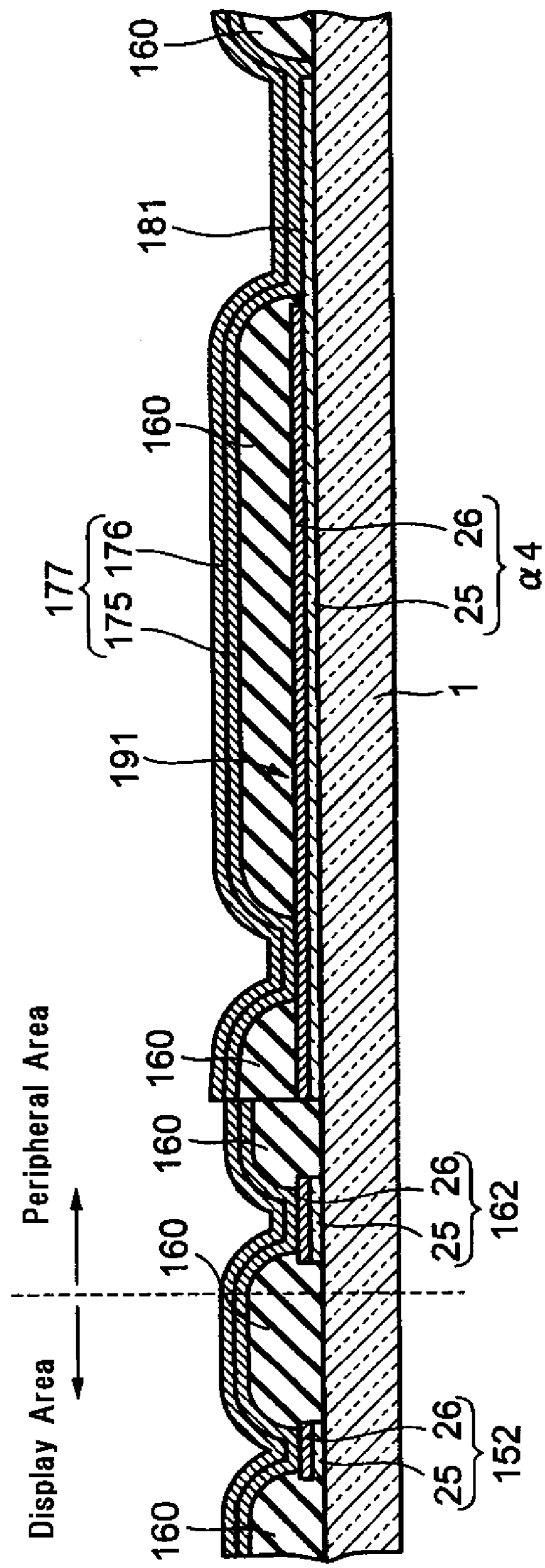
FIG. 66 is cross-sectional view of the substrate on which the conductive film 177 has been formed.
Figure 67:
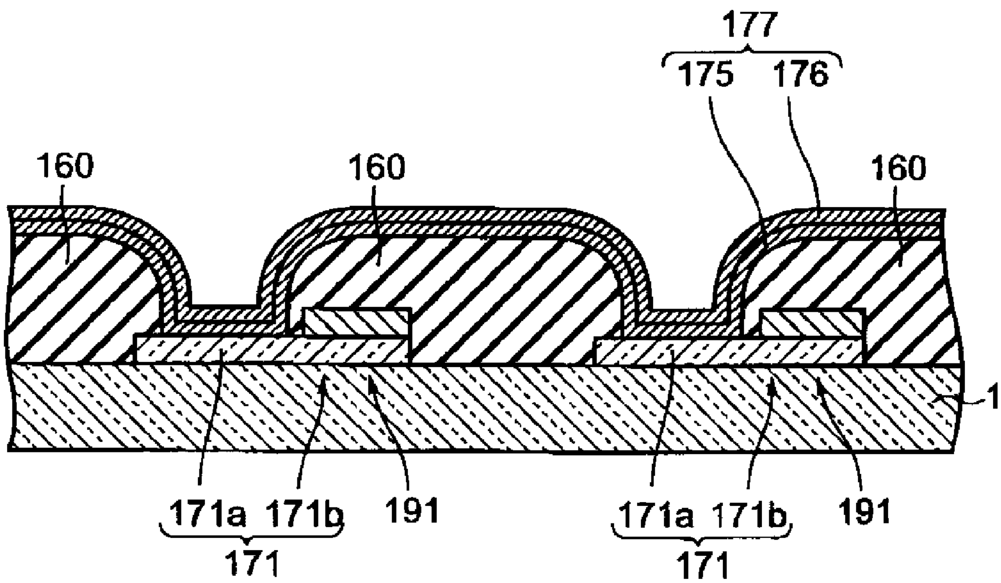
FIG. 67 is cross-sectional view of the substrate on which the conductive film 177 has been formed.

After the gate insulating film 160 comprising such holes 160*a* to 160*e* is formed, a conductive film is formed using material of the gate bus, the ESD trace and others (see FIGS. 66 and 67).

FIGS. 66 and 67 are cross-sectional views of the substrate on which the conductive film 177 has been formed. FIGS. 66 and 67 are cross-sectional views corresponding to FIGS. 64 and 65, respectively.

The conductive film 177 consists of a MoCr film 175 and an AlCu film 176. The MoCr film 175 consists of material having mainly Mo and having added Cr. The AlCu film 176 consists of material having mainly Al and having added Cu. After the MoCr film 175 and the AlCu film 176 are formed, the films 175 and 176 are patterned to form the gate bus and others (see FIGS. 68 and 69).

Figure 68:
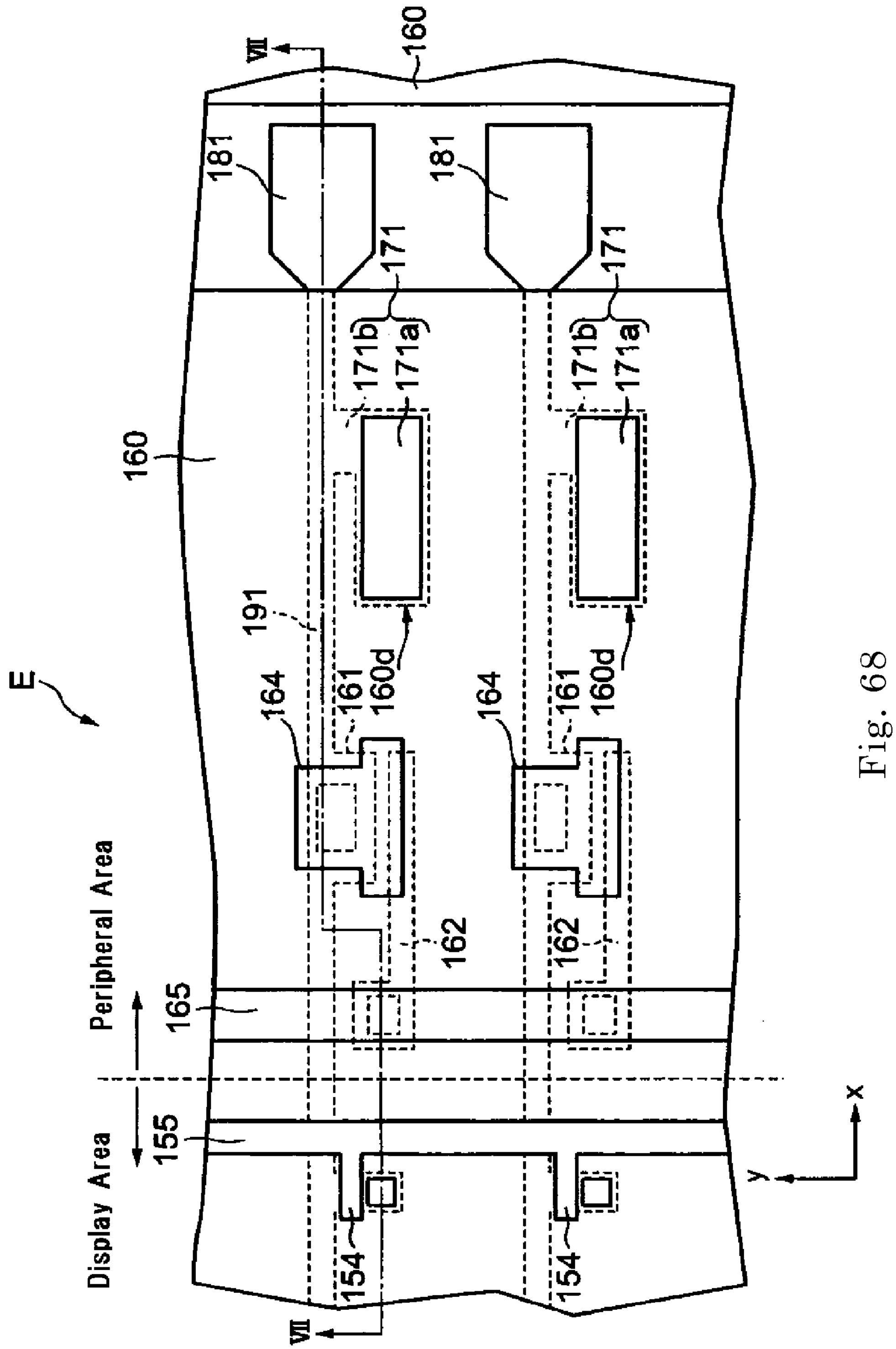
FIG. 68 is a plan view of a part of the substrate after the MoCr film 175 and the AlCu film 176 have been patterned.
Figure 69:
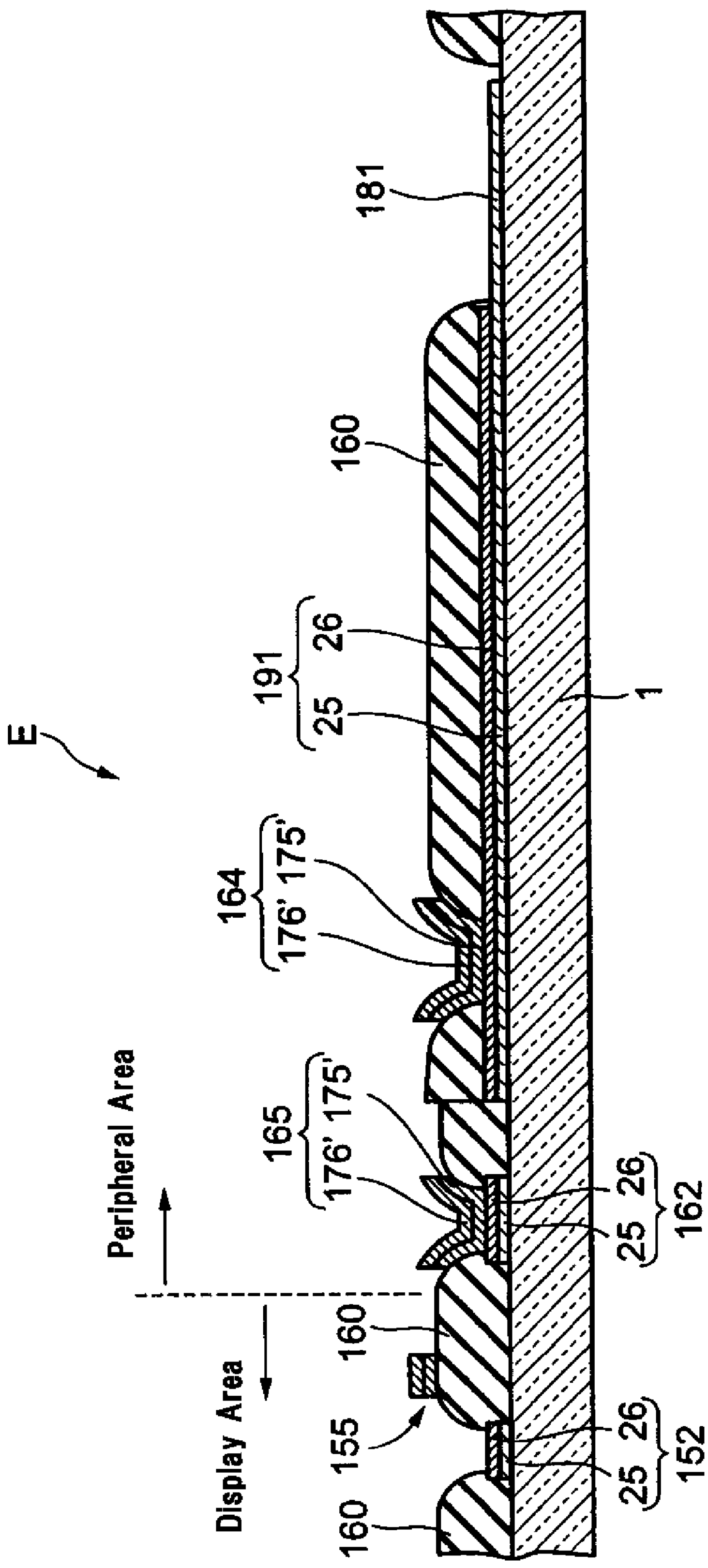
FIG. 69 is a cross-sectional view of the substrate, viewed in VII-VII direction in FIG. 68.

FIG. 68 is a plan view of a part of the substrate after the MoCr film 175 and the AlCu film 176 have been patterned. FIG. 69 is a cross-sectional view of the substrate, viewed in VII-VII direction in FIG. 68.

By wet-etching the AlCu film 176 and the MoCr film 175, the gate electrode of the TFT (referred below to as "TFT gate electrode") 154 and the gate bus 155 are formed on the display area, and the gate electrode of the ESD transistor (referred below to as "ESD gate electrode") 164 and the ESD trace 165 are formed on the peripheral area. The TFT gate electrode 154, the gate bus 155, the ESD gate electrode 164, and the ESD trace 165 have the double layer structure consisting of etched MoCr film 175' and AlCu film 176' (see FIG. 69). The gate bus 155 is formed so as to extend in the y direction as shown in FIG. 68. The gate electrode 154 is formed so as to be continuous with the gate bus 155. The ESD gate electrode 164 is connected to the source bus 191 through the hole 160*c* (see FIG. 64) of the gate insulating film 160. The ESD trance 165 is connected to the drain electrode 162 of the ESD transistor through the hole 160*b* (see FIG. 64) of the gate insulating film 160.

Further, by wet-etching the AlCu film 176 and the MoCr film 175, the source terminal 181 and the sacrificial electrode main portion 171*a* appear.

After the ESD gate electrode 164 and others are formed as described above, projections (see FIG. 70) of the underlying layer are formed, the underlying layer used for providing the reflective electrodes with the desired reflective electrode.

Figure 70:
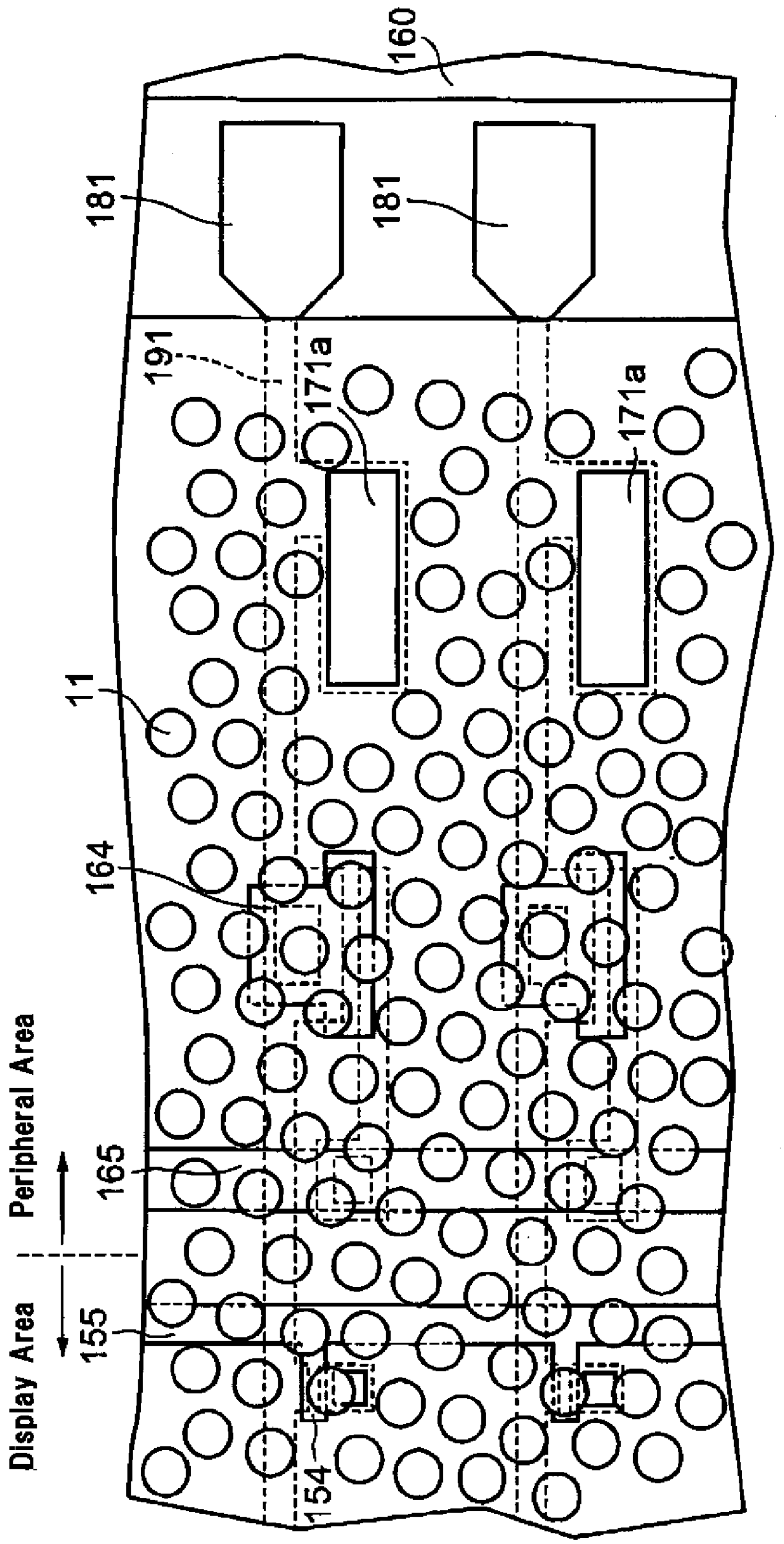
FIG. 70 is a plan view of a part of the substrate immediately after the projections 11 have been formed.

FIG. 70 is a plan view of a part of the substrate immediately after the projections 11 have been formed. It is noted that the projections 11 are shown by circles.

The projections 11 are formed by forming a photosensitive film on the substrate on which the ESD gate electrode 164 has been formed, and then by exposing the photosensitive film to light, developing and baking it in such a way that the projections 11 remain. During the developing step, unnecessary portion of the photosensitive film is removed. As a result of this, a portion of each of the TFT gate electrode 154, the gate bus 155, the ESD gate electrode 164, and the ESD trace 165 appears. Therefore, the TFT gate electrode 154, the gate bus 155, the ESD gate electrode 164, and the ESD trace 165 are temporarily immersed in the developer. Further, portions of the photosensitive film which cover the source terminal 181 and the sacrificial electrode main portion 171*a* are completely removed by the developer, so that the source terminal 181 and the sacrificial electrode main portion 171*a* are temporarily immersed in the developer. The TFT gate electrode 154, the gate bus 155, and the ESD trace 165 are not connected to the source terminal 181, but the ESD gate electrode 164 is connected to the source terminal 181 through the source bus 191. The ESD gate electrode 164 contains Al and Mo since the ESD gate electrode 164 consists of MoCr film 175' and AlCu film 176' (see FIG. 69). Further, the source terminal 181 electrically connected to the ESD gate electrode 164 contains $In_2O_3$. Since the magnitude relationship among equilibrium electrode potentials of Al, Mo and $In_2O_3$ is represented by an equation (4), Al has the smallest equilibrium electrode potential and $In_2O_3$ has the largest equilibrium electrode potential. It is therefore considered that cell reactions represented by reaction formulas (5) and (6) (the reaction formulas (5) and (6) are referred to in the explanation of FIG. 16) occur when the ESD gate electrode 164 and the source terminal 181 temporarily become immersed in the developer. The reaction formulas (5) and (6) are again described below.

$$Al \rightarrow Al^{3+} + 3e- \quad (5)$$

$$In_2O_3 + 6e- + 3H_2O \rightarrow 2In + 6OH— \quad (6)$$

Since Al has the smaller equilibrium electrode potential than that of $In_2O_3$, it is considered that, in the AlCu film 176' of the ESD gate electrode 164, the reaction formula (5) representing the emission of the electrons (e−) occurs on a priority base. Most of the emitted electrons flow toward the source terminal 181 via the source bus 191, but the sacrificial electrode 171 consisting of the same material as the source terminal 181 is formed on the way. It is therefore considered that most of the electrons do not flow into the source terminal 181 but flow into the sacrificial electrode 171, and thus the sacrificial electrode 171 is damaged because of the reaction formula (6) but the gate terminal 6 is less susceptible to damage.

As described above, since not only the source terminal 181 but also the sacrificial electrode main portion 171*a* appears in the fourth embodiment, the sacrificial electrode 171 is damaged instead of the source terminal 181. However, the sacrificial electrode 171 itself dose not participate in the circuit operation of the TFT array substrate 400 at all. Therefore, the circuit operation of the TFT array substrate 400 is not affected even if the sacrificial electrode 171 is damaged. Further, since the sacrificial electrode 171 is damaged instead of the source terminal 181, the source terminal 181 is less liable to be damaged and thus can have lower resistance. Therefore, the formation of sacrificial electrode 171 can lead to the lower resistance of the source terminal 181, and the operation of the TFT array substrate 400 is not affected.

In the above explanation, it is described that the cell reaction between the AlCu film 176' of the ESD gate electrode 164 and the source terminal 181 ($In_2O_3$) become less liable to occur by means of the sacrificial electrode 171. Now, the effect of the sacrificial electrode 171 on a cell reaction between the AlCu film 176' of the ESD gate electrode 164 and the MoCr film 175' will be also discussed. The reaction formulas (2) and (3) (the cell reaction between Al and Mo) may occur between the AlCu film 176' and the MoCr film 175'. However, as shown in the equation (4), Mo has the smaller equilibrium electrode potential than that of $In_2O_3$. Therefore, the cell reaction between the AlCu film 176' and the MoCr film 175' (the reaction formulas (2) and (3)) is less liable to occur than the cell reaction between the AlCu film 176' and the sacrificial electrode 171 ($In_2O_3$) (the reaction formulas (5)

and (6)). That is to say, the reaction formulas (2) and (3) between the MoCr film 175' and the AlCu film 176' become less liable to occur since the MoCr film 175' and the AlCu film 176' are electrically connected to the sacrificial electrode 171. Therefore, the phenomenon in which the material of the projections 11 is removed more than necessary because of the reaction formulas (2) and (3) can be less liable to occur.

After the projections 11 are formed as shown in FIG. 70, the planarization film 12 is formed (see FIGS. 57 to 59). In this way, the underlying layer consisting of the projections 11 and the planarization film 12 is formed. After the underlying layer is formed, the reflective electrodes 13 are formed (see FIGS. 57 to 59). In this way, the TFT array substrate 400 is manufactured.

In the fourth embodiment, the sacrificial electrode 171 which dose not participate in the circuit operation of the TFT array substrate 300 at all is electrically connected to the ESD gate electrode 164 through the source bus 191, so that the sacrificial electrode 171 is damaged by the reaction formula (6) instead of the source terminal 181. Therefore, the source terminal 181 is efficiently prevented from being damaged, so that the gate terminal 6 can have the lower resistance.

In the example described above, in order that the sacrificial electrode main portion 171*a* of the sacrificial electrode 171 can appear before the projections 11 are formed, the substrate from the surface of which the sacrificial electrode main portion 171*a* of the sacrificial electrode 171 is appearing is manufactured by using the method described with respect to FIGS. 60 to 69. However, even if different methods are used the sacrificial electrode main portion 171*a* of the sacrificial electrode 171 can appear before the projections 11 are formed. One of the different methods is described below with respect to FIGS. 71 to 83.

Figure 71:
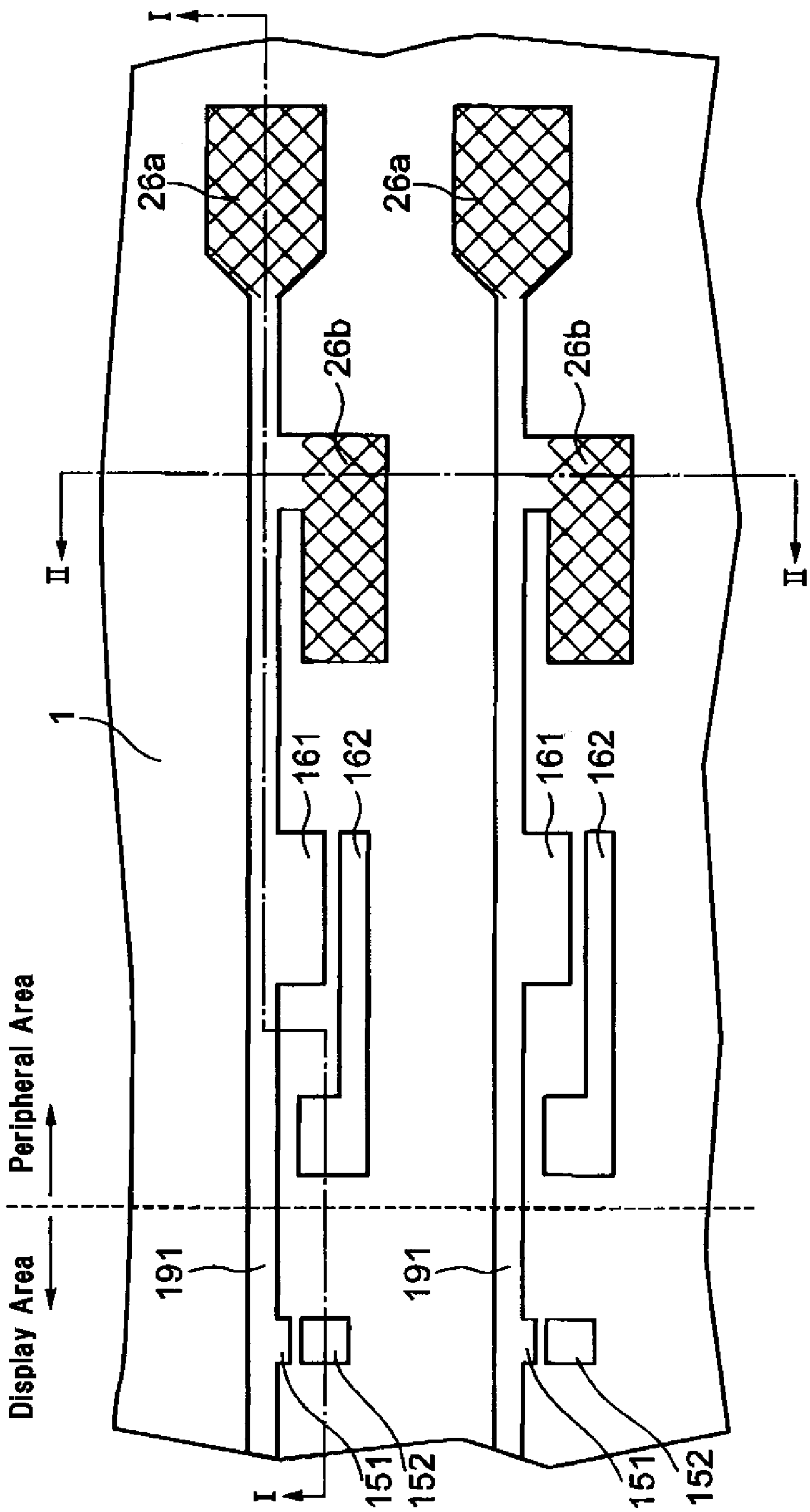
FIG. 71 is a plan view of a portion of the substrate on which the source bus 191 and others have been formed.
Figure 72:
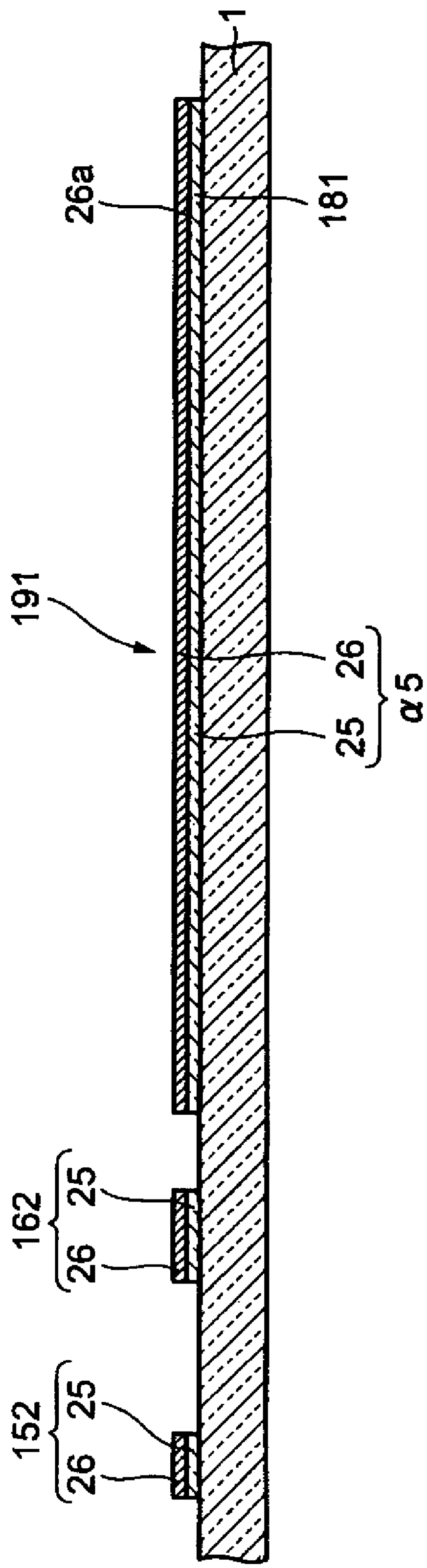
FIG. 72 is a cross-sectional view of the substrate, viewed in I-I direction in FIG. 71.
Figure 73:
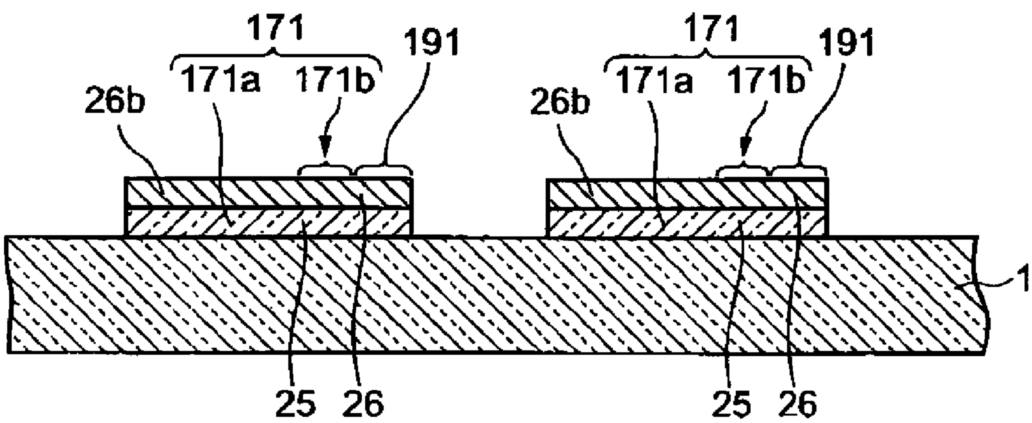
FIG. 73 is a cross-sectional view of the substrate, viewed in II-II direction in FIG. 71.

FIG. 71 is a plan view of a portion of the substrate on which the source bus 191 and others have been formed. FIG. 72 is a cross-sectional view of the substrate, viewed in I-I direction in FIG. 71. FIG. 73 is a cross-sectional view of the substrate, viewed in II-II direction in FIG. 71.

On the display area of the substrate 1 are formed, the source electrode 151 and the drain electrode 152 of the TFT. On the peripheral area are formed, the source electrode 161 and the drain electrode 162 of the ESD transistor, the sacrificial electrode 171, and the source terminal 181. The source bus 191 is formed over the display area and the peripheral area. The source bus 191 and others are formed by forming double layer films of ITO film/MoCr film on the substrate 1 and then patterning the ITO film and the MoCr film in the same shape. For this reason, the source terminal 181 is covered with a portion 26*a* of the MoCr portion 26 (the portion 26*a* is shown by cross hatching in FIG. 71), and the sacrificial electrode 171*a* is covered with a portion 26*b* of the MoCr portion 26 (the portion 26*b* is also shown by cross hatching in FIG. 71). However, the portions 26*a* and 26*b* of the MoCr portion 26 are not required for the source terminal 181 and the sacrificial electrode main portion 171*a*, so that the portion 26*a* of the MoCr portion 26 (which is referred below to as "MoCr unnecessary portion 26*a*") and the portion 26*b* of the MoCr portion 26 (which is referred below to as "MoCr unnecessary portion 26*b*") must be removed. However, if we try to remove the MoCr unnecessary portions 26*a* and 26*b* from structure shown in FIGS. 71 to 73, special photolithographic steps for removing the MoCr unnecessary portions 26*a* and 26*b* are required, this increases the number of manufacturing steps. Therefore, in order to manufacture the TFT array substrate without increasing the number of manufacturing steps, an a-Si layer and a gate insulating film are formed without removing the MoCr unnecessary portions 26*a* and 26*b* at once (see FIGS. 74 to 83). It is noted that a double layer structure α5 (see FIG. 72) consisting of the ITO portion 25 and the MoCr portion 26 forms the source bus 191, the source terminal 181, the sacrificial electrode 171, and the MoCr unnecessary portions 26*a* and 26*b*.

Figure 74:
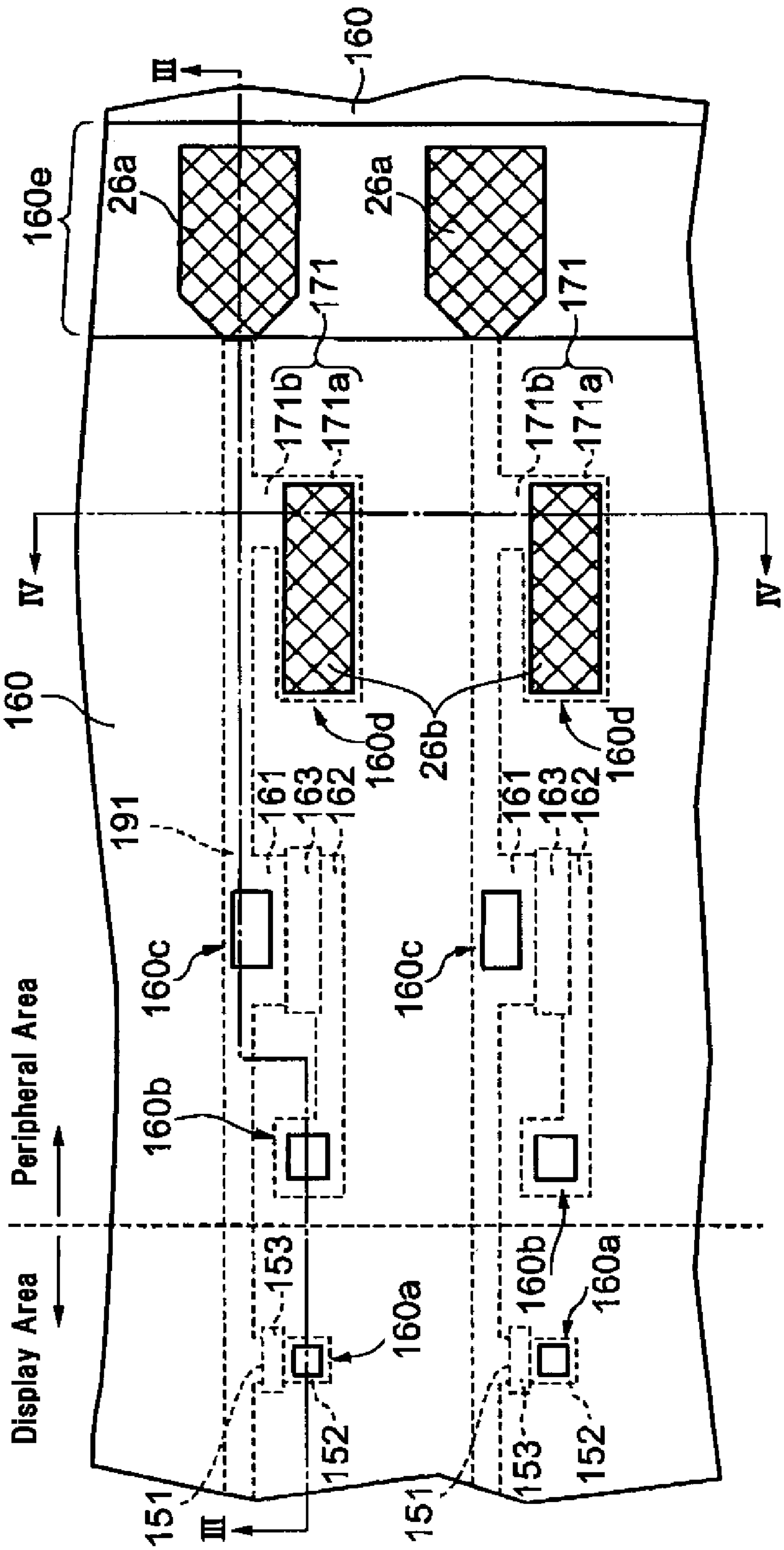
FIG. 74 is a plan view of a part of the substrate on which the a-Si layers 153 and 163 and the gate insulating film 160 have been formed.
Figure 75:
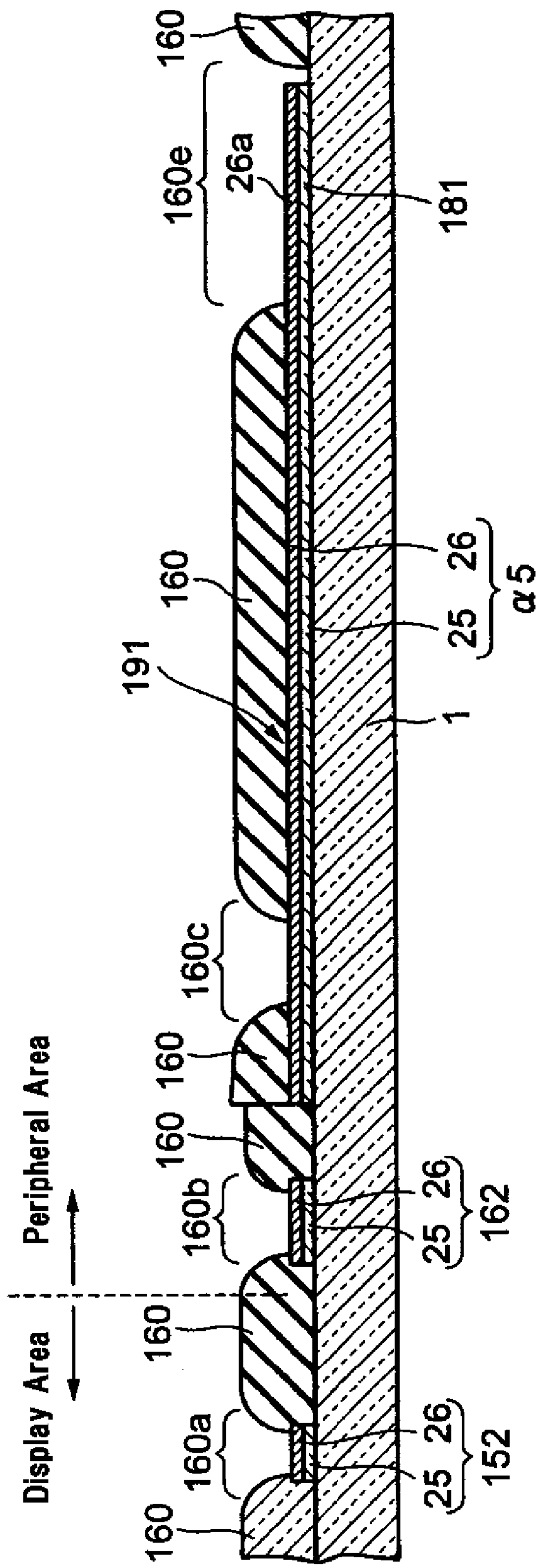
FIG. 75 is a cross-sectional view of the substrate, viewed in III-III direction in FIG. 74.
Figure 76:
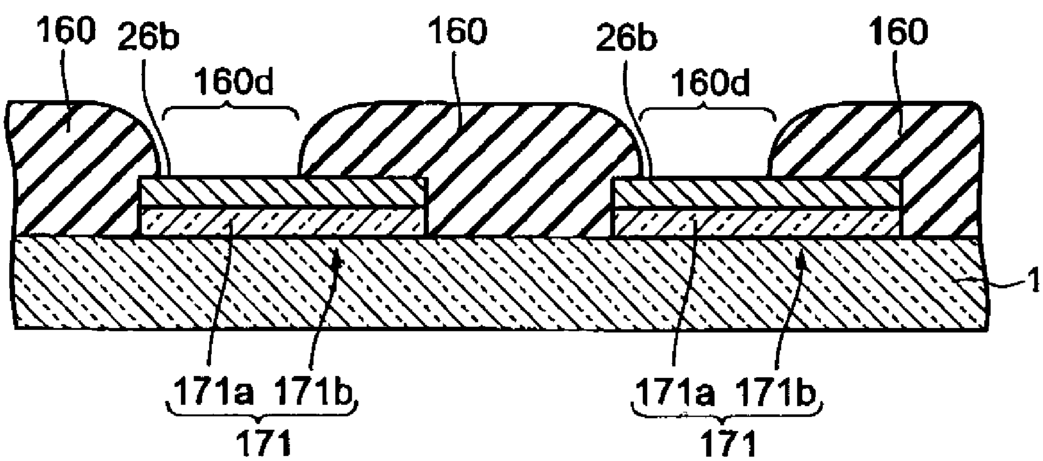
FIG. 76 is a cross-sectional view of the substrate, viewed in IV-IV direction in FIG. 74.

FIG. 74 is a plan view of a part of the substrate on which the a-Si layers 153 and 163 and the gate insulating film 160 have been formed. FIG. 75 is a cross-sectional view of the substrate, viewed in III-III direction in FIG. 74. FIG. 76 is a cross-sectional view of the substrate, viewed in IV-IV direction in FIG. 74.

The a-Si layer 153 is formed on the display area between the source electrode 151 and the drain electrode 152 of the TFT. The a-Si layer 163 is formed on the peripheral area between the source electrode 161 and the drain electrode 162 of the ESD transistor. After the a-Si layers 153 and 163 are formed, the gate insulating film 160 is formed on the substrate 1 on which the a-Si layers 153 and 163 have been formed. The gate insulating film 160 comprises holes 160*a*, 160*b*, 160*c*, 160*d*, and 160*e*. The hole 160*a* is to expose the drain electrode 152 from the surface of the gate insulating film 160. The hole 160*b* is to expose the drain electrode 162 of the ESD transistor from the surface of the gate insulating film 160. The hole 160*c* is to expose the source bus 191 from the surface of the gate insulating film 160. The hole 160*d* is to expose the MoCr unnecessary portion 26*b* covering the sacrificial electrode main portion 171*a* from the surface of the gate insulating film 160. The hole 160*e* is to expose the MoCr unnecessary portion 26*a* covering the source terminal 181 from the surface of the gate insulating film 160.

Figure 77:
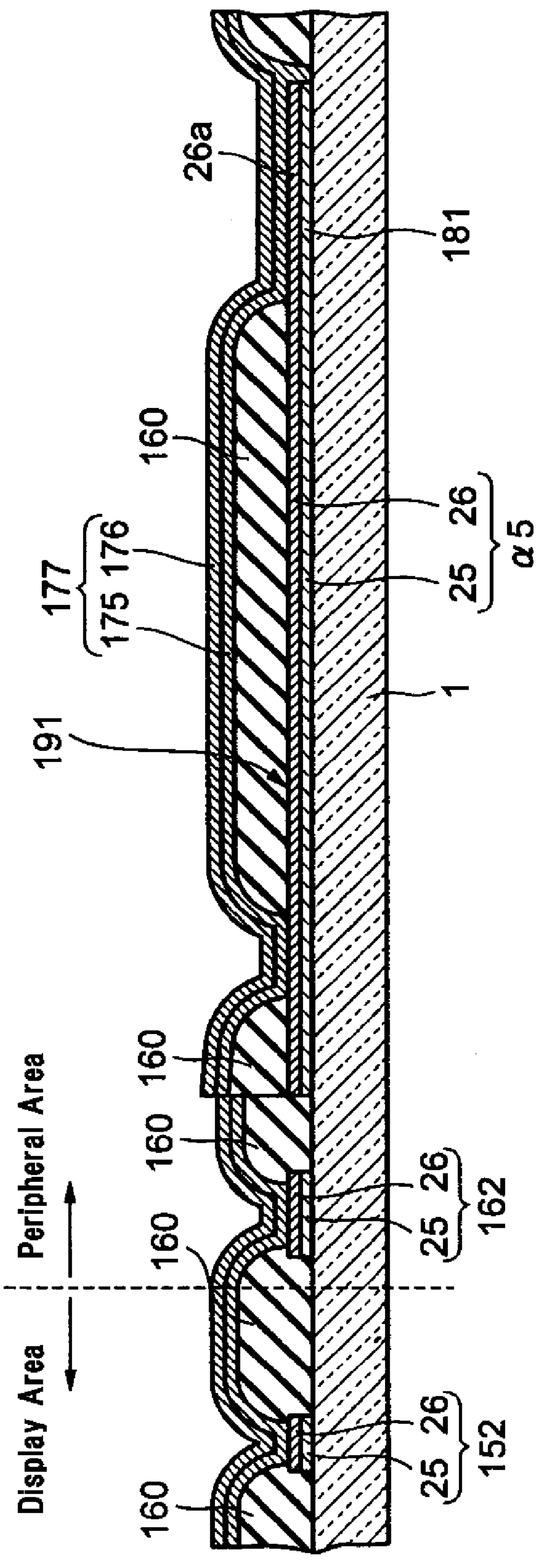
FIG. 77 is a cross-sectional view of the substrate on which the conductive film 177 has been formed.
Figure 78:
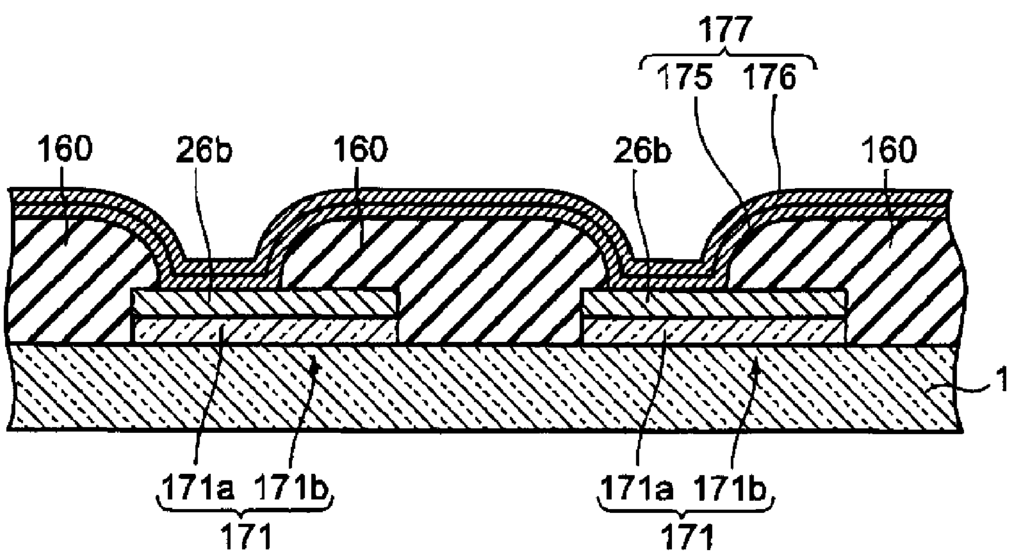
FIG. 78 is a cross-sectional view of the substrate on which the conductive film 177 has been formed.

After the gate insulating film 160 having such holes 160*a* to 160*e* is formed, a conductive film is formed using material of the gate bus and others (see FIGS. 77 and 78).

FIGS. 77 and 78 are cross-sectional views of the substrate on which the conductive film 177 has been formed. FIG. 77 is a cross-sectional view corresponding to FIG. 75. FIG. 78 is a cross-sectional view corresponding to FIG. 76.

The conductive film 177 has a double layer structure of a MoCr film 175 and an AlCu film 176. After the conductive film 177 of the AlCu film 176/the MoCr film 175 are formed, the conductive film 177 is patterned by photolithographic technology (see FIGS. 79 to 81).

Figure 79:
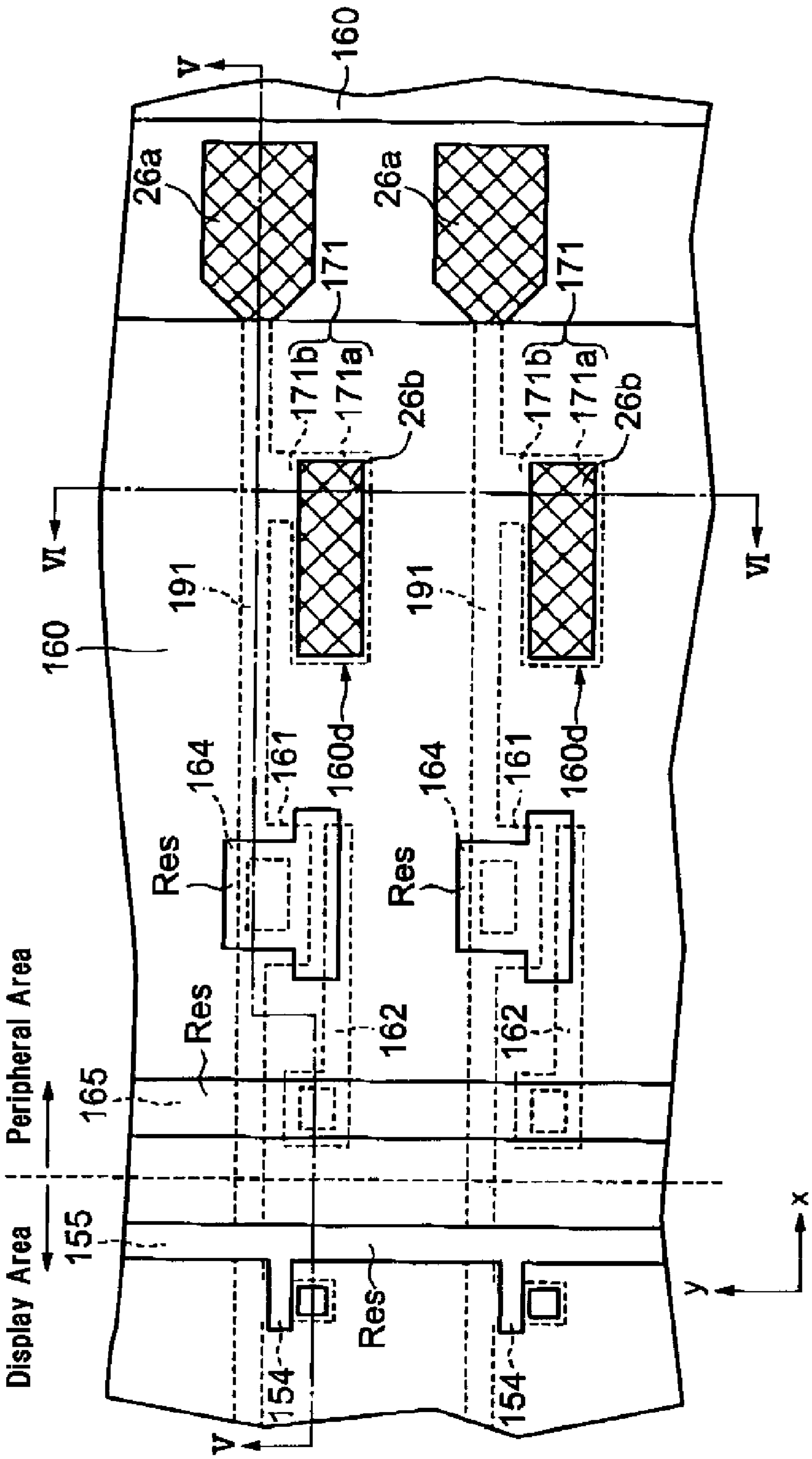
FIG. 79 is a plan view of a part of the substrate after the conductive film 177 has been patterned.
Figure 80:
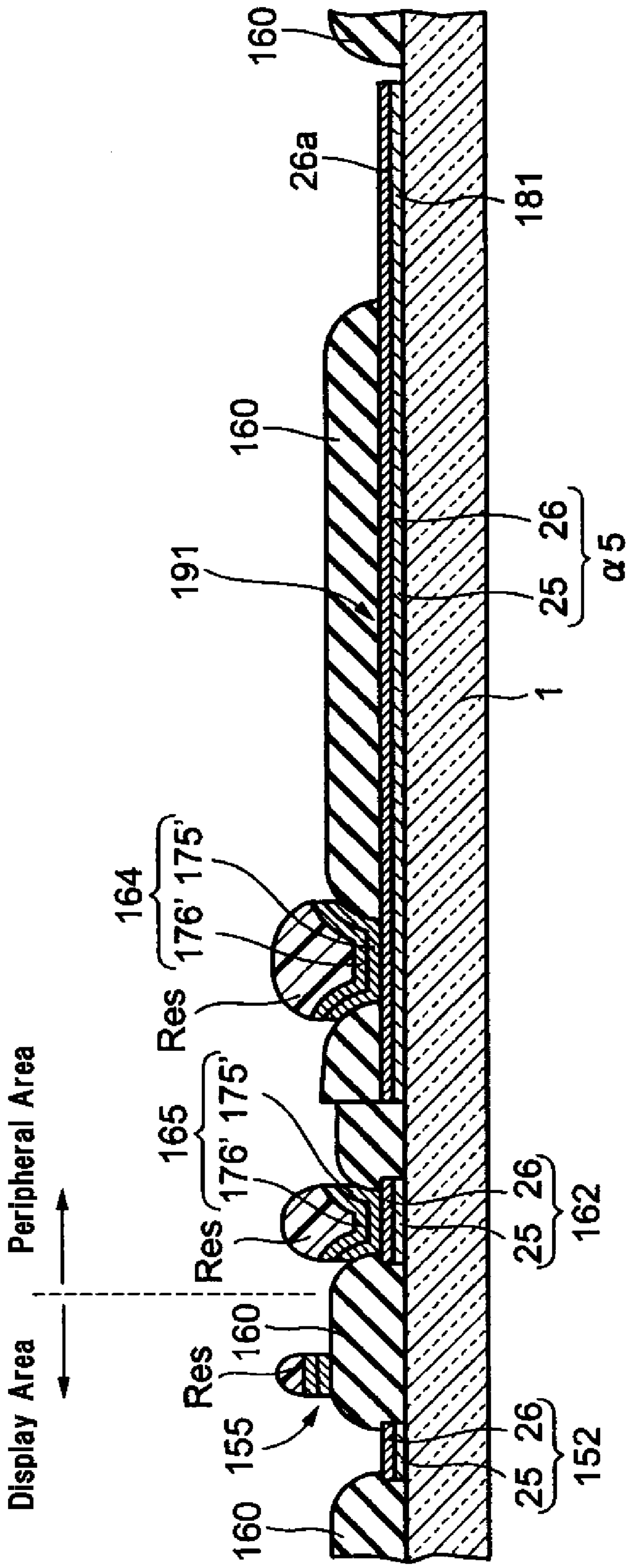
FIG. 80 is a cross-sectional view of the substrate, viewed in V-V direction in FIG. 79.
Figure 81:
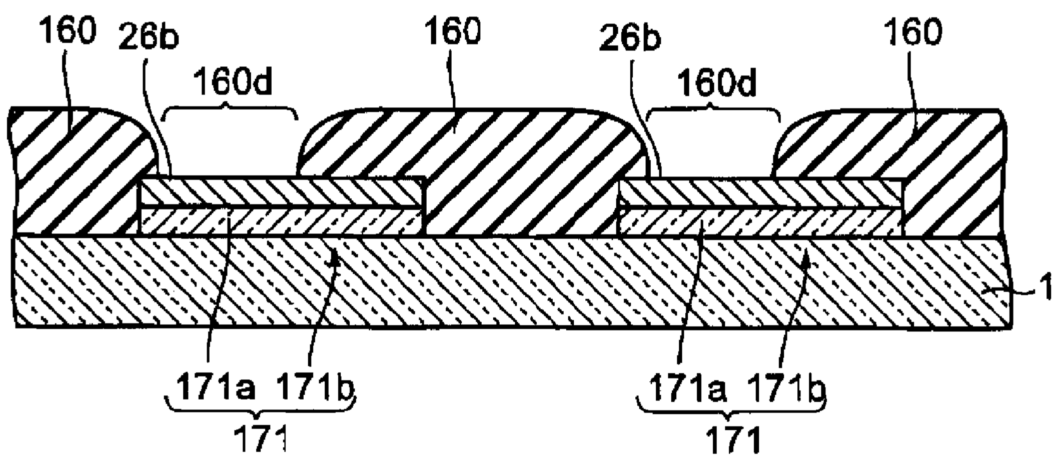
FIG. 81 is a cross-sectional view of the substrate, viewed in VI-VI direction in FIG. 79.

FIG. 79 is a plan view of a part of the substrate after the conductive film 177 has been patterned. FIG. 80 is a cross-sectional view of the substrate, viewed in V-V direction in FIG. 79. FIG. 81 is a cross-sectional view of the substrate, viewed in VI-VI direction in FIG. 79.

The conductive film 177 is wet-etched. Portions of the conductive film 177 covered with resist films Res remain without removing, but portions of the conductive film 177 non-covered with resist films Res are removed. As a result of this, the TFT gate electrode 154, the gate bus 155, the ESD trace 165, and the ESD gate electrode 164 are formed under the resist films Res, and the MoCr unnecessary portions 26*a* and 26*b* appear. It is noted that the source terminal 181 is covered with the MoCr unnecessary portion 26*a* and that the sacrificial electrode main portion 171*a* is covered with the MoCr unnecessary portion 26*b*. Since the MoCr unnecessary portion 26*a* is not required for the source terminal 181, the MoCr unnecessary portion 26*a* must be removed. On the other hand, the MoCr unnecessary portion 26*b* also must be removed since the sacrificial electrode main portion 171*a* must be appearing as described with respect to FIG. 70 in order that the sacrificial electrode 171 can function so as to prevent the source terminal 181 from being damaged. For this reason, after the conductive film 177 is wet-etched, the MoCr unnecessary portions 26*a* and 26*b* also are wet-etched (see FIGS. 82 and 83).

Figure 82:
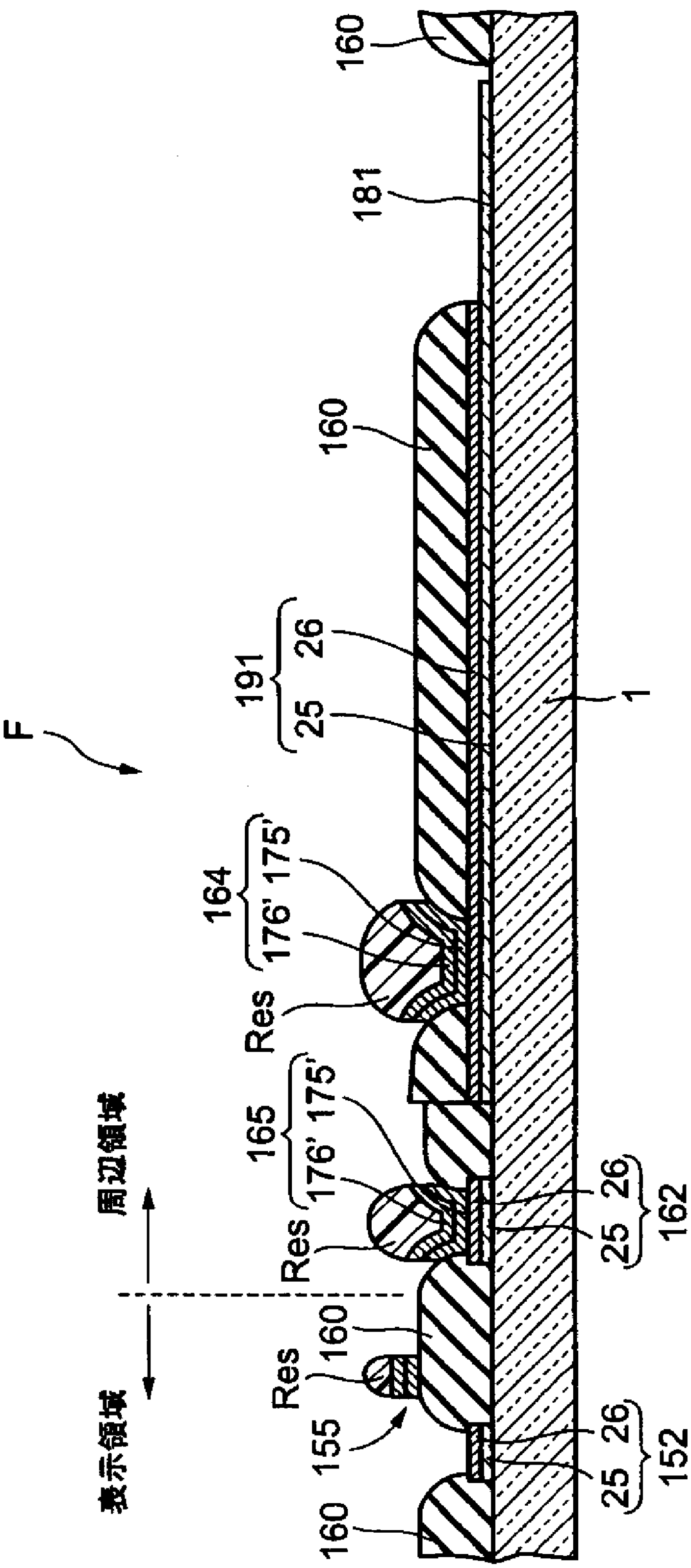
FIG. 82 is a cross-sectional view of the substrate after the MoCr unnecessary portions 26*a* and 26*b* have been wet-etched.
Figure 83:
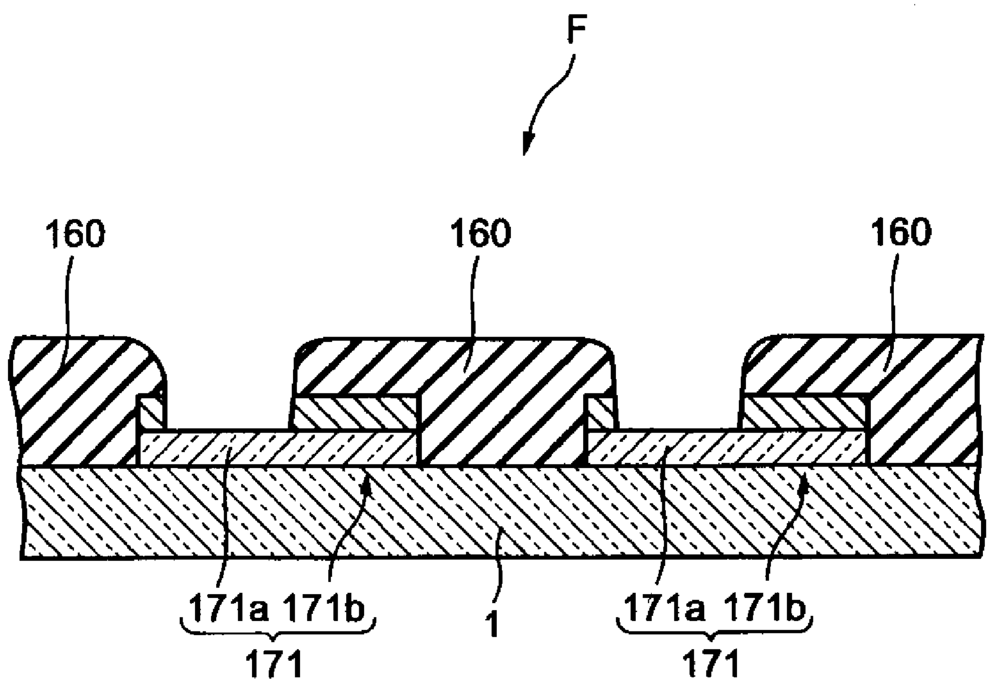
FIG. 83 is a cross-sectional view of the substrate after the MoCr unnecessary portions 26*a* and 26*b* have been wet-etched.

FIGS. 82 and 83 are cross-sectional views of the substrate after the MoCr unnecessary portions 26*a* and 26*b* have been wet-etched. FIG. 82 is a cross-sectional view corresponding to FIG. 80. FIG. 83 is a cross-sectional view corresponding to FIG. 80.

The MoCr unnecessary portions 26*a* and 26*b* are wet-etched after the MoCr film 175 of the conductive film 177 is etched. This removes the MoCr unnecessary portions 26*a* and 26*b*, so that a conductive portion possessor F is manufactured. The source terminal 181 and the sacrificial electrode main portion 171*a* are exposed from the surface of the possessor F. By etching the MoCr unnecessary portions 26*a* and 26*b* as described above, the source terminal 181 and the sacrificial electrode main portion 171*a* appear without special photolithographic steps for removing the MoCr unnecessary portions 26*a* and 26*b*. After the MoCr unnecessary portions 26*a* and 26*b* are removed, the resist films Res are removed.

After the resist films Res are removed, the underlying layer and the reflective electrodes are formed.

In this embodiment, the sacrificial electrode main portion 171*a* is still being covered with the MoCr unnecessary portion 26*b* immediately after the conductive film 177 is etched (i.e. immediately after the ESD gate electrode 164 and others are formed) (see FIG. 81), but the MoCr unnecessary portion 26*b* is subsequently etched following the etching of the conductive film 177. Therefore, the sacrificial electrode main portion 171*a* can appear before the projections 11 of the underlying layer are formed, so that the source terminals 181 can be less susceptible to damage.

Further, in the fourth embodiment, the example in which ITO is used as the material of the source terminal 181 is described. However, according to the present invention, even if e.g. IZO is used instead of ITO, the phenomenon in which the material of the projections 11 is removed more than necessary is less liable to occur and the source terminals 181 are less susceptible to damage.

Embodiment 5

Figure 84:
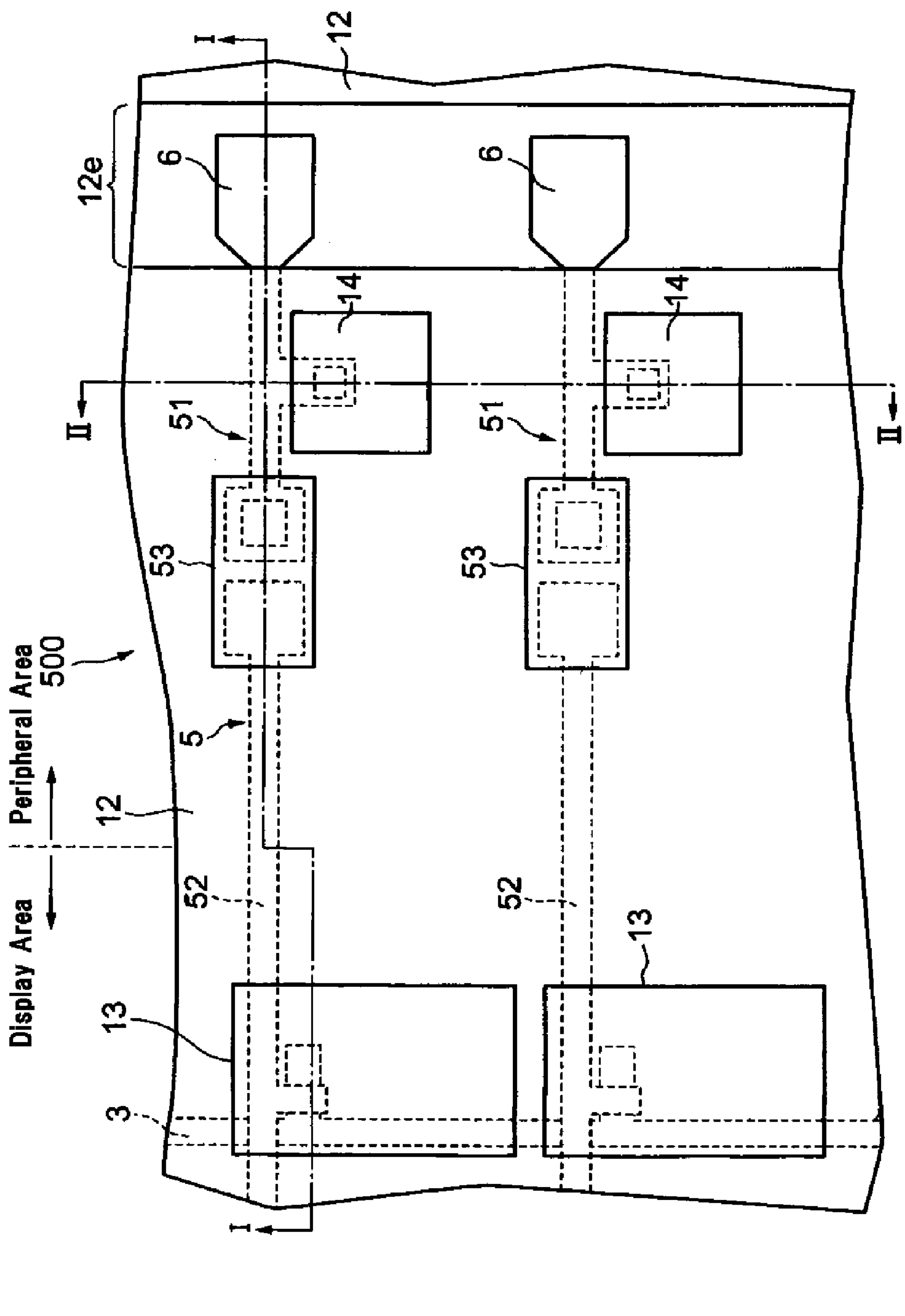
FIG. 84 is a plan view of a portion of a TFT array substrate 500 of a fifth embodiment according to the present invention, the TFT array substrate 500 used in a reflective liquid crystal display device of top gate type.
Figure 85:
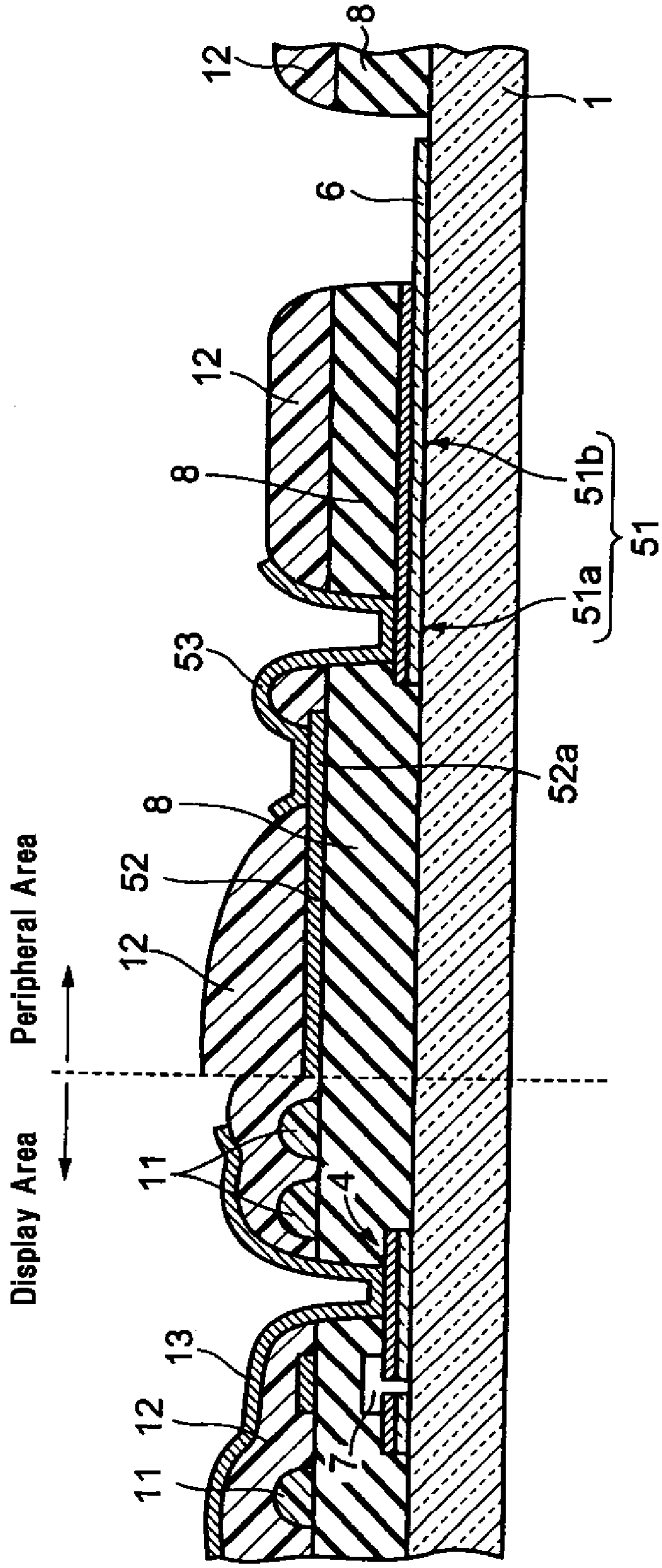
FIG. 85 is a cross-sectional view of the substrate 500, viewed in I-I direction in FIG. 84.
Figure 86:
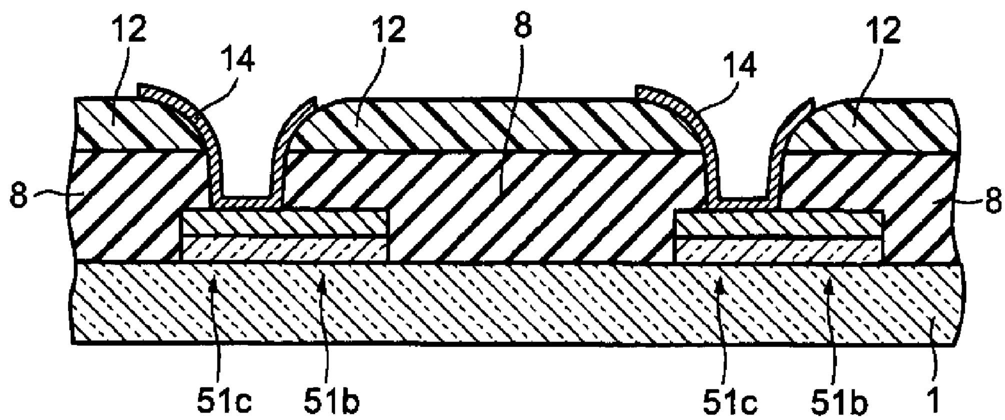
FIG. 86 is a cross-sectional view of the substrate 500, viewed in II-II direction shown in FIG. 84.

FIG. 84 is a plan view of a portion of a TFT array substrate 500 of a fifth embodiment according to the present invention, the TFT array substrate 500 used in a reflective liquid crystal display device of top gate type. FIG. 85 is a cross-sectional view of the substrate 500, viewed in I-I direction in FIG. 84. FIG. 86 is a cross-sectional view of the substrate 500, viewed in II-II direction shown in FIG. 84.

The left side of FIG. 84 is a display area on which TFTs, reflective electrodes 13 and others are formed. The right side of FIG. 84 is a peripheral area on which gate terminals 6 are formed. It is noted that, for the sake of convenience, the display area and the peripheral area are schematically illustrated.

A method of manufacturing the TFT array substrate 500 is described below.

Figure 87:
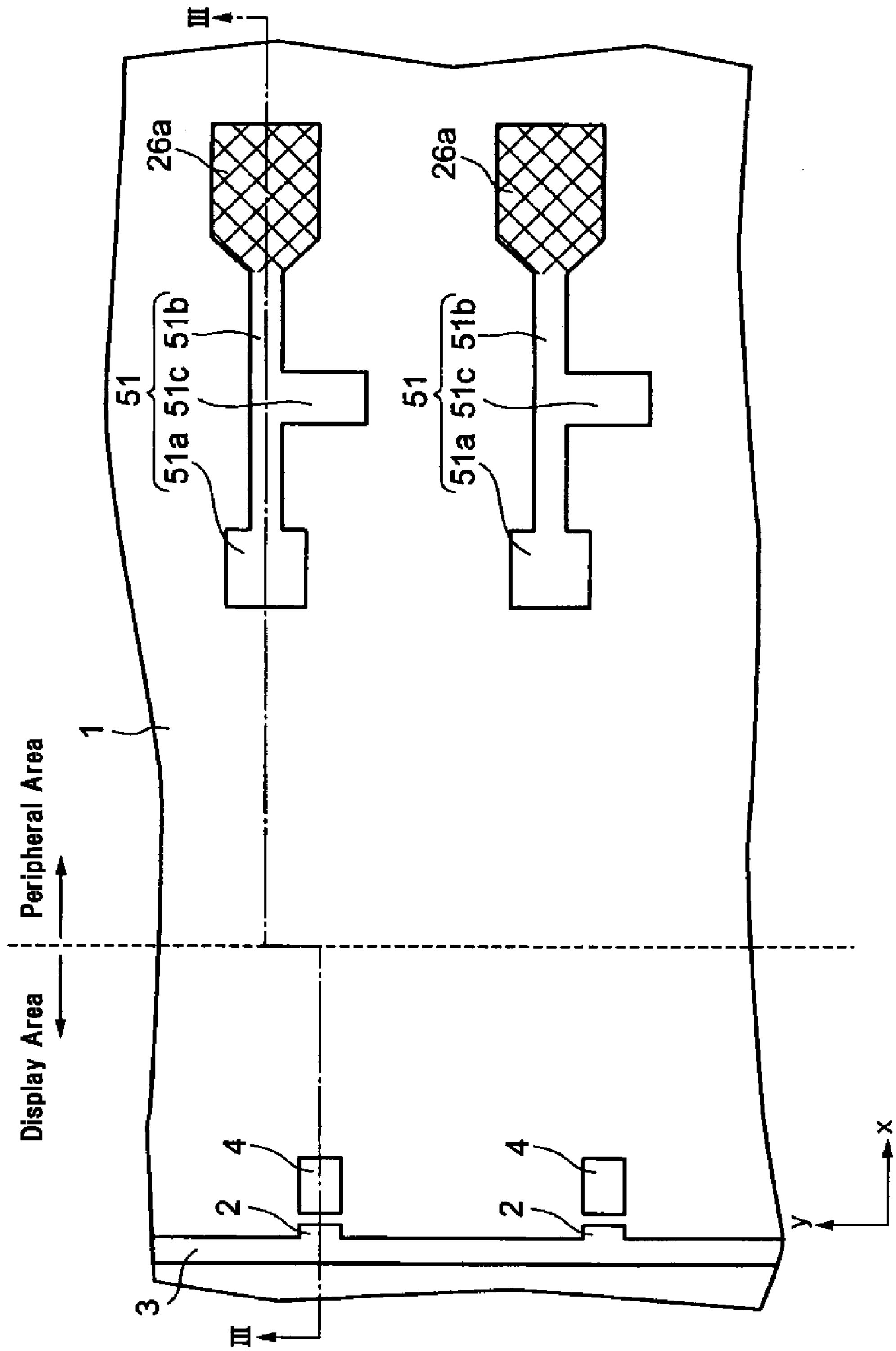
FIG. 87 is a plan view of a part of the substrate on which the gate terminal 6 and others have been formed.
Figure 88:
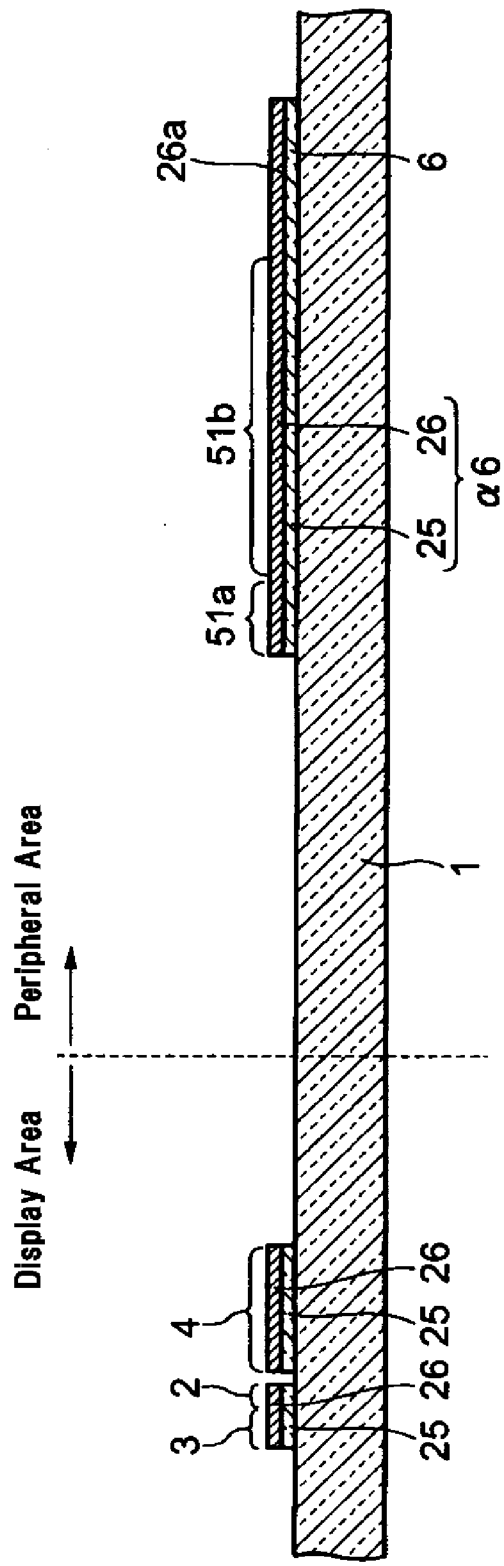
FIG. 88 is a cross-sectional view of the substrate, viewed in III-III direction in FIG. 87.

First, formed on a glass substrate 1 are source electrodes 2, source buses 3, drain electrodes 4, gate bus end portions 51, and gate terminals 6 (see FIGS. 87 and 88).

FIG. 87 is a plan view of a part of the substrate on which the gate terminal 6 and others have been formed. FIG. 88 is a cross-sectional view of the substrate, viewed in III-III direction in FIG. 87.

Formed on the display area are the source electrode 2, the source bus 3, and drain electrode 4. The source bus 3 is formed so as to extend in y direction. The source electrode 2 is formed so as to be continuous with the source bus 3. Formed on the peripheral area are the gate bus end portion 51 and the gate terminal 6. The gate terminal 6 is formed so as to be continuous with the gate bus end portion 51. The gate bus end portion 51 comprises first and second connection portions 51*a* and 51*c*, and an extending portion 51*b*. The first connection portion 51*a* is connected to a gate bus linking portion 53 described later (see FIGS. 98 and 99). The second connection portion 51*c* is connected to a sacrificial electrode 14 described later (see FIGS. 98 and 100). The extending portion 51*b* extends from the connection portions 51*a* and 51*c* to the gate terminal 6. The source electrode 2, the source bus 3, the drain electrode 4, and the gate bus end portion 51 are double layer structure consisting of an ITO portion 25 and a MoCr portion 26. The ITO portion 25 contains ITO and the MoCr portion 26 contains MoCr. The source electrode 2, the source bus 3, the drain electrode 4, and the gate bus end portion 51 having such double layer structure are formed by forming double layer films of MoCr film/ITO film on the substrate 1 and then patterning the double layer films. In case where the gate bus end portion 51 and others are the double layer structure consisting of the ITO portion 25 and the MoCr portion 26 instead of a single layer structure of the ITO portion 25, the gate bus end portion 51 and others can have lower resistance. The connection portion 51*a* of the gate bus end portion 51 is the double layer structure consisting of the ITO portion 25 and the MoCr portion 26 in the fifth embodiment, but may be a single layer structure of only ITO portion 25. Even if the connection portion 51*a* of the gate bus end portion 51 is the single layer structure of only ITO portion 25, the gate bus end portion 51 itself can have the lower resistance under the condition that the extending portion 51*b* of the gate bus end portion 51 is the double layer structure consisting of the ITO portion 25 and the MoCr portion 26. However, the gate bus end portion 51 and others may be the single layer structure of only ITO portion 25 as long as the gate bus end portion 51 and others can have the sufficient lower resistance.

The gate terminal 6 is formed so as to be continuous with the gate bus end portion 51, it is however noted that the gate terminal 6 is covered with a portion 26*a* of the MoCr portion 26 (see cross-hatched portions in FIG. 87). The portion 26*a* of the MoCr portion 26 is not required for the gate terminal 6 (the portion 26*a* of the MoCr portion 26 is referred below to as "MoCr unnecessary portion 26*a*"), so that the MoCr unnecessary portion 26*a* must be removed. However, if we try to remove the MoCr unnecessary portion 26*a* from structure shown in FIGS. 87 and 88, special photolithographic steps for removing the MoCr unnecessary portion 26*a* are required, this increases the number of manufacturing steps. Therefore, in order to manufacture the TFT array substrate without increasing the number of manufacturing steps, an a-Si layer and others are formed without removing the MoCr unnecessary portion 26*a* at once. It is noted that a double layer structure α6 (see FIG. 88) consisting of the ITO portion 25 and the MoCr portion 26 forms the gate bus end portion 51, the gate terminal 6, and the MoCr unnecessary portion 26*a*.

Figure 89:
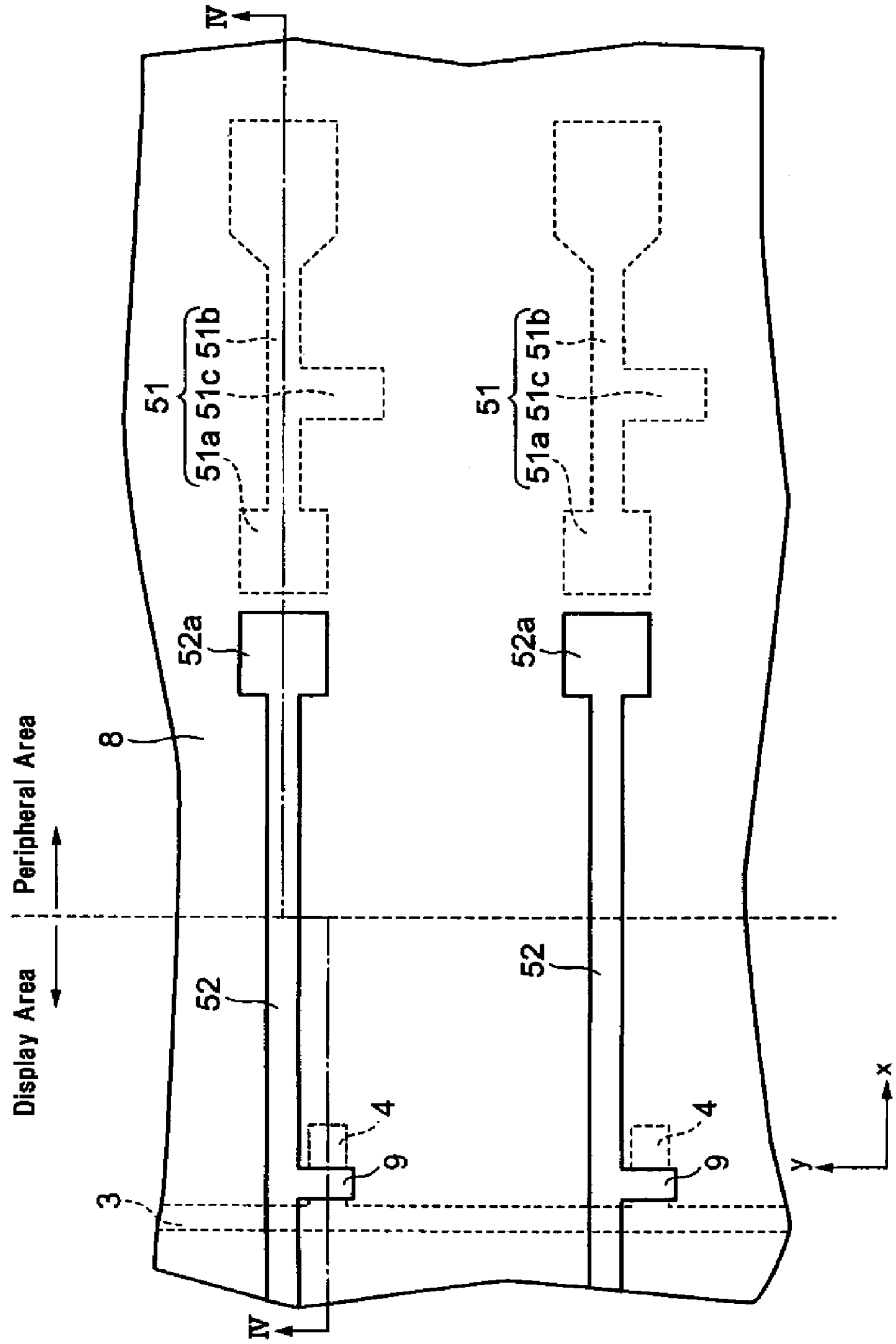
FIG. 89 is a plan view of a part of the substrate on which the a-Si layer 7, the gate insulating film 8, the gate electrode 9, and the gate bus main portion 52 have been formed.
Figure 90:
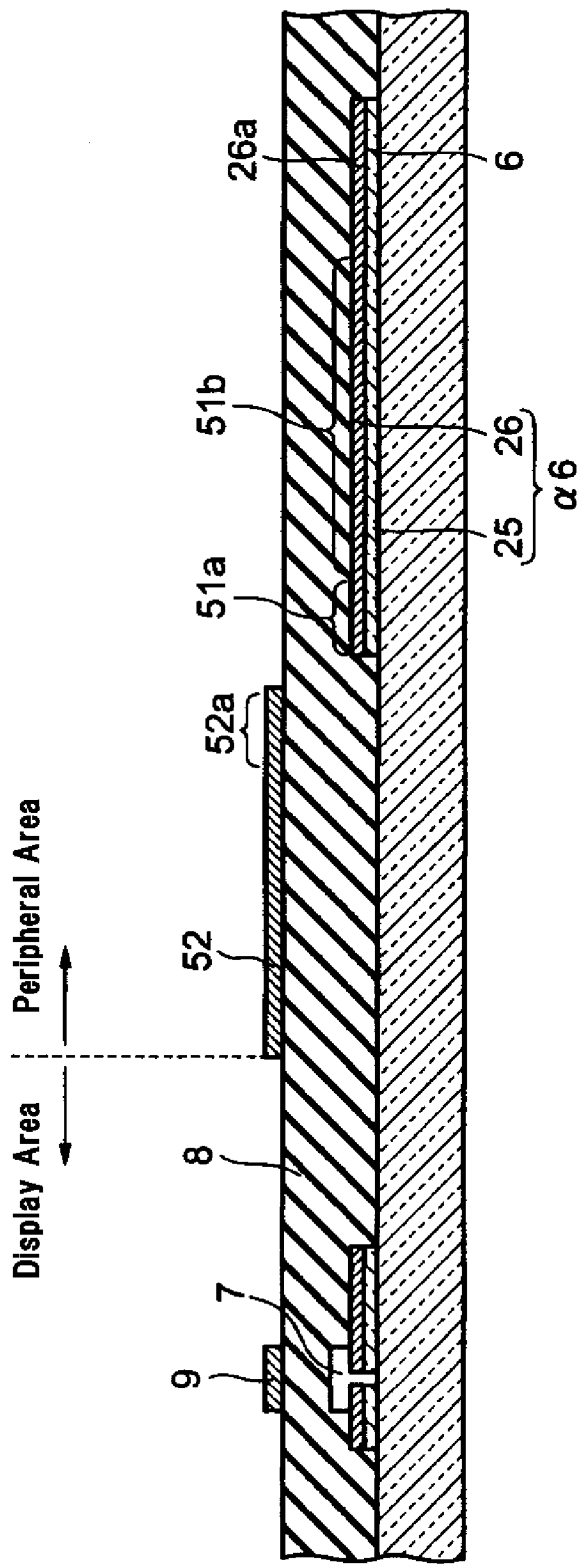
FIG. 90 is a cross-sectional view of the substrate, viewed in IV-IV direction shown in FIG. 89.

FIG. 89 is a plan view of a part of the substrate on which the a-Si layer 7, the gate insulating film 8, the gate electrode 9, and the gate bus main portion 52 have been formed. FIG. 90 is a cross-sectional view of the substrate, viewed in IV-IV direction shown in FIG. 89.

After the gate bus end portion 51 and others are formed (see FIGS. 87 and 88), the a-Si layer 7 and the gate insulating film 8 are formed, and the gate electrode 9 and the gate bus main portion 52 are formed on the gate insulating film 8. The gate bus main portion 52 is formed so as to extend in the x direction as shown in FIG. 89. The gate bus main portion 52 comprises a connection portion 52*a*. The connection portion 52*a* is connected to the gate bus linking portion 53 described later (see FIGS. 98 and 99). After the gate electrode 9 and the gate bus main portion 52 are formed, the underlying layer used for providing the reflective electrodes with the desired reflective electrode characteristics is formed.

Figure 91:
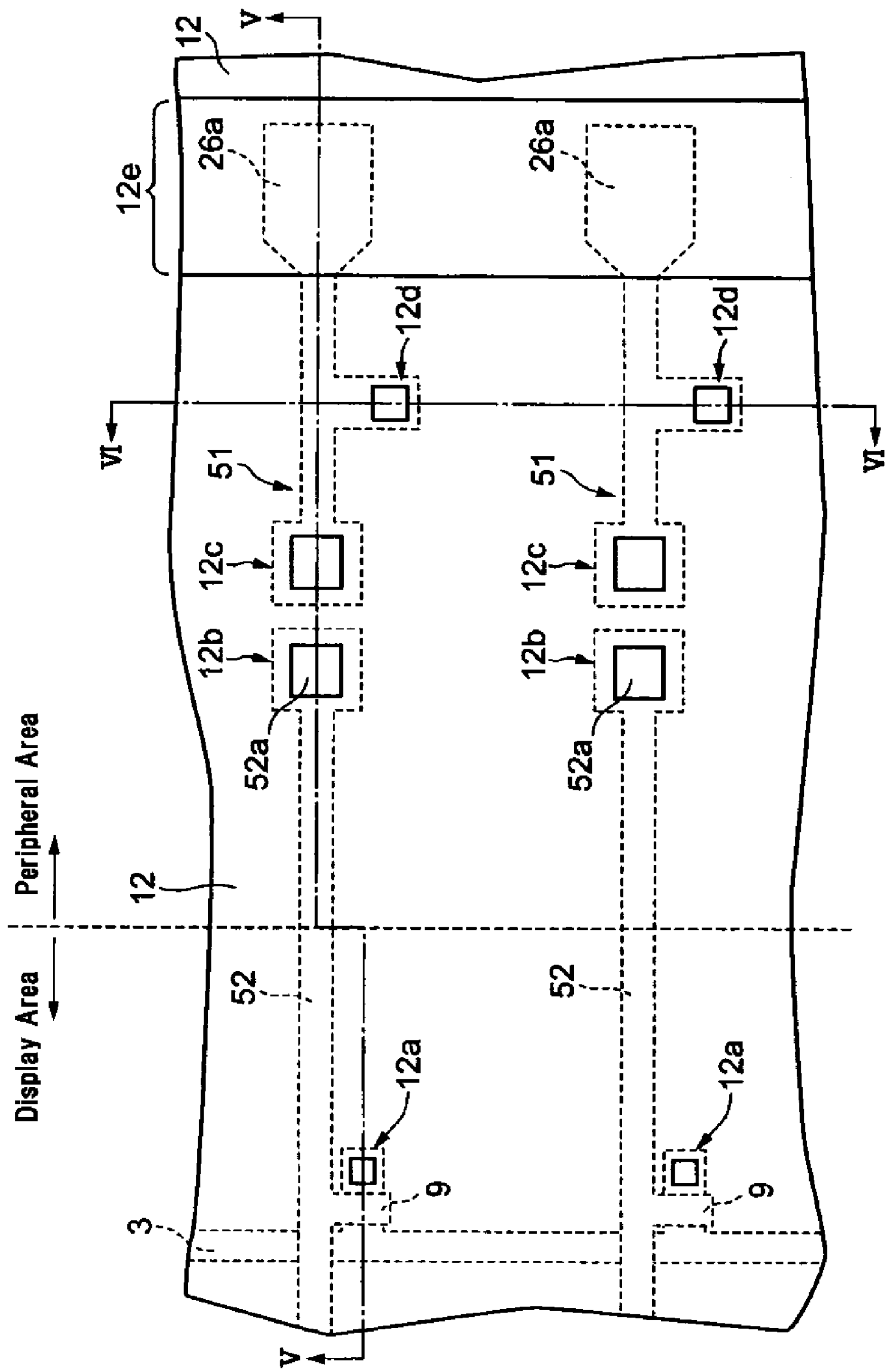
FIG. 91 is a plan view of a part of the substrate on which the underlying layer has been formed.
Figure 92:
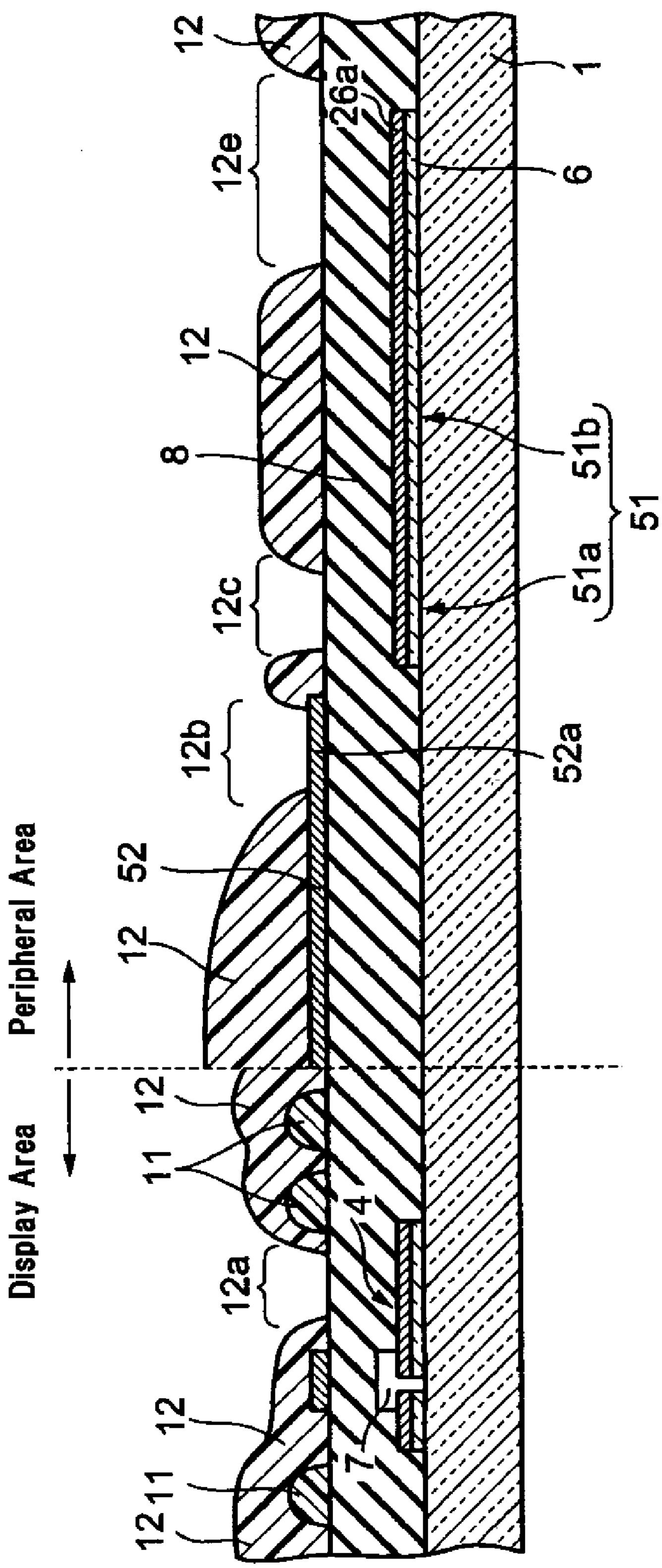
FIG. 92 is a cross-sectional view of the substrate, viewed in V-V direction in FIG. 91.
Figure 93:
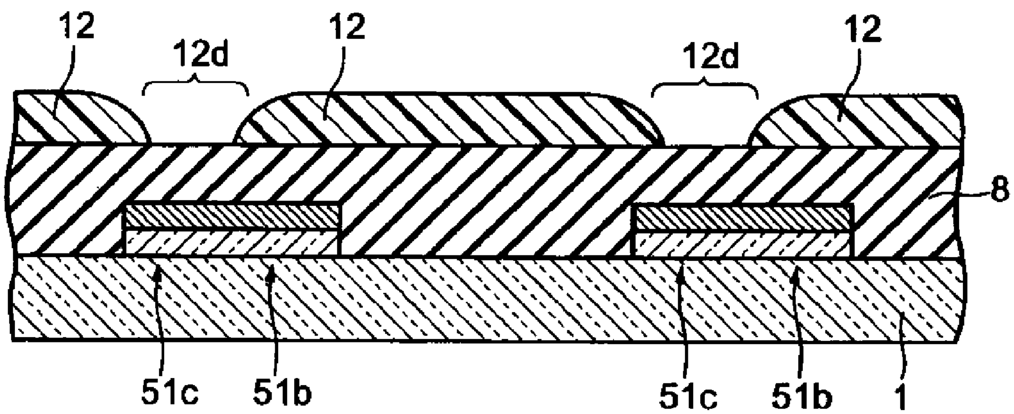
FIG. 93 is a cross-sectional view of the substrate, viewed in VI-VI direction in FIG. 91.

FIG. 91 is a plan view of a part of the substrate on which the underlying layer has been formed. FIG. 92 is a cross-sectional view of the substrate, viewed in V-V direction in FIG. 91. FIG. 93 is a cross-sectional view of the substrate, viewed in VI-VI direction in FIG. 91.

After the gate electrode 9 and the gate bus main portion 52 are formed, a number of projections 11 (see FIG. 92) and the planarization film 12 covering the projections 11 are formed. In this way, the underlying layer consisting of the projections 11 and the planarization film 12 is formed. The planarization film 12 comprises holes 12*a*, 12*b*, 12*c*,12*d* and 12*e*. The hole 12*a* is formed at a position corresponding to the drain electrode 4. The hole 12*b* is to expose the connection portion 52*a* of the gate bus main portion 52 from the surface of the planarization film 12. The hole 12*c* is formed at a position corresponding to the connection portion 51*a* of the gate bus end portion 51. The hole 12*d* is formed at a position corresponding to the connection portion 51*c* of the gate bus end portion 51. The hole 12*e* is formed at a position corresponding to the MoCr unnecessary portion 26*a* of the MoCr portion 26 covering the gate terminal 6.

In this way, the underlying layer consisting of the projections 11 and the planarization film 12 is formed. After the underlying layer is formed, the gate insulating film 8 is dry-etched using the underlying layer as the etching mask (see FIGS. 94 and 95).

Figure 94:
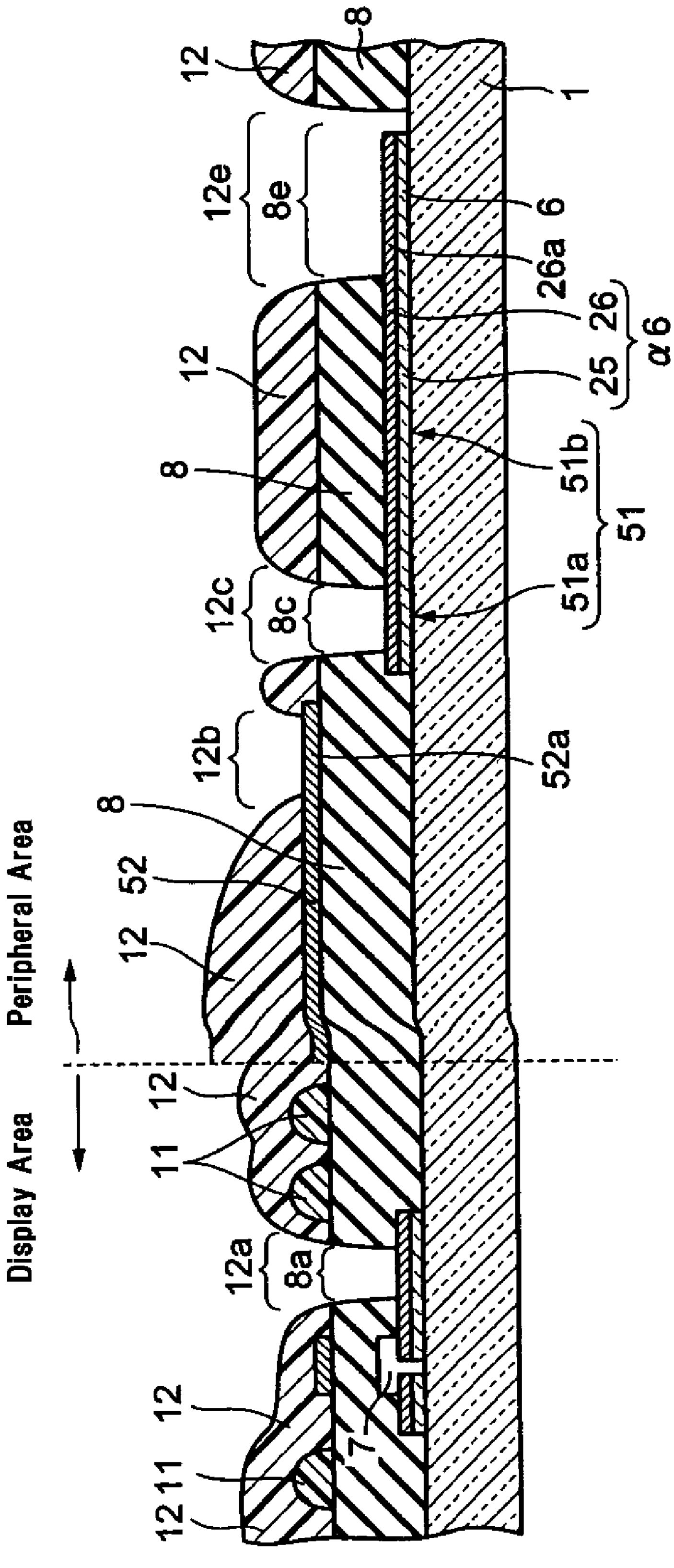
FIG. 94 is cross-sectional views of the substrate after the gate insulating film 8 has been dry-etched.
Figure 95:
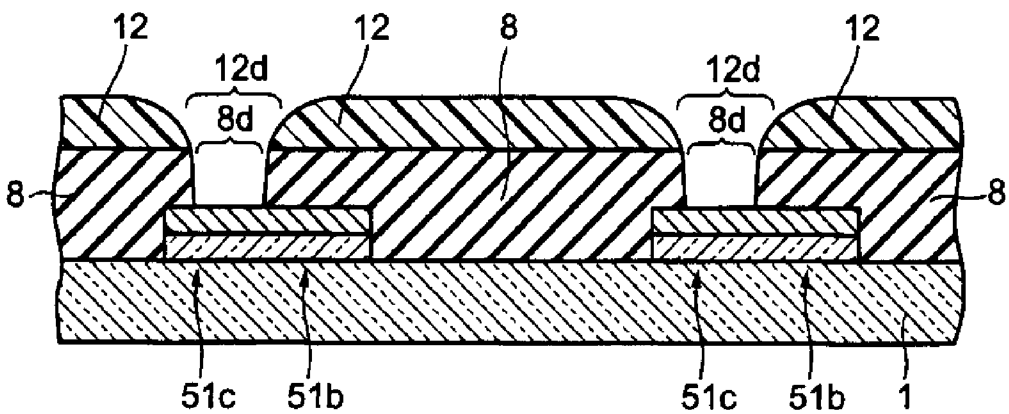
FIG. 95 is cross-sectional views of the substrate after the gate insulating film 8 has been dry-etched.

FIGS. 94 and 95 are cross-sectional views of the substrate after the gate insulating film 8 has been dry-etched. FIG. 94 is a cross-sectional view corresponding to FIG. 92. FIG. 95 is a cross-sectional view corresponding to FIG. 93.

By dry-etching the gate insulating film 8 using the underlying layer as an etching mask, holes 8*a*, 8*c*, 8*d*, and 8*e* are formed in the gate insulating film 8. The holes 8*a*, 8*c*, 8*d*, and 8*e* correspond to the holes 12*a*, 12*c*, 12*d*, and 12*e* of the planarization film 12, respectively. The hole 8*a* is to expose the drain electrode 4 from the surface of the gate insulating film 8. The hole 8*c* is to expose the connection portion 51*a* of the gate bus end portion 51 from the surface of the gate insulating film 8. The hole 8*d* is to expose the connection portion 51*c* of the gate bus end portion 51 from the surface of the gate insulating film 8. The hole 8*e* is to expose the MoCr unnecessary portion 26*a* covering the gate terminal 6 from the surface of the gate insulating film 8. A portion of the gate insulating film 8 corresponding to the hole 12*b* of the planarization film 12 is not etched since that portion is covered with the connection portion 52*a* of the gate bus main portion 52.

Figure 96:
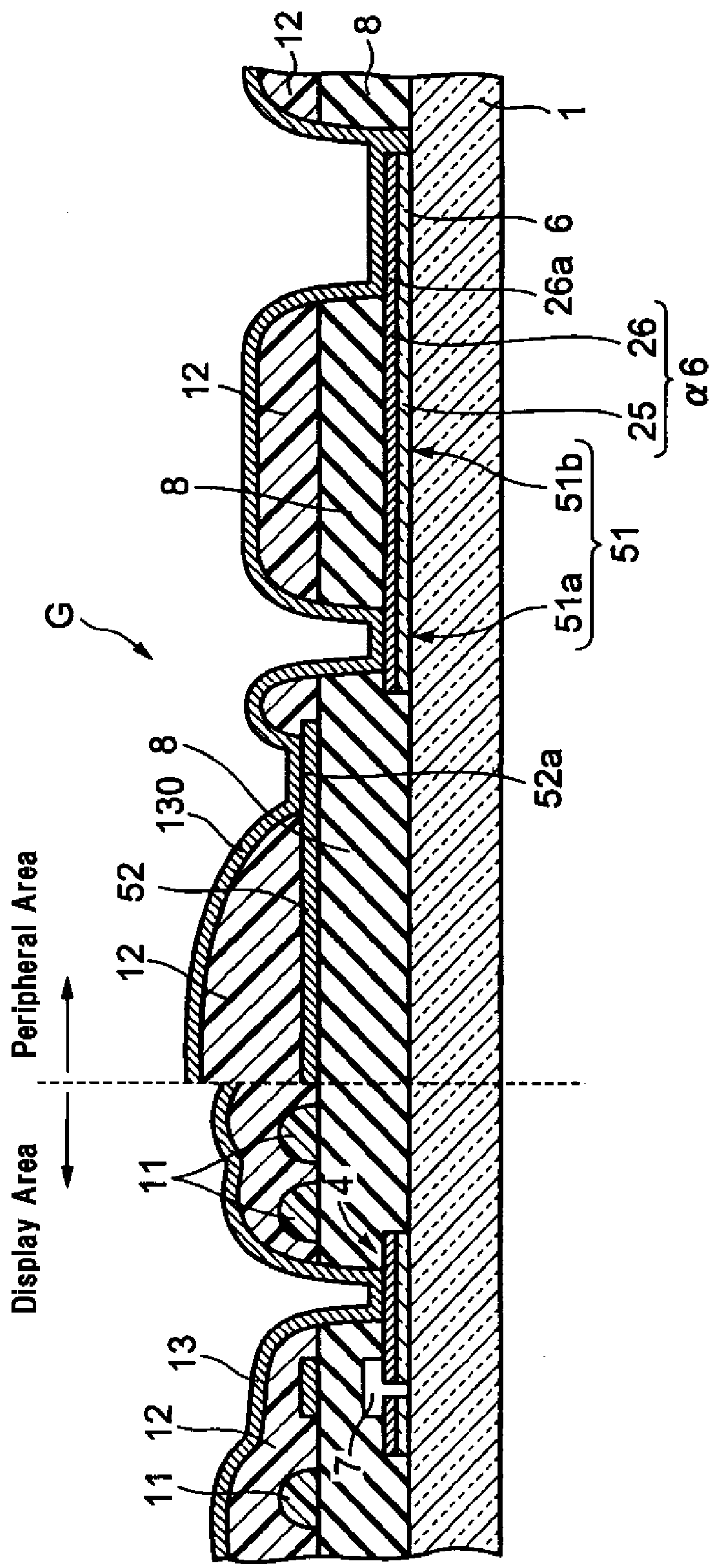
FIG. 96 is cross-sectional views of the substrate on which the Ag film 130 has been formed.
Figure 97:
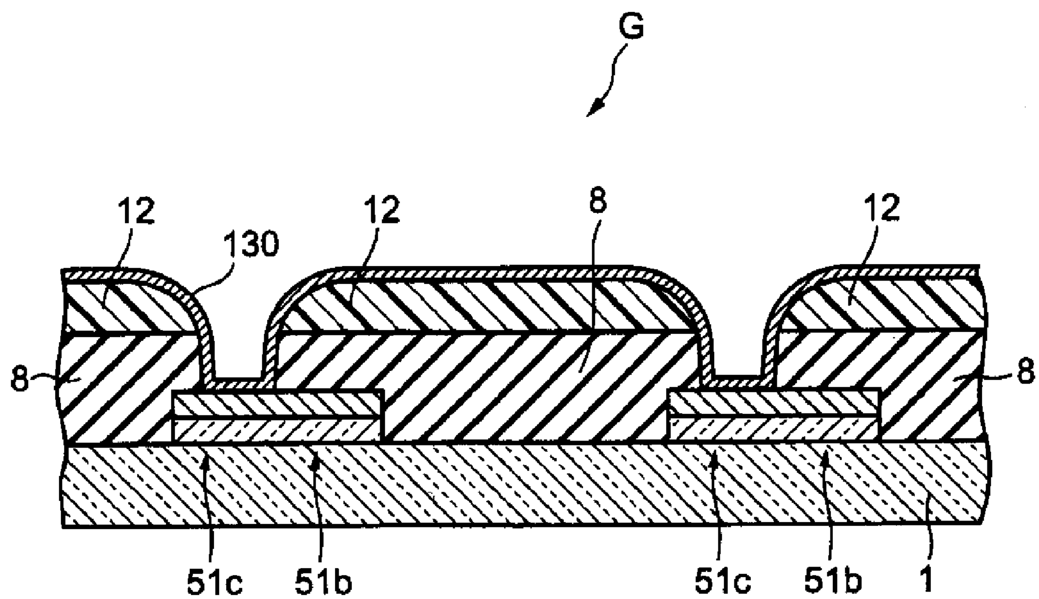
FIG. 97 is cross-sectional views of the substrate on which the Ag film 130 has been formed.

After the gate insulating film 8 is etched as described above, an Ag film for the reflective electrode 13 and others is formed (see FIGS. 96 and 97).

FIGS. 96 and 97 are cross-sectional views of the substrate on which the Ag film 130 has been formed. FIG. 96 is a cross-sectional view corresponding to FIG. 94. FIG. 97 is a cross-sectional view corresponding to FIG. 95.

The Ag film 130 is connected to the drain electrode 4, the connection portion 52*a* of the gate bus main portion 52, the connection portion 51*a* of the gate bus end portion 51, the connection portion 51*c* of the gate bus end portion 51, and the MoCr unnecessary portion 26*a*.

In this way, a conductive film possessor G comprising the Ag film 130 is manufactured.

Figure 98:
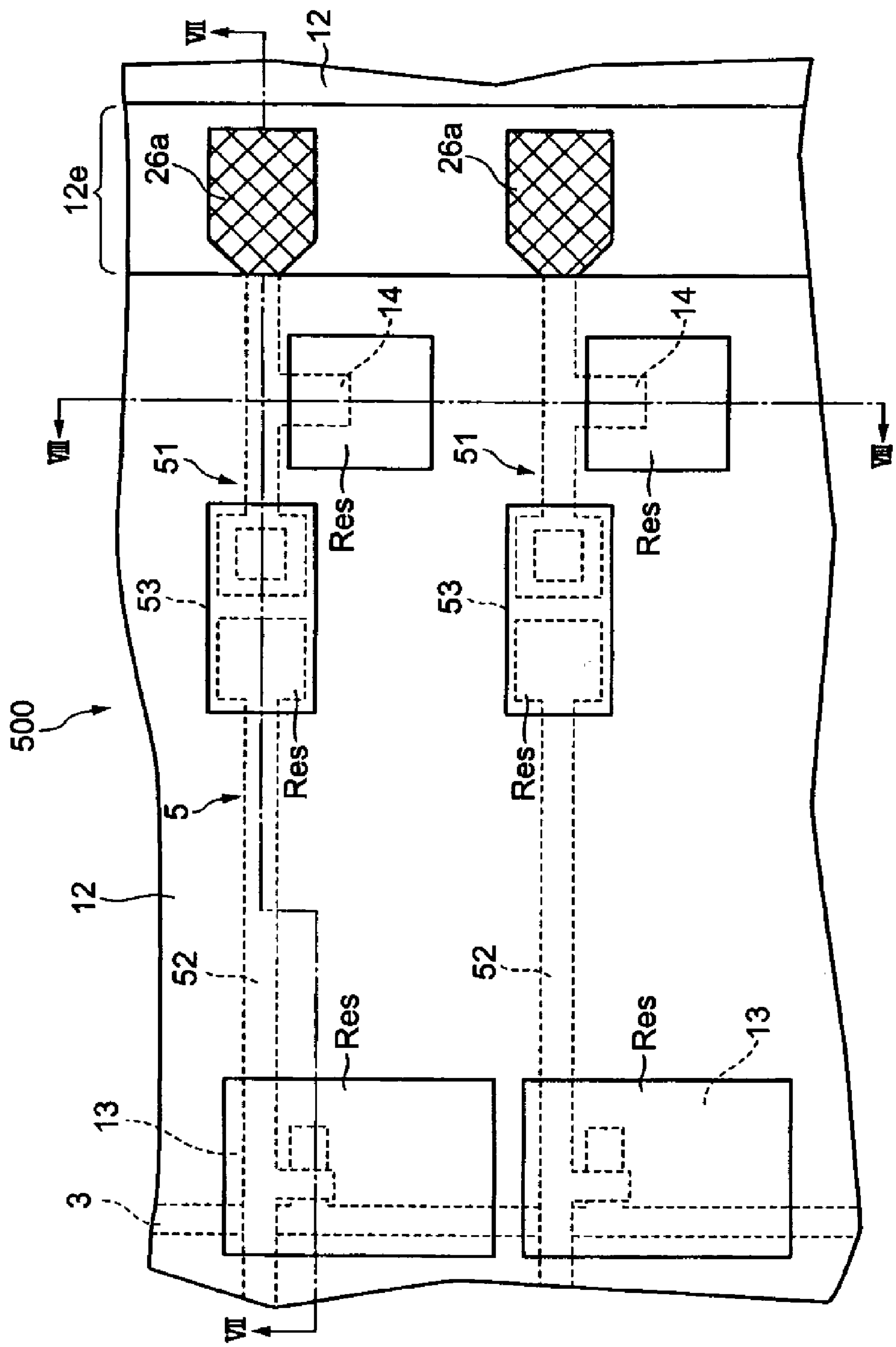
FIG. 98 is a plan view of a part of the substrate immediately after the Ag film 130 has been wet-etched.
Figure 99:
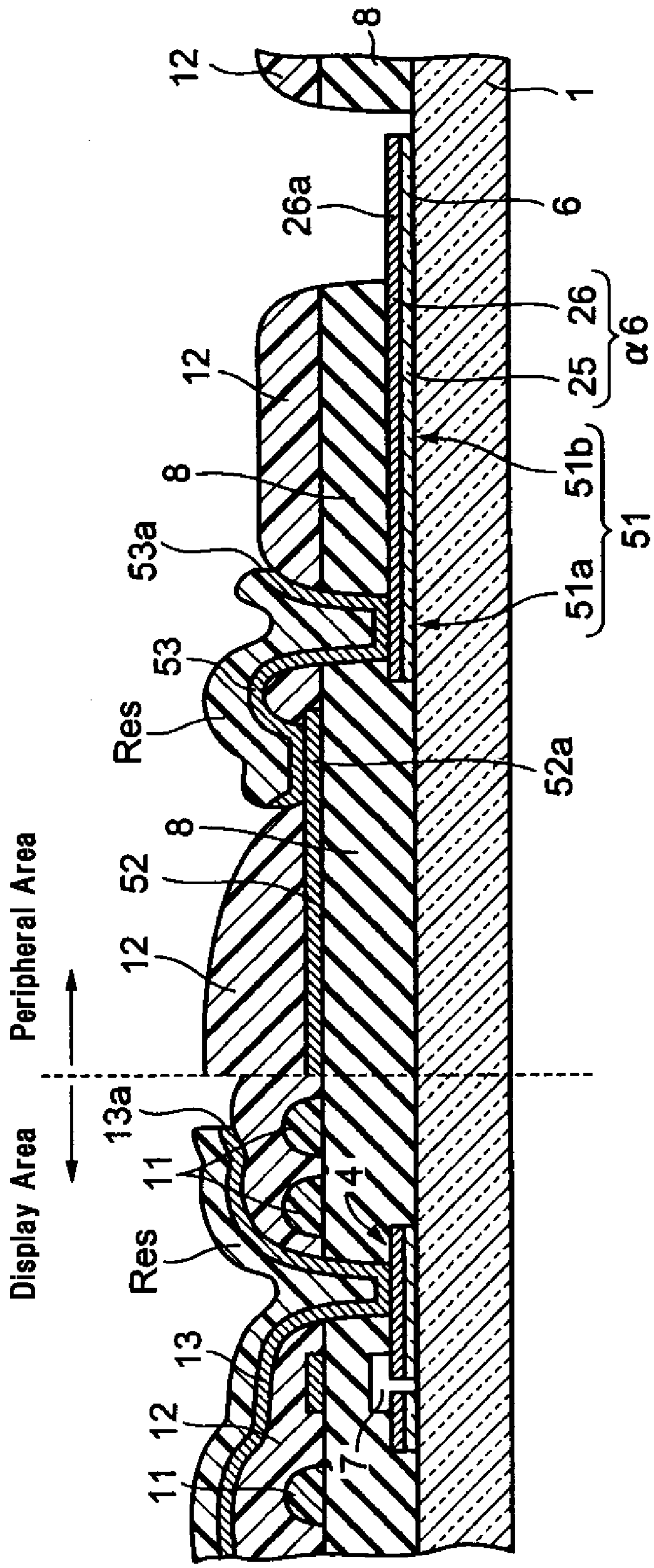
FIG. 99 is a cross-sectional view of the substrate, viewed in VII-VII direction in FIG. 98.
Figure 100:
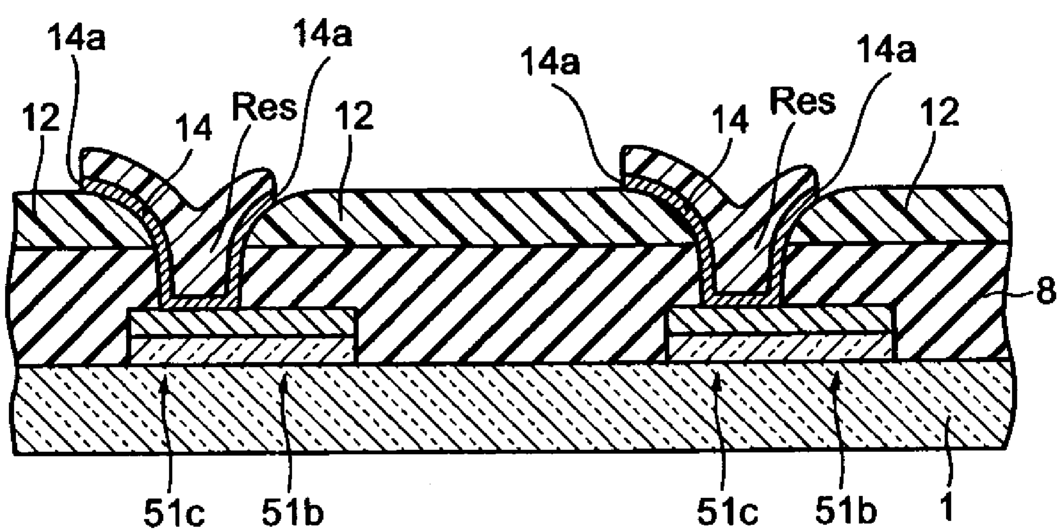
FIG. 100 is a cross-sectional view of the substrate, viewed in VIII-VIII direction in FIG. 98.

After the Ag film 130 is formed, the Ag film 130 is wet-etched using the photolithographic step (see FIGS. 98 to 100).

FIG. 98 is a plan view of a part of the substrate immediately after the Ag film 130 has been wet-etched. FIG. 99 is a cross-sectional view of the substrate, viewed in VII-VII direction in FIG. 98. FIG. 100 is a cross-sectional view of the substrate, viewed in VIII-VIII direction in FIG. 98.

By wet-etching the Ag film 130, the reflective electrode 13, the gate bus linking portion 53, and the sacrificial electrode 14 are formed under the resist film Res. The gate bus linking portion 53 electrically connects the gate bus end portion 51 and the gate bus main portion 52 to each other. A combination of the gate bus end portion 51, the gate bus main portion 52, and the gate bus linking portion 53 forms the gate bus 5. The sacrificial electrode 14 is electrically connected to the gate terminal 6 through the connection portion 51*c* of the gate bus end portion 51. Since the wet-etching of the Ag film 130 removes the unnecessary portions of the Ag film 130, the MoCr unnecessary portion 26*a* covering the gate terminal 6 appears.

It is noted that the wet-etching of the Ag film 130 forms not only the reflective electrode 13 and the gate bus linking portion 53 but also the sacrificial electrode 14. The reason for forming not only the reflective electrode 13 and the gate bus linking portion 53 but also the sacrificial electrode 14 is described below.

As described above, by wet-etching the Ag film 130, the MoCr unnecessary portion 26*a* covered with the Ag film 130 appears. Immediately after the MoCr unnecessary portion 26*a* appears, a side edge 13*a* of the reflective electrode 13, a side edge 53*a* of the gate bus linking portion 53 and a side edge 14*a* of the sacrificial electrode 14, and the MoCr unnecessary portion 26*a* contact to the etchant. The magnitude relationship between equilibrium electrode potentials of Ag and Mo is represented by an equation (9), the Ag being material of the reflective electrode 13, the gate bus linking portion 53 and the sacrificial electrode 14 and the Mo being material of the MoCr unnecessary portion 26*a*.

$$\mathrm{Mo}<\mathrm{Ag} \tag{9}$$

The gate bus linking portion 53 and the sacrificial electrode 14 are electrically connected to the MoCr unnecessary portion 26*a*, and the developer is a electrolyte liquid. It is therefore considered that cell reactions represented by reaction formulas (10) and (11) occur when the gate bus linking portion 53, the sacrificial electrode 14 and the MoCr unnecessary portion 26*a* contact the developer.

$$\mathrm{Mo}\rightarrow\mathrm{Mo}^{3+}+3e- \tag{10}$$

$$3\mathrm{H}^{+}+\mathrm{NO}^{3-}+2e-\rightarrow\mathrm{HNO}_3+\mathrm{H}_2\mathrm{O} \tag{11}$$

Where $NO^{3-}$ of the reaction formula (11) is an ion contained in the etchant.

Since the equilibrium electrode potential of Mo is smaller than the equilibrium electrode potential of Ag, it is considered that, at the side of the MoCr unnecessary portion 26*a*, the reaction formula (10) representing the emission of electrons (e−) occurs on a priority base. Some of the generated electrons (e−) flow from the MoCr unnecessary portion 26*a* into the gate bus linking portion 53 having mainly Ag, and then react with $NO^{3-}$ contained in the etchant, which promotes the reaction formula (11). The etching of the Ag film 130 proceeds by the occurrence of the reaction formula (11), so that if the reaction formula (11) is promoted, the etching rate of the Ag film 130 increases. Therefore, assuming that no sacrificial electrode 14 exists, the reaction of the reaction formula (11) occurs in proximately to the gate bus linking portion 53 intensively. As a result of this, it is considered that the etching rate of the gate bus linking portion 53 increases and that the size of the gate bus linking portion 53 becomes smaller than the desired size. If the size of the gate bus is smaller than the desired size, the gate bus linking portion 53 become higher resistance. At worse, there may be a case where an electrical connection between the gate bus main portion 52 and the gate bus end portion 51 is not established.

In contrast, in the fifth embodiment, since not only the gate bus linking portion 53 but also the sacrificial electrode 14 are formed when the Ag film 130 is wet-etched, the MoCr unnecessary portion 26*a* is electrically connected to the gate bus linking portion 53 and the sacrificial electrode 14. Therefore, the reaction formula (11) occurs not only in proximately to the gate bus linking portion 53 but also in proximately to the sacrificial electrode 14, so that the reaction formula (11) is prevented from occurring in proximately to the gate bus linking portion 53 intensively. Therefore, the increase of the etch rate of the gate bus linking portion 53 can be reduced by providing the sacrificial electrode 14, so that it becomes possible to form the gate bus linking portion 53 having the desired size.

After the MoCr unnecessary portion 26*a* appears by the wet-etching of the Ag film 130, the MoCr unnecessary portion 26*a* is dry-etched. By dry-etching the MoCr unnecessary portion 26*a*, the gate terminal 26*a* can appear without special photolithographic steps for removing the MoCr unnecessary portion 26*a*. After the MoCr unnecessary portion 26*a* of the MoCr portion 26 is dry-etched, the resist films Res are removed. In this way, the TFT array substrate 500 shown in FIGS. 84 to 86 is manufactured.

The Ag film 130 is formed in the fifth embodiment in order to form the reflective electrode 13 and the gate bus linking portion 53, but for example, an Ag alloy film having Ag alloy can be formed instead of the Ag film. It is possible to form the gate bus linking portion having the desired size by wet etching the Ag alloy film in such a way that not only the reflective electrode and the gate bus linking portion but also the sacrificial electrode is formed.

INDUSTRIAL APPLICABILITY

According to the present invention, a method of manufacturing an electronic device, the method preventing or reducing a phenomenon in which the photosensitive film is removed more than necessary, is provided, and an electronic device to which such method is applied is provided.

According to the present invention, a method of manufacturing an electronic device, the method preventing or reducing a phenomenon in which a conductive film making contact with a developer is damaged, is provided, and an electronic device to which such method is applied is provided.

According to the present invention, a method of manufacturing an electronic device, the method preventing or reducing a phenomenon in which a metal film is removed more than necessary, is provided, and an electronic device to which such method is applied is provided.

The invention claimed is:

1. A method of manufacturing an electronic device, said method comprising the steps of:

forming a first conductive portion possessor comprising a first conductive portion and a second conductive portion, said first conductive portion containing a first metal or metal compound having a first equilibrium electrode potential, said second conductive portion being electrically connected to said first conductive portion and containing a second metal or metal compound having a second equilibrium electrode potential, said first and second conductive portions being exposed from a surface of said first conductive portion possessor;

forming a coating film containing chromium molybdenum oxide on said surface of said first conductive portion possessor;

forming a photosensitive film on said first conductive portion possessor on which said coating film has been formed;

exposing said photosensitive film to light in a predetermined exposure pattern; and developing said exposed photosensitive film.

2. A method of manufacturing an electronic device as claimed in claim 1, wherein said step of forming said first conductive portion possessor comprises the step of forming said first and second conductive portions on a supporting member in such a way that said second conductive portion lies on the top of said first conductive portion.

3. A method of manufacturing an electronic device as claimed in claim 2, wherein said step of forming said first conductive portion possessor comprises the step of forming an insulating film on said supporting member before said step of forming said first and second conductive portions.

4. A method of manufacturing an electronic device as claimed in claim 3, wherein said step of forming said insulating film is the step of forming an insulating film having silicon nitride or silicon dioxide.

5. A method of manufacturing an electronic device as claimed in claim 1, wherein said step of forming said first conductive portion possessor comprises the step of forming said first and second conductive portions in such a way that said first conductive portion is electrically connected to said second conductive portion through a hole of an insulating film.

6. A method of manufacturing an electronic device, said method comprising the steps of:

forming a second conductive portion possessor comprising a first conductive portion and a second conductive portion, said first conductive portion containing a first metal or metal compound having a first equilibrium electrode potential, said second conductive portion being electrically connected to said first conductive portion and containing a second metal or metal compound having a second equilibrium electrode potential, said first and second conductive portions being exposed from a surface of said second conductive portion possessor;

forming a coating film containing chromium molybdenum oxide on said surface of said second conductive portion possessor;

forming a photosensitive film on said surface of said second conductive portion possessor;

exposing said photosensitive film to light in a predetermined exposure pattern; and developing said exposed photosensitive film;

wherein said step of forming said second conductive portion possessor is the step of forming said second conductive portion possessor comprising a sacrificial electrode, said sacrificial electrode being electrically connected to said first and second conductive portions, said sacrificial electrode being exposed from said surface of said second conductive portion possessor.

7. A method of manufacturing an electronic device as claimed in claim 6, said sacrificial electrode is directly connected to one of said first and second conductive portions.

8. A method of manufacturing an electronic device as claimed in claim 6, said sacrificial electrode and one of said first and second conductive portions are integrally formed.

9. A method of manufacturing an electronic device as claimed in claim 6, wherein said step of forming said second conductive portion possessor comprises the step of forming said first and second conductive portions in such a way that said second conductive portion lies on the top of said first conductive portion.

10. A method of manufacturing an electronic device as claimed in claim 6, wherein said step of forming said second conductive portion possessor comprises the step of forming said first and second conductive portions in such a way that said first conductive portion is electrically connected to said second conductive portion through a hole of an insulating film.

11. A method of manufacturing an electronic device, said method comprising the steps of:

forming a third conductive portion possessor comprising a first conductive portion and a conductive film, said first conductive portion containing a first metal or metal compound having a first equilibrium electrode potential, said conductive film being electrically connected to said first conductive portion and containing a second metal or metal compound having a second equilibrium electrode potential, said conductive film being exposed from a surface of said third conductive portion possessor; and wet-etching said conductive film in such a way that a second conductive portion is formed, said second conductive portion being electrically connected to said first conductive portion and containing said second metal or metal compound;

wherein in said wet-etching step, said conductive film is wet-etched in such a way that not only said second conductive portion but also a sacrificial electrode are formed, said sacrificial electrode being electrically connected to said first conductive portion.

12. A method of manufacturing an electronic device as claimed in claim 11, wherein said conductive film is formed so as to cover said first conductive portion, and wherein in said wet-etching step, said conductive film is wet-etched in such a way that at least part of said first conductive portion is exposed.

13. A method of manufacturing an electronic device as claimed in claim 11, comprising a step of removing a part of said first conductive portion after said wet-etching step.

* * * * *